(12) United States Patent
Merrill et al.

(10) Patent No.: US 9,423,545 B2
(45) Date of Patent: Aug. 23, 2016

(54) MASK PROCESSING USING FILMS WITH SPATIALLY SELECTIVE BIREFRINGENCE REDUCTION

(71) Applicant: 3M INNOVATIVE PROPERTIES COMPANY, St. Paul, MN (US)

(72) Inventors: William Ward Merrill, Mahtomedi, MN (US); Douglas S. Dunn, Maplewood, MN (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 0 days.

(21) Appl. No.: 14/755,457

(22) Filed: Jun. 30, 2015

(65) Prior Publication Data

US 2015/0301255 A1 Oct. 22, 2015

Related U.S. Application Data

(63) Continuation of application No. 13/703,549, filed as application No. PCT/US2011/042368 on Jun. 29, 2011, now Pat. No. 9,101,956.

(60) Provisional application No. 61/360,129, filed on Jun. 30, 2010.

(51) Int. Cl.
*G02B 5/30* (2006.01)
*G02B 1/12* (2006.01)
(Continued)

(52) U.S. Cl.
CPC ............ *G02B 5/3083* (2013.01); *B05D 5/063* (2013.01); *G02B 1/12* (2013.01); *G02B 5/285* (2013.01); *G02B 5/32* (2013.01); *B42D 25/391* (2014.10); *G11B 20/1261* (2013.01)

(58) Field of Classification Search
CPC ...... G02B 5/3083; G02B 1/12; G02B 5/285; G02B 5/32; G11B 20/1261; B05D 5/063; B43D 25/391
USPC .............................. 359/485.03, 580; 427/557
See application file for complete search history.

(56) References Cited

U.S. PATENT DOCUMENTS 4,388,139 A 6/1983 Fuller
4,417,948 A 11/1983 Mayne-Banton
(Continued)

FOREIGN PATENT DOCUMENTS

EP 1900509 3/2008
GB 2394718 A 5/2004
(Continued)

OTHER PUBLICATIONS

Baba, "Patterned Optical Polarising Films Fabricated by Laser Writing on Stretched Silver Island Multilayers", Electronics Letters, Jul. 22, 1999, vol. 35, No. 15, pp. 1249-1251.
(Continued)

*Primary Examiner* — Frank Font
(74) *Attorney, Agent, or Firm* — Yufeng Dong

(57) ABSTRACT

Certain patternable reflective films are used as masks to make other patterned articles, and one or more initial masks can be used to pattern the patternable reflective films. An exemplary patternable reflective film has an absorption characteristic suitable to, upon exposure to a radiant beam, absorptively heat a portion of the film by an amount sufficient to change a first reflective characteristic to a different second reflective characteristic. The change from the first to the second reflective characteristic is attributable to a change in birefringence of one or more layers or materials of the patternable film. In a related article, a mask is attached to such a patternable reflective film. The mask may have opaque portions and light-transmissive portions. Further, the mask may have light-transmissive portions with structures such as focusing elements and/or prismatic elements.

19 Claims, 10 Drawing Sheets

(51) Int. Cl.
*G02B 5/28* (2006.01)
*B05D 5/06* (2006.01)
*G02B 5/32* (2006.01)
*G11B 20/12* (2006.01)
*B42D 25/391* (2014.01)

(56) References Cited

U.S. PATENT DOCUMENTS

| | | |
|---|---|---|
| 4,551,819 A | 11/1985 | Michl |
| 4,568,632 A | 2/1986 | Blum |
| 4,728,547 A | 3/1988 | Vaz et al. |
| 4,822,451 A | 4/1989 | Ouderkirk |
| 4,864,537 A | 9/1989 | Michl |
| 4,879,176 A | 11/1989 | Ouderkirk |
| 4,902,378 A | 2/1990 | Ouderkirk |
| 5,023,859 A | 6/1991 | Eich |
| 5,103,337 A | 4/1992 | Schrenk |
| 5,217,794 A | 6/1993 | Schrenk |
| 5,234,729 A | 8/1993 | Wheatley |
| 5,251,197 A | 10/1993 | Leube |
| 5,302,259 A | 4/1994 | Birngruber |
| 5,316,900 A | 5/1994 | Tsujioka |
| 5,327,285 A | 7/1994 | Faris |
| 5,360,659 A | 11/1994 | Arends |
| 5,389,324 A | 2/1995 | Lewis |
| 5,486,949 A | 1/1996 | Schrenk |
| 5,633,123 A | 5/1997 | Hill |
| 5,757,016 A | 5/1998 | Dunn |
| 5,825,543 A | 10/1998 | Ouderkirk |
| 5,882,774 A | 3/1999 | Jonza |
| 6,045,894 A | 4/2000 | Jonza |
| 6,096,247 A | 8/2000 | Ulsh |
| 6,157,490 A | 12/2000 | Wheatley |
| 6,179,948 B1 | 1/2001 | Merrill |
| 6,207,260 B1 | 3/2001 | Wheatley |
| 6,256,435 B1 | 7/2001 | Albert |
| 6,288,842 B1 | 9/2001 | Florczak |
| 6,352,761 B1 | 3/2002 | Hebrink |
| 6,368,699 B1 | 4/2002 | Gilbert |
| 6,569,595 B1 | 5/2003 | Sato et al. |
| 7,736,708 B2 | 6/2010 | Matsunaga et al. |
| 2002/0196516 A1 | 12/2002 | Hira |
| 2004/0164434 A1 | 8/2004 | Tabar |
| 2006/0082702 A1 | 4/2006 | Jacobs |
| 2006/0177605 A1* | 8/2006 | Lub .................. C09K 19/46 428/1.3 |
| 2006/0204720 A1 | 9/2006 | Biernath |
| 2006/0257679 A1 | 11/2006 | Benson, Jr. |
| 2007/0047261 A1 | 3/2007 | Thompson |
| 2007/0065636 A1 | 3/2007 | Merrill |
| 2007/0281143 A1 | 12/2007 | Aylward |
| 2007/0298271 A1 | 12/2007 | Liu |
| 2008/0020186 A1 | 1/2008 | Hebrink |
| 2008/0143926 A1 | 6/2008 | Amimori |
| 2008/0197518 A1 | 8/2008 | Aylward |
| 2009/0159578 A1 | 6/2009 | Lin |
| 2009/0273836 A1 | 11/2009 | Yust |
| 2010/0119738 A1 | 5/2010 | Suzuki |
| 2011/0019276 A1 | 1/2011 | Kaneiwa et al. |
| 2011/0249331 A1 | 10/2011 | Klippstein |
| 2011/0249332 A1 | 10/2011 | Merrill |
| 2011/0249334 A1 | 10/2011 | Merrill |
| 2011/0255163 A1 | 10/2011 | Merrill |
| 2011/0255167 A1 | 10/2011 | Merrill |
| 2011/0286095 A1 | 11/2011 | Merrill |
| 2013/0094085 A1 | 4/2013 | Merrill |
| 2013/0094088 A1 | 4/2013 | Merrill |
| 2013/0095434 A1 | 4/2013 | Dunn |
| 2013/0095435 A1 | 4/2013 | Dunn |

FOREIGN PATENT DOCUMENTS

| | | |
|---|---|---|
| GB | 2420188 | 5/2006 |
| JP | 2002-521728 | 7/2002 |
| JP | 2006-330149 | 12/2006 |
| JP | 2008-281989 | 11/2008 |
| WO | WO 97/32224 | 9/1997 |
| WO | WO 98/21521 | 5/1998 |
| WO | WO 99/53242 | 10/1999 |
| WO | WO 00/07046 | 2/2000 |
| WO | WO 02/50583 | 6/2002 |
| WO | WO 03/006261 | 1/2003 |
| WO | WO 2004/003630 | 1/2004 |
| WO | WO 2004/004362 | 1/2004 |
| WO | WO 2004/061491 | 7/2004 |
| WO | WO 2007/084000 | 7/2007 |
| WO | WO 2007/117323 | 10/2007 |
| WO | WO 2008/144136 | 11/2008 |
| WO | WO 2008/144656 | 11/2008 |
| WO | WO 2009/116660 | 9/2009 |
| WO | WO 2010/075340 | 7/2010 |
| WO | WO 2010/075357 | 7/2010 |
| WO | WO 2010/075363 | 7/2010 |
| WO | WO 2010/075373 | 7/2010 |
| WO | WO 2010/075383 | 7/2010 |

OTHER PUBLICATIONS

Baba, "Patterned Submicrometer—Thick Optical Polarizing Films Using Stretched Silver Island Multilayers", Micro- and Nanophotonic Materials and Devices, Proceedings of SPIE, Jan. 20, 2000, vol. 3937, pp. 156-163.

Karman, "P-37: Increasing the Viewing Angle of Multidomain LCDs by Using Patterned Retarders", Eurodisplay, 2002, pp. 515-517.

Matharu, "Liquid Crystals for Holographic Optical Data Storage", Chemical Society Reviews, 2007, vol. 36, No. 12, pp. 1868-1880.

Moia, "New Colour Shifting Security Devices", Optical Security and Counterfeit Deterrence Techniques V, Proceedings of SPIE-IS&T Electronic Imaging, SPIE, Jun. 3, 2004, vol. 5310, pp. 312-320.

Ostroverkhova, "Organic Photorefractives: Mechanisms, Materials, and Applications", Chemical Reviews, Jul. 2004, vol. 104, No. 7, pp. 3267-3314.

Roosendaal, "8.1: Novel High Performance Transflective LCD with a Patterned Retarder", SID Symposium Digest of Technical Papers, May 2003, vol. 34, No. 1, pp. 78-81.

Shibaev, "Thermotropic liquid-crystalline polymers: 14. Thermo-recording on liquid-crystalline polymers with the aid of a laser beam", Polymer Communications, Dec. 1983, vol. 24, pp. 364-365.

Stover, Optical Scattering: Measurement and Analysis, Second Edition, SPIE Optical Engineering Press, Bellingham, WA, (1995), Chapter 1, pp. 1-27.

Tsai, "Fabricating Polymeric Micro-retardation Arrays for Autostereoscopic Display System by $CO_2$ Laser Heat Processing Technology", Stereoscopic Displays and Virtual Reality Systems VII, Proceedings of SPIE, May 3, 2000, vol. 3957, pp. 142-152.

Tsai, "Fabricating Microretarders by $CO_2$ Laser Heating Process Technology", Opt. Eng., Nov. 2001, vol. 40, No. 11, pp. 2577-2581.

Van Der Zande, "14.2: Technologies Towards Patterned Optical Foils", SID Symposium Digest of Technical Papers, May 2003, vol. 34, No. 1, pp. 194-197.

Weber, "Giant Birefringent Optics in Multilayer Polymer Mirrors", Science, Mar. 31, 2000, vol. 287, pp. 2451-2456.

International Search Report for PCT/US2011/042368, 4 pages.

* cited by examiner

MASK PROCESSING USING FILMS WITH SPATIALLY SELECTIVE BIREFRINGENCE REDUCTION

CROSS REFERENCE TO RELATED APPLICATIONS

This application is a continuation of U.S. application Ser. No. 13/703,549, filed Dec. 11, 2012, now pending, which is a 371 of International Application No. PCT/US2011/42368, filed Jun. 29, 2011, which claims benefit of U.S. Provisional Application No. 61/360129, filed Jun. 30, 2010, the disclosure of which is incorporated by reference in their entirety herein.

FIELD OF THE INVENTION

This invention relates generally to optical films, with particular application to optical films whose reflective characteristics can be spatially tailored by selective application of radiant energy tailored to relax the birefringence of a constituent layer or material of the optical film, and the invention also relates to associated articles, systems, and methods.

BACKGROUND

Spatially tailored optical films, sometimes referred to as "STOF" films, are described in several commonly assigned but currently unpublished international and U.S. patent applications which are referenced at the end of the Detailed Description. In some cases, these films incorporate internal structural features that provide the film with an initial reflective characteristic. For example, the internal structural features may be one or more packets of microlayers that selectively reflect light by constructive or destructive interference, or the internal structural features may be polymer materials that are separated into distinct first and second phases in a blended layer to diffusely scatter light. The films also have an absorptive characteristic that allows them to be treated with radiant energy at any desired locations or zones within a useable area of the film, the radiant treatment causing the initial reflective characteristic to change to a different second reflective characteristic at the treated locations. The change occurs primarily because of a birefringence relaxation mechanism: the film absorbs an appropriate amount of the radiant energy because of the absorptive characteristic, the absorbed energy heats the film at localized positions, i.e., at the desired locations or zones, and the heat causes the birefringence of one or more constituent layers or materials of the film in such desired locations or zones to relax, e.g, to become less birefringent or to become isotropic. In exemplary cases, the radiant energy does not heat the film enough to substantially change or damage a structural integrity (e.g., layer structure or immiscible blend morphology) of the film in the treated zones.

BRIEF SUMMARY

We have developed techniques of using reflective STOF films as patterned masks in the manufacture of other patterned articles. The other patterned articles may include other STOF films, and/or they may include other types of patternable articles. We have also developed techniques of using conventional masks in the manufacture of STOF films. We have further developed articles in which a reflective STOF film is connected to a mask in a layered arrangement. The connection between the STOF film and the mask allows the STOF film to be patterned in a zone that is in spatial registration with a feature such as a transmissive area or an opaque area of the mask.

Thus, certain patternable reflective films are used as masks to make other patterned articles, and one or more initial masks can be used to pattern the patternable reflective films. An exemplary patternable reflective film has an absorption characteristic suitable to, upon exposure to a radiant beam, absorptively heat a portion of the film by an amount sufficient to change a first reflective characteristic to a different second reflective characteristic. The change from the first to the second reflective characteristic is attributable to a change in birefringence of one or more layers or materials of the patternable film. In a related article, a mask is attached to such a patternable reflective film. The mask may have opaque portions and light-transmissive portions. Further, the mask may have light-transmissive portions with structures such as cylindrical elements, focusing elements, and/or prismatic elements.

The present application therefore discloses, inter alia, methods of making patterned films that include providing a first film having a first reflective characteristic, and providing a second film having a first detectable characteristic. The first film may also have a first absorption characteristic suitable to, upon exposure to a first radiant beam, absorptively heat a portion of the first film by an amount sufficient to change the first reflective characteristic to a second reflective characteristic by a change in birefringence. The first detectable characteristic of the second film may change to a different second detectable characteristic by exposing the second film to a second radiant beam. The methods may also include directing the first radiant beam preferentially at a second zone rather than a first zone of the first film to change the first reflective characteristic to the second reflective characteristic in the second zone so as to convert the first film to a patterned mask. The methods may further use the patterned mask to pattern the second radiant beam, and direct the patterned second radiant beam at the second film to change the first detectable characteristic to the second detectable characteristic at selected portions of the second film.

The first film may include a first group of interior layers arranged to selectively reflect light by constructive or destructive interference to provide the first reflective characteristic, and the change from the first reflective characteristic to the second reflective characteristic may be substantially attributable to a change in birefringence of at least some of the interior layers. The first film may instead include a first blended layer that includes first and second polymer materials separated into distinct first and second phases, respectively, and the change from the first reflective characteristic to the second reflective characteristic may be substantially attributable to a change in birefringence of at least one of the first and second polymer materials. In some cases, the first film may be or comprise a bi-level patterned reflective film.

The procedure of directing the first radiant beam preferentially at the second zone of the first film may include scanning the first light beam over portions of the first film that define the second zone. The first reflective characteristic may reflect the second radiant beam more than the second reflective characteristic, and the selected portions of the second film may correspond to the second zone of the first film. Alternatively, the first reflective characteristic may reflect the second radiant beam less than the second reflective characteristic, and the selected portions of the second film may correspond to portions of the first film other than the second zone.

The first and second radiant beams may include different first and second optical wavelengths, respectively. For example, the first optical wavelength may be an infrared optical wavelength, and the second optical wavelength may be less than 700 nm. In another example, the first and second optical wavelengths may be different infrared wavelengths, e.g., 808 nm and 1064 nm. The second film may have a second absorption characteristic suitable to, upon exposure to the second radiant beam, absorptively heat a portion of the second film by an amount sufficient to change the first detectable characteristic to the second detectable characteristic. The second film may include a second group of interior layers arranged to selectively reflect light by constructive or destructive interference to provide the first detectable characteristic, and the change from the first detectable characteristic to the second detectable characteristic may be substantially attributable to a change in birefringence of at least some of the interior layers. Alternatively or in addition, the second film may include a second blended layer that includes third and fourth polymer materials separated into distinct third and fourth phases, respectively, and the change from the first detectable characteristic to the second detectable characteristic may be substantially attributable to a change in birefringence of at least one of the third and fourth polymer materials.

The first or second reflective characteristic may have a reflectivity for the second radiant beam, and/or at another wavelength of interest, of at least 90%, or at least 95%, or at least 99%.

The directing of the first radiant beam may provide the first film with a first pattern, and the method further include, after using the patterned mask to pattern the second radiant beam, directing a third radiant beam at the first film to eliminate at least a portion of the first pattern in the first film. The first and second films may be connected in a layered arrangement. The third radiant beam may be tailored to render the first film substantially unpatterned, e.g., it may eliminate substantially all of the first pattern in the first film, or it may eliminate only a portion of the first pattern so as to provide a different second pattern in the first film. The second reflective characteristic may be less reflective than, or more reflective than, the first reflective characteristic.

We also disclose methods of making patterned films, which may include providing a patterned mask and providing a first film. The first film may have a first reflective characteristic, as well as a first absorption characteristic suitable to, upon exposure to a first radiant beam, absorptively heat a portion of the first film by an amount sufficient to change the first reflective characteristic to a second reflective characteristic. The methods may further include using the patterned mask to pattern the first radiant beam, and directing the patterned first radiant beam at the first film to change the first reflective characteristic to the second reflective characteristic at selected portions of the first film.

The first film may include a first group of interior layers arranged to selectively reflect light by constructive or destructive interference to provide the first reflective characteristic, and the change from the first reflective characteristic to the second reflective characteristic may be substantially attributable to a change in birefringence of at least some of the interior layers. The first film may alternatively or in addition include a blended layer that includes first and second polymer materials separated into distinct first and second phases, respectively, and the change from the first reflective characteristic to the second reflective characteristic may be substantially attributable to a change in birefringence of at least one of the first and second polymer materials. Substantially all of the selected portions of the first film may be changed from the first to the second reflective characteristic at a same time.

We also disclose articles that may include a first film attached to a mask in a layered arrangement. The first film may have a first reflective characteristic, and may also have a first absorption characteristic suitable to, upon exposure to a first radiant beam, absorptively heat a portion of the first film by an amount sufficient to change the first reflective characteristic to a second reflective characteristic.

The change from the first reflective characteristic to the second reflective characteristic may be substantially attributable to a change in birefringence of at least a portion of the first film. The first film may include a first group of interior layers arranged to selectively reflect light by constructive or destructive interference to provide the first reflective characteristic. The first film may alternatively or in addition include a blended layer that includes first and second polymer materials separated into distinct first and second phases, respectively, and the first and second reflective characteristics may include first and second diffusely reflective characteristics respectively.

The mask may have a useable area, and some portions of the useable area may block the first radiant beam and other portions of the useable area may transmit the first radiant beam. The mask may alternatively or in addition include one or more structured surface features adapted to preferentially redirect the first radiant beam onto selected portions of the first film. The one or more structured surface features may include a cylindrical element, a focusing element, and/or a prismatic element. The one or more structured surface features may be adapted to cause the selected portions of the first film to be adequately heated by the amount sufficient to change the first reflective characteristic to the second reflective characteristic, and to cause other portions of the first film to not be adequately heated by the amount sufficient to change the first reflective characteristic to the second reflective characteristic.

Related methods, systems, and articles are also discussed.

These and other aspects of the present application will be apparent from the detailed description below. In no event, however, should the above summaries be construed as limitations on the claimed subject matter, which subject matter is defined solely by the attached claims, as may be amended during prosecution.

BRIEF DESCRIPTION OF DRAWINGS

In the figures, like reference numerals designate like elements.

DETAILED DESCRIPTION OF ILLUSTRATIVE EMBODIMENTS

Figure 1A:
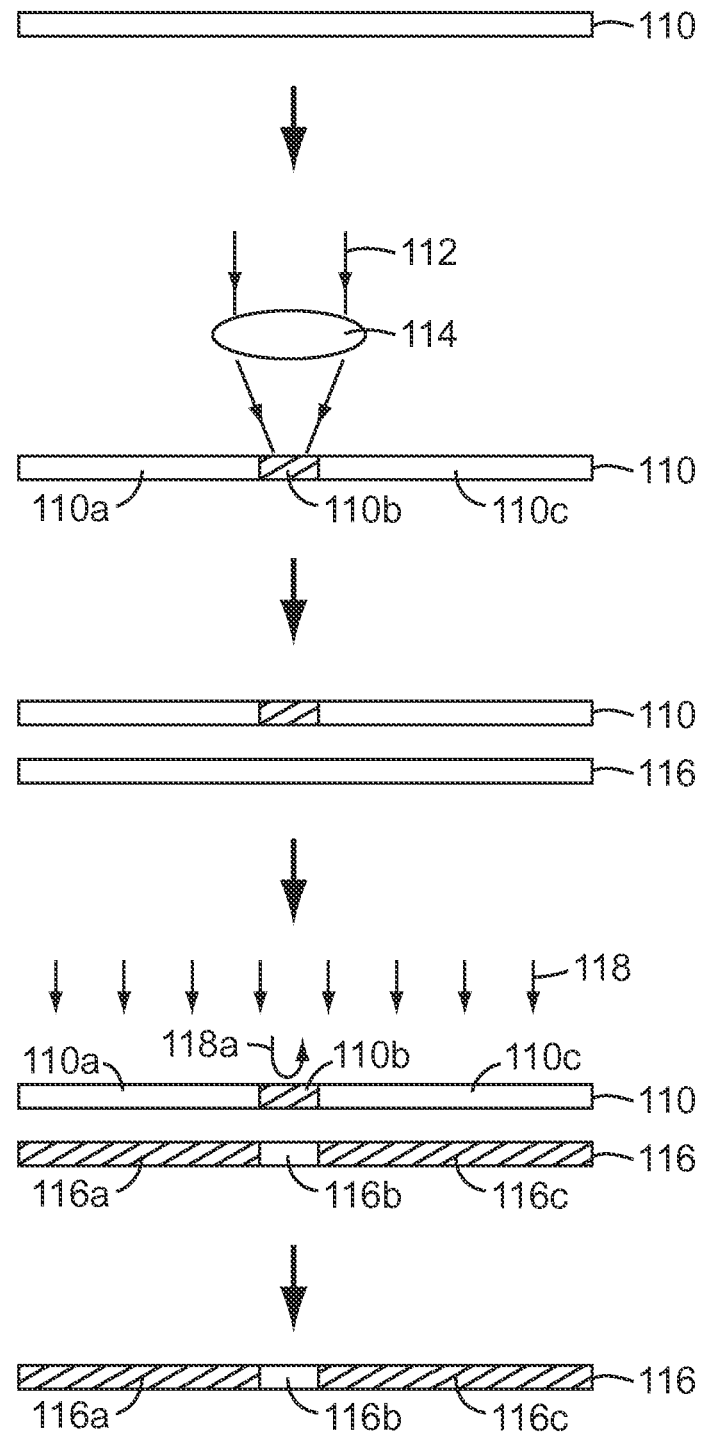
FIG. 1A is a schematic side or sectional view of components involved in various steps of a process that uses a reflective STOF film as a mask for patterning another article.

In FIG. 1A we see a schematic side or sectional view of components involved in various steps of a process that uses a reflective STOF film as a mask for patterning another article. In a first step, a reflective STOF film 110 is provided. The film 110 may initially be substantially spatially uniform, i.e., it may exhibit a first reflective characteristic over its entire useable area. Details of the wide variety of available STOF film types are provided elsewhere herein, e.g., in the discussion below. Next, the film 110 is internally patterned by directing a suitable first radiant beam 112 onto selected portions of the film. By "internally patterned" here, we mean that a pattern of any desired shape is imparted to the film by virtue of a change to one or more interior layers of the film (e.g. where the film has two outer layers and one or more interior layers sandwiched between the outer layers) and/or to one or more materials of the film that reside substantially inside the film, rather than a change in surface texture, roughness, or other surface effects of the film. The pattern may be of any desired shape. For example, the pattern may be a grid or array of small rectangles or other shapes that correspond to a pixel array for given type of liquid crystal display (LCD) device. An optional lens 114 or other focusing element or system may be used to increase the flux of the radiant beam in the selected portions. If desired, beam deflectors, moveable stages, and/or other scanning equipment can be used to scan the radiant beam across the portions of the STOF film. By proper selection or adjustment of the intensity, wavelength, and other significant properties of the beam 112, in combination with proper tailoring of the absorptive characteristics of the STOF film 110, the reflective characteristics of the film 110 can be changed in the selected portions of the film, referred to here as a treated second zone 110b or area, relative to neighboring first zones or areas 110a, 110c. Thus, in the first zones 110a, 110c, the original first reflective characteristic of the film 110 is maintained, while in the second zone 110b, a different second reflective characteristic is provided. The change from the first reflective characteristic to the second reflective characteristic is, in exemplary cases, substantially attributable to a change in birefringence of at least a portion of the first film, and not substantially attributable to any substantial change or damage to a structural integrity or morphology of the film.

The patterned STOF film 110 may then be placed in proximity to another article 116 that can also be patterned with radiant energy. Alternatively, the film 110 may be placed at a location that is distant from article 116, and a focusing system such as one or more lenses may be used to image the film 110 onto the article 116. Note that the radiant energy used to pattern the article 116 preferably differs in some way from the first radiant beam used to pattern the STOF film. Initially, the article 116 may have a first detectable characteristic that may be substantially spatially uniform over its entire useable area. The first detectable characteristic may be optical in nature, e.g., relating to transmission, reflection, absorption, scattering, polarization, wavelength/color, or the like, or it may be different, e.g., electrical, mechanical, and/or chemical in nature, or combinations thereof.

A second radiant beam 118 may then be provided to illuminate the article 116 through the patterned film 110, which now functions as a mask. As mentioned above, the radiant beam 118 preferably differs from the first radiant beam 112 that was used to pattern the STOF film. One or both of the first and second radiant beams may utilize polarized light, and the polarization states may be different. In order to avoid parallax or spreading effects from the mask to the article 116, it may be particularly helpful to configure the second beam 118 as a collimated or partially collimated beam of light. Furthermore, the angular and intensity distribution of the second radiant beam, the geometrical arrangement of the patterned film 110 relative to the article 116, and other pertinent processing considerations may be taken into account when patterning the film 110 so as to ensure proper feature size and orientation in the final patterned article 116.

The second reflective characteristic may be more reflective than the first reflective characteristic, or vice versa. For purposes of FIG. 1A, we assume that the second reflective characteristic of film 110, in the second zone 110b, is more reflective and less transmissive of the second radiant beam 118 than the first reflective characteristic in the first zones 110a, 110c. For this reason, the portion 118a of beam 118 that impinges upon the second zone is shown as being reflected. In an alternative embodiment, the second reflective characteristic in zone 110b may be less reflective and more transmissive than the first reflective characteristic in the first zones 110a, 110c. The first or second reflective characteristic, which may be specular or diffuse depending on the design of the STOF film, may have a relatively high reflectivity for the second radiant beam, and/or at another wavelength of interest, e.g., a reflectivity of at least 90%, or at least 95%, or at least 99%.

Radiation from the second radiant beam 118 that passes through the patterned STOF film 110 and impinges upon the article 116 is tailored to change the first detectable characteristic to a different second detectable characteristic. By virtue of the masking provided by the patterned STOF film, this change in the article 116 is accomplished only in selected locations, which in this case are zones 116a, 116c of article 116, the zones 116a, 116c corresponding substantially to zones 110a, 110c of film 110. Zone 116b of article 116 remains untreated by the beam 118 due to the assumed high reflectivity of the beam at zone 110b of film 110.

In a final step, the patterned article 116 can be removed and put to use in a suitable end-use application for which it is designed.

The article 116 may be or comprise a block or other solid form, a plate, a film, and/or the like, and may be or comprise another STOF film. The article 116 may be or comprise, for example, a layer of photoresist disposed on a semiconductor substrate or another substrate, or a layer of photo-alignable liquid crystal material, or a layer of curable material. The detectable characteristic of the article may be altered by the incidence and absorption of light, e.g. suitable ultraviolet, visible, or infrared light. For example, the change in the detectable characteristic may involve a curing operation (e.g. UV curing) or other chemical reaction triggered by the second radiant beam. The change in detectable characteristic may also involve phase transformations and/or chemical decomposition. Molecular orientation processes such as stress relaxation may also be involved. Such processes can result in changes in birefringence of the article 116. The masking effect provided by patterned STOF film 110 provides spatially selective reflectivity of the second radiant beam 118, thus providing control over the locations at which such changes in the article 116 are permitted, and in some cases, control over the extent of such changes (e.g. the degree of change of a given characteristic) at any of those locations.

The article 116 may also be or comprise a composite construction of various layers or other components. If the components of such an article 116 are arranged in a layered configuration, the article may have at least one outer or upper layer capable of being processed by the second radiant beam, and may have a blocking layer (such as any of the blocking layers disclosed in PCT Publication WO 2010/075373 (Merrill et al.), "Multilayer Optical Films Suitable for Bi-Level Internal Patterning") disposed underneath the processable layer so as to protect still deeper layers or components from the effects of the second radiant beam and/or other radiant beams.

If the article 116 is a flexible film, then tension and/or roll support and/or planar support can be used to reduce vibrations, chatter, and/or undulation during processing. If the article 116 is a roll of film, the process can be continuous or semi-continuous. In cases where required tolerances are not too stringent, a roll of unpatterned STOF film used for the article 116 can be unwound into a processing line that is equipped with a patterned STOF film that functions as a mask. The STOF mask can be contacted under controlled tension to the unpatterned STOF film, with or without an intervening release liner, and the films can then be conveyed together into a radiant processing unit. One or both of these films can be supported by a moving belt through the processing unit. If both a top and bottom belt are used, then at least one should be reasonably transmissive to the processing light (i.e., the second radiant beam). Alternatively, the unpatterned STOF film or other article 116 can be conveyed separately into the radiant processing unit, and then secured and registered with the STOF mask in a continuous or semi-continuous fashion. For example, the conveyance may stop for securing, registering, and/or radiantly processing the article 116, and then restart so as to carry the processed article 116 out of the processing unit and carry the next (unprocessed) article 116 into the processing unit. For example, a portion of a film roll can be laminated to a glass plate. The film can then be cut and conveyed, or conveyed while still attached to the plate, into the processing unit. In that unit, the STOF mask may be brought into contact with the laminated film/plate, or may be maintained at a controlled distance from such laminated article.

It may be advantageous in manufacturing to precisely write the initial pattern in the STOF mask 110 using one writing wavelength for the first radiant beam, e.g. using a slow but precise laser scanning process, and then using this precisely written STOF mask to selectively block the second radiant beam at a different writing wavelength in order to pattern the article 116, e.g. using a simpler, faster process. For example, treating a STOF film using a scanning laser may create a precise pattern, but may also be slower and more costly than pattern-wise treating a film using a non-scanning or non-patterning light source, such as a flashlamp, in combination with a mask. The mask can be written with a scanning laser, for example, on a STOF film. This STOF mask can then be used as a spatial filter for a wide beam of light from a flashlamp or other suitable radiant source to process other patternable articles 116. Consider a process that uses a STOF mask in combination with a second radiant beam having a wavelength in a near infrared band, e.g. at or near 1064 nm, to pattern-wise process a patternable article 116. The article 116 may be or comprise a STOF film that reflects light over a portion of the visible band, e.g., red, green, or blue light, e.g. for application in a display, and that absorbs light at 1064 nm. Processing of this film by heat-inducing absorption at 1064 nm may convert the visible red, green, or blue reflectivity to a window-like appearance, for example, in treated areas. A STOF mask 110 used to pattern such an article 116 may possess a reflection band that overlaps or encompasses the 1064 nm wavelength of the second radiant beam, and may also have a substantial absorption over a different wavelength band, e.g. in the visible, ultraviolet, or other portion of the infrared. A first radiant beam at this different wavelength band is used in an earlier step to pattern the STOF mask 110, i.e., to eliminate its reflection band at 1064 nm in selected zones. In another example, the article 116 may be pattern-wise processed using a second radiant beam having a near-ultraviolet wavelength and a STOF mask that selectively reflects such near-ultraviolet wavelength. The STOF mask itself may have been processed or treated using a first radiant beam having a visible or infrared wavelength, for example.

Thus, a STOF film may be pattern-wise treated by the rapid absorption of radiant energy in a first wavelength band of interest, e.g. through the incorporation of an absorbing dye or other agent that absorbs at the first wavelength band, or using an intrinsic absorption of a material used in the construction, so as to produce a patterned mask. This patterned mask, which may reflect light at a second wavelength band in some places and transmit such light in other places, may subsequently be used, in combination with a radiant source emitting at the second wavelength band, to treat the article 116. The article 116 may include an absorbing dye or other agent that absorbs at the second wavelength band significantly more than the patterned mask at this wavelength. Light from the radiant source that passes through the patterned mask and impinges on the article 116 can be used for the radiant processing of the article.

Using a reflective STOF film as a mask for the patterning of other articles has several possible advantages, some of which may depend upon details of implementation. First, the ability to use laser scanning to write the pattern into the STOF film mask allows precise, fine detail in the subsequently processed or patterned article. Second, the STOF film mask may be mounted on a transparent support member, such as a glass plate, to maintain precise dimensional control of the mask. Third, the STOF film mask may be patterned after being mounted to such a support member. Fourth, the patterning of the STOF film mask may also be carried out to create alignment marks (e.g., optical "holes" or "blocks") that can be used for registration with corresponding marks or features that may be present on the article to ensure proper registration between the mask and the patternable article. In the case of a display, the marks or features may be the certain pixels themselves, turned on. A passive or active optical sensor, e.g. a sensor that utilizes a laser whose radiant output (characterized by wavelength, intensity, polarization, angle of incidence, and so forth) is ineffective to treat or modify both the mask and the patternable article, may be used for alignment purposes. If desired, the STOF film mask may be designed to include two different optical packets of microlayers: one to reflect the second radiant beam (used to pattern the article 116), and one to use for optical registration purposes. The STOF film mask may be or comprise a bi-level patterned reflective film as described, for example, in PCT Publication WO 2010/075373 (Merrill et al.), "Multilayer Optical Films Suitable for Bi-Level Internal Patterning", to achieve the desired effect.

For maximum utility, it may be desirable for the STOF film mask to maintain the fidelity of its precise pattern of reflective and transmissive zones even after many uses, e.g., after many exposures to a second radiant beam used to process patternable articles 116. The lifetime of the mask will be a function of its environmental conditions, including thermal and incident radiation conditions. In some cases it may be desirable to fabricate multiple generations of STOF masks. For example, a primary or master STOF mask may be formed using a controlled scanning process in order. This primary mask may then be used to make a limited set, e.g., one or more, of secondary STOF masks. Each such secondary STOF mask may be used to make as many patternable articles as possible before the secondary STOF mask becomes degraded, after which the degraded secondary STOF mask may be replaced with a different (unused) secondary STOF mask, and so forth. The primary or master STOF mask thus allows for the fabrication of limited lifetime secondary STOF masks, which in turn may be used to process the patternable articles.

In some cases, the mask may become part of a finished article. For example, in a finished article intended for use in the visible wavelength region, such as a security film, reflective portions of the STOF film mask may reflect at wavelengths outside of the visible band. For example, such a film mask may have a normal incidence reflection band in the ultraviolet region, or in a region above about 900-1000 nm, depending on requirements for off-axis (oblique angle) viewing which causes the reflection bands to shift to shorter wavelengths. If the STOF film mask is intended to be substantially transparent over its entire useable area over all visible wavelengths and if the mask includes a (spatially patterned) reflection band in the infrared region, then the packet(s) of microlayers providing that infrared reflection band would desirably be designed with an optical repeat unit tailored to suppress higher order reflection peaks. The finished article may include such a STOF mask film together with a patternable article, such as a second STOF film, disposed below or behind the STOF film mask. The second STOF film may exhibit a different reflection band, e.g. patterned reflection at visible wavelengths. The STOF film mask of such a finished article may be patterned first by exposing the finished article to a first radiant beam, e.g. a first scanned laser beam. Whether or not the spatial pattern of this STOF film mask is visible to the unaided eye, the STOF mask so patterned will allow for the later pattern-wise treatment of the second STOF film using a second radiant beam, where the second radiant beam may be non-scanning and may impinge upon the entire useable area of the STOF mask but (due to the spatial filtering action of the STOF mask) only selected portions of the second STOF film. An end user viewing the resulting finished article may observe the patterning of the second STOF film but may be unable to detect or observe the patterning of the STOF mask, which may remain in the construction.

In some cases, a patterned STOF film that is part of a finished article may be treated with a radiant beam a second time (and if desired, third, fourth, and more times) to modify the initial pattern that was produced in the STOF film to pattern the patternable article (e.g. article 116 in FIG. 1A). Modification of the initial pattern in the STOF film may include forming a second pattern in the STOF film by heat treating selected areas or zones of the STOF film that were not heat-treated in the initial patterning step while allowing other areas or zones of the STOF film that were not heat-treated in the initial patterning step to remain untreated. Modification of the initial pattern may also include heat-treating the entire useable area of the STOF film, or at least enough of the useable area of the STOF film, so that substantially no pattern remains in the STOF film, i.e., so that substantially the entire useable area of the STOF film has an optical characteristic (e.g. a reflective characteristic) associated with the reduced birefringence associated with the heat treatment.

Figure 1B:
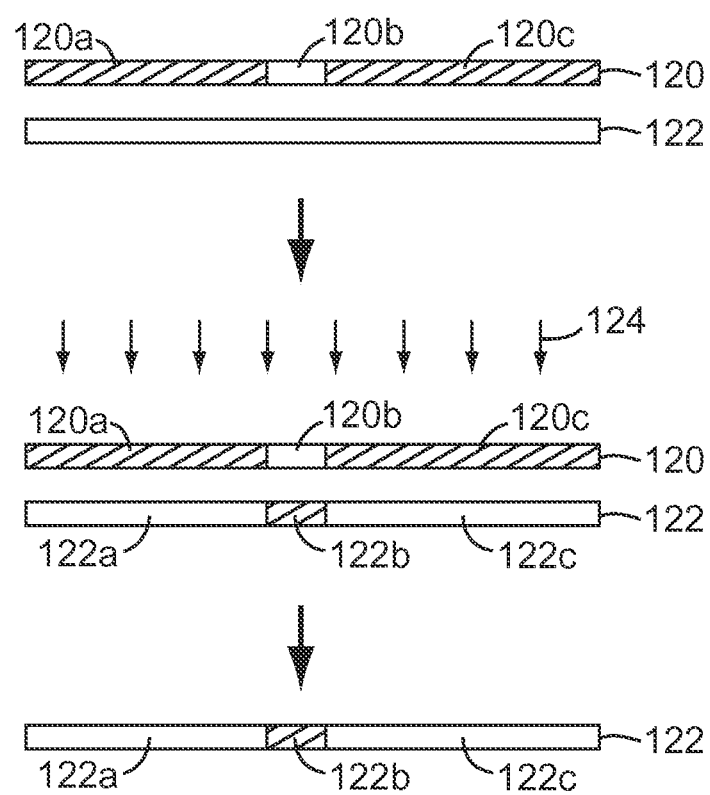
FIG. 1B is a schematic side or sectional view of components involved in various steps of a process in which a mask is used to pattern a reflective STOF film.

Thus, for example, a STOF film may be patterned with a first pattern using a first radiant beam, e.g., using a scanning process or using a masking process such as that of FIG. 1A or 1B. Areas or zones of the STOF film that were treated with the first radiant beam exhibit a second reflective characteristic different from an original first reflective characteristic of the STOF film. This patterned STOF film may be part of a composite article that includes another patternable article (e.g. article 116 in FIG. 1A), or the patterned STOF film may later be attached to the patternable article to form the composite article. The composite article may then be exposed to a second radiant beam, such that the patterned STOF film masks portions of the second radiant beam so as to pattern the patternable article. This may, for example, substantially transfer the first pattern from the STOF film to the patternable article. Thereafter, a third radiant beam, which may be similar to the first radiant beam except that it is allowed to impinge upon at least some areas of the STOF film that the first radiant beam did not impinge upon, so that at least these areas of the STOF film also exhibit a change from the first reflective characteristic to the second reflective characteristic. If the third radiant beam does not treat all previously untreated areas of the STOF film, then a second pattern, different from the first pattern, is provided in the STOF film. On the other hand, if the third radiant beam does treat all previously untreated areas of the STOF film (e.g. in cases where the third radiant beam impinges upon substantially the entire STOF film), then the STOF film becomes substantially unpatterned with a reflective characteristic characterized by the second reflective characteristic. Note that, depending upon the design of the STOF film, the second reflective characteristic may either be more reflective, or less reflective, than the original first reflective characteristic. The re-treatment of the STOF film by the third radiant beam may be used as an anti-counterfeiting or anti-tampering measure.

In some cases, the second radiant beam in combination with the STOF mask may change the detectable characteristic of the patternable article (e.g. article 116 in FIG. 1A) in a way that is temporary and/or reversible. Consider again the case of a composite article that includes both a STOF film mask and a patternable article. A detectable characteristic of the patternable article is temporarily changed by exposing the patternable article to a second radiant beam through the STOF film mask. Portions of the second radiant beam that impinge upon portions of the patternable article may optically reveal the pattern of the mask in the patternable article, e.g., at a different wavelength than that of the second radiant beam. For example, consider a STOF mask that reflects UV light in some zones and transmits UV light in other zones. Such a pattern of reflective and transmissive zones may have been processed in the STOF mask using, e.g., a first radiant beam at an infrared wavelength. The patternable article beneath or behind the STOF film mask may be a film that contains a fluorescent dye or similar substance that is excited at UV wavelengths and that emits at visible wavelengths. Exposing the composite article to a second radiant beam of UV light allows the UV light to impinge upon only those portions of the patternable article that lie directly beneath transparent zone(s) of the STOF mask. A pattern of visible fluorescent light can thus be provided by the composite article. Note that this pattern is temporary and reversible, because after the second radiant beam is turned off or otherwise removed, the fluorescent light pattern will disappear.

Embodiments that utilize a STOF film mask may also utilize a blocking layer configured to block the wavelength of light used in the first radiant beam to pattern the STOF film mask, and/or to block other wavelengths of light. For example, a second radiant beam may include not only light at a second wavelength that is effective to pattern the patternable article beneath the STOF film, but may also include light at a third wavelength capable of changing the reflective characteristics of the STOF film mask or otherwise degrading the STOF film mask. In such a case, a blocking layer that reflects light at the third wavelength but transmits light at the second wavelength may be provided as a protective layer above or in front of the STOF film mask, between the mask and the source of the second radiant beam. The blocking layer may also desirably transmit light at a first wavelength, at which the STOF film mask is processed or patterned. Such a blocking layer may be or comprise, for example, a mirror-like multilayer optical film (MOF) whose reflection band covers the third wavelength or at least a portion of a mask-sensitive wavelength band. Such a film may be added atop the STOF film mask.

A reflective STOF film may be applied to a film or article containing an image or other pattern that can be observed or detected using a machine to provide useful information. Before or after the STOF film is applied to such patterned article, a first reflective characteristic of the STOF film may be selectively patterned into a different second reflective characteristic using a first radiant beam. The first radiant beam may "turn on" a reflectivity of the STOF film, i.e., the second reflective characteristic may be more reflective than the first reflective characteristic (e.g., a window to mirror, or window to polarizer, or polarizer to mirror characteristic), or the first radiant beam may "turn off" a reflectivity of the STOF film, i.e., the second reflective characteristic may be less reflective than the first reflective characteristic (e.g., a mirror to window, or polarizer to window, or mirror to polarizer characteristic). A third radiant beam may later be used to eliminate or modify the pattern of the STOF film by treating some or all of the areas on the patterned STOF film still having the first reflective characteristic so that they change to the second reflective characteristic as a result of heat-induced reduction of birefringence in the STOF film. The re-treatment of the STOF by the third radiant beam may make the useful information in the underlying film or article more accessible (e.g. if the second reflective characteristic is less reflective than the first reflective characteristic) or less accessible (e.g. if the second reflective characteristic is more reflective than the first reflective characteristic). The re-patterned STOF film may thus fully or partially mask the information in the underlying patterned film or article.

FIG. 1B is a schematic side or sectional view of components involved in various steps of a process in which a mask 120 is used to pattern a reflective STOF film 122. The mask 120 may be or comprise a mask of conventional design, e.g., a simple transparent film on which an opaque material such as ink is printed in a pattern, or it may be or comprise an internally patterned STOF film. For example, the mask 120 may be the patterned STOF film 110 of FIG. 1A, or the patterned article 116 of FIG. 1A. In any case, the mask 120 is patterned such that it includes first areas or zones 120*a*, 120*c* that substantially block (e.g., absorb and/or reflect) light, and other zones 120*b* that substantially transmit light. The pattern may be of any desired shape. For example, the pattern may be a grid or array of small rectangles or other shapes that correspond to a pixel array for given type of liquid crystal display (LCD) device.

In a first step, the mask 120 is placed in proximity to the reflective STOF film 122, or the mask 120 may be imaged onto the film 122 as explained above. The STOF film 122 may initially be substantially spatially uniform, i.e., it may exhibit a first reflective characteristic over its entire useable area. Details of the wide variety of available STOF film types are provided elsewhere herein, e.g., in the discussion below.

Next, the STOF film 122 is internally patterned by providing a first radiant beam 124 to illuminate the film 122 through the mask 120. The spatial filtering provided by the mask 120 causes the first radiant beam 124 to impinge upon only selected portions of the film. By proper selection or adjustment of the intensity, wavelength, and other significant properties of the beam 124, in combination with proper tailoring of the absorptive characteristics of the STOF film 122, the reflective characteristics of the film 122 can be changed in the selected portions of the film, referred to here as a treated second zone or area 122*b*, relative to neighboring first zones or areas 122*a*, 122*c*. Thus, in the first zones 122*a*, 122*c*, the original first reflective characteristic of the film 122 is maintained, while in the second zone 122*b*, a different second reflective characteristic is provided. The change from the first reflective characteristic to the second reflective characteristic is, in exemplary cases, substantially attributable to a change in birefringence of at least a portion of the first film, and not substantially attributable to any substantial change or damage to a structural integrity (e.g., layer structure or immiscible blend morphology) of the film.

In order to avoid parallax or spreading effects from the mask to the film 122, it may be particularly helpful to configure the radiant beam 124 as a collimated or partially collimated beam of light. Furthermore, the angular and intensity distribution of the radiant beam, the geometrical arrangement of the mask 120 relative to the STOF film 122, and other pertinent processing considerations may be taken into account when designing the pattern for mask 120 so as to ensure proper feature size and orientation in the STOF film 122. Since the radiant beam 124 may be a stationary, large area, and relatively uniform beam rather than a smaller beam that is scanned across the useable area of the film, substantially all areas of the STOF film 122 that undergo a change in reflective characteristic may experience such change at substantially the same time. Similar observations also apply to the radiant beam 118 of FIG. 1A.

In a final step, the patterned STOF film 122 can be removed and put to use in a suitable end-use application for which it is designed.

Figure 2:
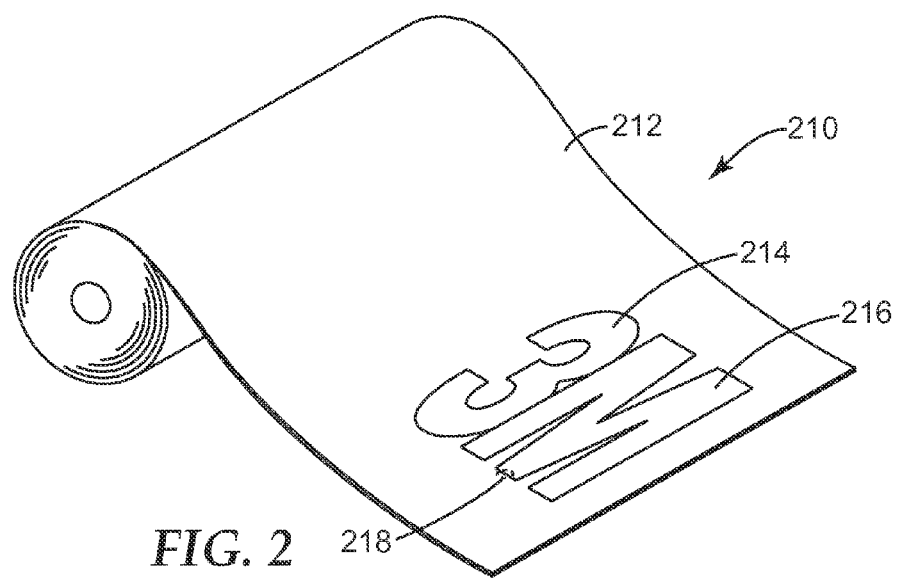
FIG. 2 is a perspective view of a roll of reflective STOF film that has been internally patterned to provide different reflective characteristics in different portions or zones of the film so as to form indicia.

Before considering other combinations of masks and STOF films, some of which are discussed later in connection with FIGS. 10-12, we now turn to FIGS. 2 through 9B to provide further information and background regarding STOF films and the capability of processing them in such a way as to change their reflective characteristics or other optical characteristics using selective heating provided by the localized absorption of radiant energy, the selective heating giving rise to a relaxation in birefringence of at least one constituent material or layer of the film. FIG. 2 is a perspective view of a roll of reflective STOF film 210 that has been internally patterned or spatially tailored using spatially selective birefringence reduction of at least some of the internal layers or materials (not shown in FIG. 2) to provide different reflective characteristics in different portions or zones of the film so as to form indicia. The internal patterning defines distinct zones 212, 214, 216 that are shaped so as to form the indicia "3M" as shown. The film 210 is shown as a long flexible material wound into a roll because the methodology described herein is advantageously compatible with high volume roll-to-roll processes. However, the methodology is not limited to flexible roll goods and can be practiced on small piece parts or samples as well as non-flexible films and articles.

The reflectivity of the film 210 may be specular in nature, e.g., as provided by a multilayer optical film having packets of generally planar microlayers, or it may be diffuse in nature, e.g. as provided by a blended layer having at least a first and second material arranged in distinct first and second phases in the blended layer. The reflectivity may also depend on polarization state of the light.

The "3M" indicia is visible or otherwise detectable because the different zones 212, 214, 216 have different reflective characteristics. In the depicted embodiment, zone 212 has a first reflective characteristic and zones 214, 216 have a second reflective characteristic different from the first reflective characteristic. In some cases, the film 210 may be at least partially light transmissive. In such cases, and where the film 210 has different reflectivities in its zones 212, 214, 216, those zones will also have different transmissive characteristics that correspond to their respective reflective characteristics. In general, of course, transmission (T) plus reflection (R) plus absorption (A)=100%, or T+R+A=100%. When dealing with films that may appreciably diffusely scatter the transmitted and/or reflected light, we keep in mind that T may represent the hemispheric transmission, i.e., all light that exits the film on a side of the film opposite the light source, regardless of its propagation direction within a solid angle of $2\pi c$, and R may likewise represent the hemispheric reflection, i.e., all light that exits the film on the same side of the film as the light source, regardless of its propagation direction within a complementary $2\pi c$ solid angle. In some embodiments the film is composed entirely of materials that have low absorption over at least a portion of the wavelength spectrum. This may be the case even for films that incorporate an absorbing dye or pigment to promote heat delivery, since some absorbing materials are wavelength specific in their absorptivity. For example, infrared dyes are available that selectively absorb in the near-infrared wavelength region but that have very little absorption in the visible spectrum. At the other end of the spectrum, many polymer materials that are considered to be low loss in the optical film literature do have low loss over the visible spectrum but also have significant absorption at certain ultraviolet wavelengths. Thus, in many cases the film 210 may have an absorption that is small or negligible over at least a limited portion of the wavelength spectrum, such as the visible spectrum, in which case the reflection and transmission over that limited range take on a complementary relationship because T+R=100%−A, and since A is small, $$T+R \approx 100\%.$$

As mentioned elsewhere herein, the different reflective characteristics of the film 210 in the different patterned zones are each the result of structural features (such as a stack of microlayers in a multilayer optical film, or distinct first and second phases in a blended layer) that are internal to the film, rather than the result of coatings applied to the surface of the film or other surface features. This aspect of the disclosed films makes them advantageous for security applications (e.g. where the film is intended for application to a product, package, or document as an indicator of authenticity) because the interior features are difficult to copy or counterfeit.

The first and second reflective characteristics differ in some way that is perceptible under at least some viewing conditions to permit detection of the pattern by an observer or by a machine. In some cases it may be desirable to maximize the difference between the first and second reflective characteristics at visible wavelengths so that the pattern is conspicuous to human observers under most viewing and lighting conditions. In other cases it may be desirable to provide only a subtle difference between the first and second reflective characteristics, or to provide a difference that is conspicuous only under certain viewing conditions. In either case the difference between the first and second reflective characteristics is preferably attributable primarily to difference in the refractive index properties of interior features of the optical film in the different neighboring zones of the film, and is not primarily attributable to differences in thickness between the neighboring zones.

The zone-to-zone differences in refractive index can produce various differences between the first and second reflective characteristics depending on the design of the optical film. In some cases the first reflective characteristic may include a first reflection band with a given center wavelength, band edge, and maximum reflectivity, and the second reflective characteristic may differ from the first by having a second reflection band that is similar in center wavelength and/or band edge to the first reflection band, but that has a substantially different maximum reflectivity (whether greater or lesser) than the first reflection band, or the second reflection band may be substantially absent from the second reflection characteristic. These first and second reflection bands may be associated with light of only one polarization state, or with light of any polarization state depending on the design of the film.

In embodiments that include a diffusely reflective blended layer, the first reflective characteristic may be or include, for example, a minimum, maximum, or average diffuse reflectivity (or transmission) value over the visible wavelength range, where the reflectivity (or transmission) may be measured for an incident beam of a specified polarization state and for reflected (or transmitted) light within a specified solid angle of reflected (or transmitted) directions relative to the incident beam, or within a hemispheric (2πc) solid angle on the incident light-side (or the opposite side) of the film, for example. The second reflective characteristic may differ from the first by having a substantially different (whether greater or lesser) minimum, maximum, or average reflectivity or transmission value for the same specified incident light and measurement conditions as the first characteristic. Furthermore, one of the first and second characteristics may correspond substantially to a highly transmissive, low scattering appearance as in the case of a window film, at least for incident light of one polarization state.

Thus, for example, the first reflective characteristic (which may be diffuse or specular in nature), in zone 212, may have a peak or average reflectivity of $R_1$ in a wavelength range of interest for a specified condition of incident light (e.g. a specified direction, polarization, and wavelength, such as normally incident unpolarized visible light, or normally incident visible light polarized along a particular in-plane direction). The reduced birefringence in the zones 214, 216 yields a second reflective characteristic (which may again be diffuse or specular in nature), such as a different peak or average reflectivity of $R_2$ in the same wavelength range of interest for the same specified condition of incident light. $R_1$ and $R_2$ are compared under the same illumination and observation conditions, for example, $R_1$ and $R_2$ may be measured as hemispheric reflectivity on the incident light-side of the film, for the specified incident condition. If $R_1$ and $R_2$ are expressed in percentages, $R_2$ may differ from $R_1$ by at least 10%, or by at least 20%, or by at least 30%. As a clarifying example, $R_1$ may be 70%, and $R_2$ may be 60%, 50%, 40%, or less. Alternatively, $R_1$ may be 10%, and $R_2$ may be 20%, 30%, 40%, or more. $R_1$ and $R_2$ may also be compared by taking their ratio. For example, $R_2/R_1$ or its reciprocal may be at least 2, or at least 3.

In some cases the first and second reflective characteristics may differ in their dependence of reflectivity with viewing angle. For example, the first reflective characteristic may include a first reflection band that has a given center wavelength, band edge, and maximum reflectivity at normal incidence, and the second reflective characteristic may include a second reflection band that is very similar to these aspects of the first reflection band at normal incidence. With increasing incidence angle, however, although both the first and second reflection bands may shift to shorter wavelengths, their respective maximum reflectivities may deviate from each other greatly. For example, the maximum reflectivity of the first reflection band may remain constant or increase with increasing incidence angle, while the maximum reflectivity of the second reflection band, or at least the p-polarized component thereof, may decrease with increasing incidence angle, e.g. in a range from normal incidence to the Brewster's angle.

In embodiments that include at least one multilayer optical film, the differences discussed above between the first and second reflective characteristics may relate to reflection bands that cover a portion of the visible spectrum. Such differences may in those cases be perceived as differences in color between the different in-plane zones of the film.

A first reflective characteristic may have a given minimum, maximum, or average reflectivity or transmission for light of a given polarization state normally incident on the film, and a second reflective characteristic may have the same or similar reflectivity or transmission value for light of the same incidence conditions. With increasing incidence angle, however, the value may increase for the first characteristic and decrease for the second characteristic, or vice versa, or the value may remain relatively constant for one characteristic and substantially increase or decrease for the other. In embodiments that include at least one diffusely reflective blended layer, different first and second diffusely reflective characteristics may exhibit the same or similar average reflectivity over visible wavelengths for normally incident light of a given polarization state, but as the incidence angle increases, the average reflectivity of the film in a first zone (corresponding to the first diffusely reflective characteristic) may increase, while the average reflectivity of the film in a second zone (corresponding to the second diffusely reflective characteristic) may decrease.

Figure 3A:
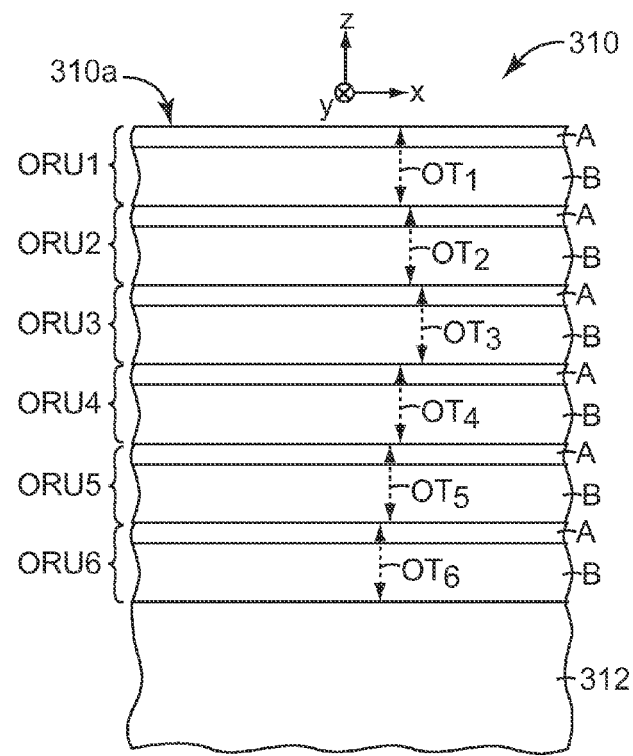
FIG. 3A is a schematic side view of a portion of a multilayer optical film.

Turning now to FIG. 3A, we see there a portion of a multilayer film 310, which may be a STOF film, in schematic side view to reveal the structure of the film including its interior layers. Such a film may be used as a blocking layer in the disclosed embodiments, and, if it is made to have suitable absorptive characteristics, may also be used as a patternable reflector or STOF film in the disclosed embodiments. The film is shown in relation to a local x-y-z Cartesian coordinate system, where the film extends parallel to the x- and y-axes, and the z-axis is perpendicular to the film and its constituent layers and parallel to a thickness axis of the film. Note that the film 310 need not be entirely flat, but may be curved or otherwise shaped to deviate from a plane, and even in those cases arbitrarily small portions or regions of the film can be associated with a local Cartesian coordinate system as shown. The film 310 may be considered to represent the film 210 of FIG. 2 in any of its zones 212, 214, 216, since the individual layers of the film 210 preferably extend continuously from each such zone to the next.

Multilayer optical films include individual layers having different refractive indices so that some light is reflected at interfaces between adjacent layers. These layers, sometimes referred to as "microlayers", are sufficiently thin so that light reflected at a plurality of the interfaces undergoes constructive or destructive interference to give the multilayer optical film the desired reflective or transmissive properties. For multilayer optical films designed to reflect light at ultraviolet, visible, or near-infrared wavelengths, each microlayer generally has an optical thickness (a physical thickness multiplied by refractive index) of less than about 1 μm. However, thicker layers can also be included, such as skin layers at the outer surfaces of the multilayer optical film, or protective boundary layers (PBLs) disposed within the multilayer optical film to separate coherent groupings (known as "stacks" or "packets") of microlayers. In FIG. 3A, the microlayers are labeled "A" or "B", the "A" layers being composed of one material and the "B" layers being composed of a different material, these layers being stacked in an alternating arrangement to form optical repeat units or unit cells ORU 1, ORU 2, . . . ORU 6 as shown. Typically, a multilayer optical film composed entirely of polymeric materials would include many more than 6 optical repeat units if high reflectivities are desired. Note that all of the "A" and "B" microlayers shown in FIG. 3A are interior layers of film 310, except for the uppermost "A" layer whose upper surface in this illustrative example coincides with the outer surface 310a of the film 310. The substantially thicker layer 312 at the bottom of the figure can represent an outer skin layer, or a PBL that separates the stack of microlayers shown in the figure from another stack or packet of microlayers (not shown). If desired, two or more separate multilayer optical films can be laminated together, e.g. with one or more thick adhesive layers, or using pressure, heat, or other methods to form a laminate or composite film.

In some cases, the microlayers can have thicknesses and refractive index values corresponding to a ¼-wave stack, i.e., arranged in optical repeat units each having two adjacent microlayers of equal optical thickness (f-ratio=50%, the f-ratio being the ratio of the optical thickness of a constituent layer "A" to the optical thickness of the complete optical repeat unit), such optical repeat unit being effective to reflect by constructive interference light whose wavelength $\lambda$ is twice the overall optical thickness of the optical repeat unit, where the "optical thickness" of a body refers to its physical thickness multiplied by its refractive index. In other cases, the optical thickness of the microlayers in an optical repeat unit may be different from each other, whereby the f-ratio is greater than or less than 50%. In the embodiment of FIG. 3A, the "A" layers are depicted for generality as being thinner than the "B" layers. Each depicted optical repeat unit (ORU 1, ORU 2, etc.) has an optical thickness ($OT_1$, $OT_2$, etc.) equal to the sum of the optical thicknesses of its constituent "A" and "B" layer, and each optical repeat unit reflects light whose wavelength $\lambda$ is twice its overall optical thickness. The reflectivity provided by microlayer stacks or packets used in multilayer optical films in general, and in the internally patterned multilayer optical films discussed herein in particular, is typically substantially specular in nature, rather than diffuse, as a result of the generally smooth well-defined interfaces between microlayers, and the low haze materials that are used in a typical construction. In some cases, however, the finished article may be tailored to incorporate any desired degree of scattering, e.g., using a diffuse material in skin layer(s) and/or PBL layer(s), and/or using one or more surface diffusive structures or textured surfaces, for example.

In some embodiments, the optical thicknesses of the optical repeat units in a layer stack may all be equal to each other, to provide a narrow reflection band of high reflectivity centered at a wavelength equal to twice the optical thickness of each optical repeat unit. In other embodiments, the optical thicknesses of the optical repeat units may differ according to a thickness gradient along the z-axis or thickness direction of the film, whereby the optical thickness of the optical repeat units increases, decreases, or follows some other functional relationship as one progresses from one side of the stack (e.g. the top) to the other side of the stack (e.g. the bottom). Such thickness gradients can be used to provide a widened reflection band to provide substantially spectrally flat transmission and reflection of light over the extended wavelength band of interest, and also over all angles of interest. Thickness gradients tailored to sharpen the band edges at the wavelength transition between high reflection and high transmission can also be used, as discussed in U.S. Pat. No. 6,157,490 (Wheatley et al.) "Optical Film With Sharpened Bandedge". For polymeric multilayer optical films, reflection bands can be designed to have sharpened band edges as well as "flat top" reflection bands, in which the reflection properties are essentially constant across the wavelength range of application. Other layer arrangements, such as multilayer optical films having 2-microlayer optical repeat units whose f-ratio is different from 50%, or films whose optical repeat units include more than two microlayers, are also contemplated. These alternative optical repeat unit designs can be configured to reduce or to excite certain higher-order reflections, which may be useful if the desired reflection band resides in or extends to near infrared wavelengths. See, e.g., U.S. Pat. No. 5,103,337 (Schrenk et al.) "Infrared Reflective Optical Interference Film", U.S. Pat. No. 5,360,659 (Arends et al.) "Two Component Infrared Reflecting Film", U.S. Pat. No. 6,207,260 (Wheatley et al.) "Multicomponent Optical Body", and U.S. Pat. No. 7,019,905 (Weber) "Multi-layer Reflector With Suppression of High Order Reflections".

Adjacent microlayers of the multilayer optical film have different refractive indices so that some light is reflected at interfaces between adjacent layers. We refer to the refractive indices of one of the microlayers (e.g. the "A" layers in FIG. 3A) for light polarized along principal x-, y-, and z-axes as n1x, n1y, and n1z, respectively. The x-, y-, and z-axes may, for example, correspond to the principal directions of the dielectric tensor of the material. Typically, and for discussion purposes, the principle directions of the different materials are coincident, but this need not be the case in general. We refer to the refractive indices of the adjacent microlayer (e.g. the "B" layers in FIG. 3A) along the same axes as n2x, n2y, n2z, respectively. We refer to the differences in refractive index between these layers as $\Delta nx$ (=n1x−n2x) along the x-direction, $\Delta ny$ (=n1y−n2y) along the y-direction, and $\Delta nz$ (=n1z−n2z) along the z-direction. The nature of these refractive index differences, in combination with the number of microlayers in the film (or in a given stack of the film) and their thickness distribution, controls the reflective and transmissive characteristics of the film (or of the given stack of the film) in a given zone. For example, if adjacent microlayers have a large refractive index mismatch along one in-plane direction ($\Delta nx$ large) and a small refractive index mismatch along the orthogonal in-plane direction ($\Delta ny \approx 0$), the film or packet may behave as a reflective polarizer for normally incident light. In this regard, a reflective polarizer may be considered for purposes of this application to be an optical body that strongly reflects normally incident light that is polarized along one in-plane axis (referred to as the "block axis") if the wavelength is within the reflection band of the packet, and strongly transmits such light that is polarized along an orthogonal in-plane axis (referred to as the "pass axis"). "Strongly reflects" and "strongly transmits" may have different meanings depending on the intended application or field of use, but in many cases a reflective polarizer will have at least 70, 80, or 90% reflectivity for the block axis, and at least 70, 80, or 90% transmission for the pass axis.

For purposes of the present application, a material is considered to be "birefringent" if the material has an anisotropic dielectric tensor over a wavelength range of interest, e.g., a selected wavelength or band in the UV, visible, and/or infrared portions of the spectrum. Stated differently, a material is considered to be "birefringent" if the principal refractive indices of the material (e.g., n1x, n1y, n1z) are not all the same. The "birefringence" of a given material or layer may then refer to the difference between its maximum principal refractive index and its minimum principal refractive index, unless otherwise indicated. Negligible amounts of birefringence can generally be ignored. In the case of a blended layer for a diffusely reflective film, a constituent material in the continuous phase preferably exhibits a birefringence of at least 0.03, or 0.05, or 0.10. In some cases, the birefringence of any given material or layer may be specified to be at least 0.02, or 0.03, or 0.05, for example.

In another example, adjacent microlayers may have a large refractive index mismatch along both in-plane axes ($\Delta nx$ large and $\Delta ny$ large), in which case the film or packet may behave as an on-axis mirror. In this regard, a mirror or mirror-like film may be considered for purposes of this application to be an optical body that strongly reflects normally incident light of any polarization if the wavelength is within the reflection band of the packet. Again, "strongly reflecting" may have different meanings depending on the intended application or field of use, but in many cases a mirror will have at least 70, 80, or 90% reflectivity for normally incident light of any polarization at the wavelength of interest. In variations of the foregoing embodiments, the adjacent microlayers may exhibit a refractive index match or mismatch along the z-axis ($\Delta nz \approx 0$ or $\Delta nz$ large), and the mismatch may be of the same or opposite polarity or sign as the in-plane refractive index mismatch(es). Such tailoring of $\Delta nz$ plays a key role in whether the reflectivity of the p-polarized component of obliquely incident light increases, decreases, or remains the same with increasing incidence angle. In yet another example, adjacent microlayers may have a substantial refractive index match along both in-plane axes ($\Delta nxz \approx \Delta nyz \approx 0$) but a refractive index mismatch along the z-axis ($\Delta nz$ large), in which case the film or packet may behave as a so-called "p-polarizer", strongly transmitting normally incident light of any polarization, but increasingly reflecting p-polarized light of increasing incidence angle if the wavelength is within the reflection band of the packet.

In view of the large number of permutations of possible refractive index differences along the different axes, the total number of layers and their thickness distribution(s), and the number and type of microlayer packets included in the multilayer optical film, the variety of possible multilayer optical films 310 and packets thereof is vast. Exemplary multilayer optical films are disclosed in: U.S. Pat. No. 5,486,949 (Schrenk et al.) "Birefringent Interference Polarizer"; U.S. Pat. No. 5,882,774 (Jonza et al.) "Optical Film"; U.S. Pat. No. 6,045,894 (Jonza et al.) "Clear to Colored Security Film"; U.S. Pat. No. 6,179,949 (Merrill et al.) "Optical Film and Process for Manufacture Thereof"; U.S. Pat. No. 6,531,230 (Weber et al.) "Color Shifting Film"; U.S. Pat. No. 6,939,499 (Merrill et al.) "Processes and Apparatus for Making Transversely Drawn Films with Substantially Uniaxial Character"; U.S. Pat. No. 7,256,936 (Hebrink et al.) "Optical Polarizing Films with Designed Color Shifts"; U.S. Pat. No. 7,316,558 (Merrill et al.) "Devices for Stretching Polymer Films"; PCT Publication WO 2008/144136 A1 (Nevitt et al.) "Lamp-Hiding Assembly for a Direct Lit Backlight"; PCT Publication WO 2008/144656 A2 (Weber et al.) "Backlight and Display System Using Same".

We note that at least some of the microlayers in at least one packet of the multilayer optical film are birefringent in at least one zone of the film (e.g., zones 212, 214, 216 of FIG. 2). Thus, a first layer in the optical repeat units may be birefringent (i.e., $n1x \neq n1y$, or $n1x \neq n1z$, or $n1y \neq n1z$), or a second layer in the optical repeat units may be birefringent (i.e., $n2x \neq n2y$, or $n2x \neq n2z$, or $n2y \neq n2z$), or both the first and second layers may be birefringent. Moreover, the birefringence of one or more such layers is diminished in at least one zone relative to a neighboring zone. In some cases, the birefringence of these layers may be diminished to zero, such that they are optically isotropic (i.e., $n1x = n1y = n1z$, or $n2x = n2y = n2z$) in one of the zones but birefringent in a neighboring zone. In cases where both layers are initially birefringent, depending on materials selection and processing conditions, they can be processed in such a way that the birefringence of only one of the layers is substantially diminished, or the birefringence of both layers may be diminished.

Exemplary multilayer optical films are composed of polymer materials and may be fabricated using a variety of flow processes, including coextrusion, film casting, and film stretching or drawing processes. Typically, birefringence is developed in at least some layers through one or more of these various flow processes. Reference is made to U.S. Pat. No. 5,882,774 (Jonza et al.) "Optical Film", U.S. Pat. No. 6,179,949 (Merrill et al.) "Optical Film and Process for Manufacture Thereof", and U.S. Pat. No. 6,783,349 (Neavin et al.) "Apparatus for Making Multilayer Optical Films". The multilayer optical film may be formed by co-extrusion of the polymers as described in any of the aforementioned references. The polymers of the various layers may be chosen to have similar rheological properties, e.g., melt viscosities, so that they can be co-extruded without significant flow disturbances. Extrusion conditions are chosen to adequately feed, melt, mix, and pump the respective polymers as feed streams or melt streams in a continuous and stable manner. Temperatures used to form and maintain each of the melt streams may be chosen to be within a range that avoids freezing, crystallization, or unduly high pressure drops at the low end of the temperature range, and that avoids material degradation at the high end of the range.

In brief summary, the fabrication method of a multilayer optical film may comprise: (a) providing at least a first and a second stream of resin corresponding to the first and second polymers to be used in the finished film; (b) dividing the first and the second streams into a plurality of layers using a suitable feedblock, such as one that comprises: (i) a gradient plate comprising first and second flow channels, where the first channel has a cross-sectional area that changes from a first position to a second position along the flow channel, (ii) a feeder tube plate having a first plurality of conduits in fluid communication with the first flow channel and a second plurality of conduits in fluid communication with the second flow channel, each conduit feeding its own respective slot die, each conduit having a first end and a second end, the first end of the conduits being in fluid communication with the flow channels, and the second end of the conduits being in fluid communication with the slot die, and (iii) optionally, an axial rod heater located proximal to said conduits; (c) passing the composite stream through an extrusion die to form a multilayer web in which each layer is generally parallel to the major surface of adjacent layers; and (d) casting the multilayer web onto a chill roll, sometimes referred to as a casting wheel or casting drum, to form a cast multilayer film. This cast film may have the same number of layers as the finished film, but the layers of the cast film are typically much thicker than those of the finished film. Furthermore, the layers of the cast film are typically all isotropic.

Many alternative methods of fabricating the cast multilayer web can also be used. One such alternative method that also utilizes polymer coextrusion is described in U.S. Pat. No. 5,389,324 (Lewis et al.).

After cooling, the multilayer web can be drawn or stretched to produce the near-finished multilayer optical film, details of which can be found in the references cited above. The drawing or stretching accomplishes two goals: it thins the layers to their desired final thicknesses, and it orients the layers such that at least some of the layers become birefringent. The orientation or stretching can be accomplished along the cross-web direction (e.g. via a tenter), along the down-web direction (e.g. via a length orienter), or any combination thereof, whether simultaneously or sequentially. If stretched along only one direction, the stretch can be "unconstrained" (wherein the film is allowed to dimensionally relax in the in-plane direction perpendicular to the stretch direction) or "constrained" (wherein the film is constrained and thus not allowed to dimensionally relax in the in-plane direction perpendicular to the stretch direction). If stretched along both in-plane directions, the stretch can be symmetric, i.e., equal along the orthogonal in-plane directions, or asymmetric. Alternatively, the film may be stretched in a batch process. In any case, subsequent or concurrent draw reduction, stress or strain equilibration, heat setting, and other processing operations can also be applied to the film.

Figure 3B:
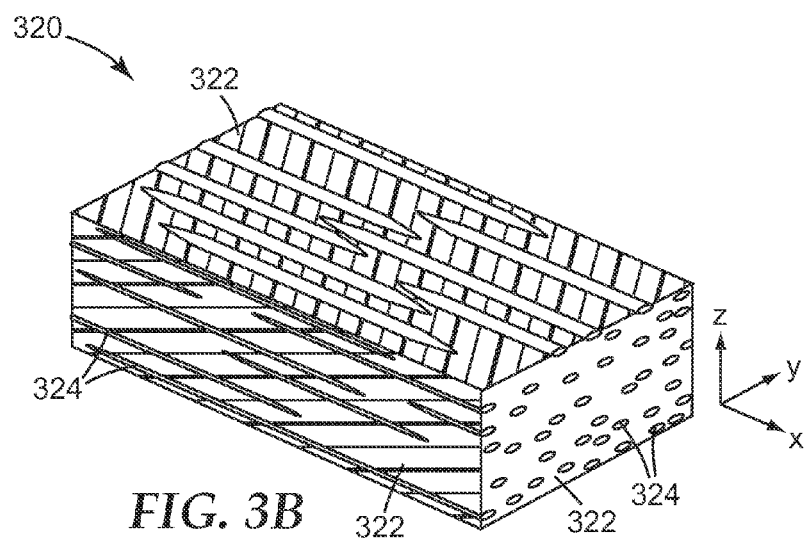
FIG. 3B is a schematic perspective view of a portion of a blended layer of a diffuse optical film.

Turning now to FIG. 3B, we see there a portion of a blended layer of a diffusely reflective optical film 320, which may be a STOF film, in schematic perspective view to reveal the interior structure or blend morphology of the layer/film. We refer to the film as a diffusely reflective optical film even in cases where the film may have a high transparency with little or no haze, i.e., where it has a window-like appearance, so long as such film was derived from, or can be processed into, a film that diffusely reflects or diffusely transmits light of a given incidence direction and polarization state in accordance with the selective heating techniques set forth herein. The film 320 is shown in relation to a local x-y-z Cartesian coordinate system, where the film extends parallel to the x- and y-axes, and the z-axis is perpendicular to the film and parallel to a thickness axis of the film. Note that the film 320 need not be entirely flat, but may be curved or otherwise shaped to deviate from a plane, and even in those cases arbitrarily small portions or regions of the film can be associated with a local Cartesian coordinate system as shown. The film 320 may in general be considered to represent the film 210 of FIG. 2 in any of its zones 212, 214, 216, since the film 210 may be or include a blended layer that extends continuously from each such zone to the next. As depicted, film 320 includes a first light-transmissive polymer or other material which is in the form of a continuous or matrix phase 322, and a second light-transmissive polymer or other material which is in the form of a discontinuous or disperse phase 324.

Many different materials may be used to fabricate the disclosed optical films, depending on the specific application to which the optical film is directed. Such materials may include inorganic materials such as silicon-based polymers, organic materials such as liquid crystals, and polymeric materials, including monomers, copolymers, grafted polymers, and mixtures or blends thereof. The exact choice of materials for a given application will be driven by the desired match and/or mismatch obtainable in the refractive indices of the different phases along a particular axis, as well as the desired physical properties in the resulting product. In cases where one of the materials is present in the blended layer in a continuous phase, such material will generally be characterized by being substantially transparent in the region of the spectrum desired, and such material desirably exhibits birefringence at least prior to the selective heat treatment discussed herein.

At least some of the diffusely reflective films disclosed herein, and/or the blended layers thereof, may be composed substantially entirely of polymeric materials, although in some cases non-polymeric materials may also be used. In some cases, only two different polymeric materials may be used, but in other cases more than two such polymeric materials may be used.

In general, the class of optical films formed with co-extrudable blends of thermoplastics is of particular interest. With these systems, films may be formed, oriented by one or more stretching processes, and wound into roll stock for later use. The stretching process thereby imparts the birefringence in at least one continuous phase. Thermoplastics provide distinct advantages over systems comprising thermosets that must be cured prior to winding into a roll. For example, thermoplastics may allow post-processing shaping, e.g. through thermoforming methods. The rolls may also be treated later for spatial patterning. Some suitable materials for use are discussed, for example in U.S. Pat. No. 5,882,774 (Ouderkirk et al.), U.S. Pat. No. 6,179,948 (Merrill et al.), U.S. Pat. No. 6,673,275 (Allen et al.), U.S. Pat. No. 7,057,816 (Allen et al.), as well as U.S. Patent Application Publications US 2004/0164434 (Tabar et al.) and US 2008/0020186 (Hebrink et al.). With regard to the continuous phase, the various polyesters and their co-polymers described in these references, including in particular polyethylene terephthalate (PET), polyethylene naphthalate (PEN), and copolymers of PEN and PET, are particularly useful, especially the so-called "coPENs." With regard to the at least one other phase, whether dispersed or co-continuous, the polystyrenes, polyacrylates, and polycarbonates described in these references are particularly useful.

A further consideration in the choice of materials is that the resulting product desirably contains at least two distinct phases in order to form the microscopic structures within the blended layer that can provide the desired scattering. This may be accomplished by casting the optical material from two or more materials which are immiscible with each other. Alternatively, if it is desired to make an optical material with a first and second material which are not immiscible with each other, and if the first material has a higher melting point than the second material, in some cases it may be possible to embed particles of appropriate dimensions of the first material within a molten matrix of the second material at a temperature below the melting point of the first material. The resulting mixture can then be cast into a film, with subsequent and/or simultaneous orientation, to produce an oriented optical film or body. In another variation, immiscible materials that react, e.g. by transesterfication, can be used to form the distinct phases, if the extrusion processing times are short enough and the temperatures low enough to maintain immiscible blocks. In still another variation, a third component, e.g. another polymer such as a block co-polymer, or a so-called "compatiblizer", can be added to help control the interfacial tension or other characteristics and thus also the size and shape distributions of the blended phases.

The materials selected for use in the disclosed films, and the degree of orientation of these materials, may in some cases be chosen so that the different materials in the blended layer of the finished film, whether in a heat-treated zone thereof or in a zone that has not been heat treated, have at least one axis for which the associated indices of refraction are substantially equal. The match of refractive indices associated with that axis, which typically, but not necessarily, is an axis transverse to the direction of orientation, results in substantially no reflection of light in that plane of polarization.

At least a first material (e.g. in the form of a disperse phase) may exhibit a decrease in the refractive index associated with the direction of orientation after stretching. If a second material (e.g. in the form of a continuous phase) is positive, a negative strain induced birefringence of the first material has the advantage of increasing the difference between indices of refraction of the adjoining phases associated with the orientation axis while the reflection of light with its plane of polarization perpendicular to the orientation direction may still be negligible. If a reflective polarizer is desired, differences between the indices of refraction of adjoining phases in the in-plane direction orthogonal to the orientation direction are desirably less than about 0.05, or 0.03, or 0.02, or 0.01 after orientation.

The material in the form of a disperse phase may also exhibit a positive strain-induced birefringence. However, this can be altered by means of heat treatment to match the refractive index of the axis perpendicular to the orientation direction of the other material (e.g. in the form of a continuous phase). The temperature of the heat treatment should not be so high as to relax the birefringence in the continuous phase.

The size of the structures or features in the disperse phase also can have a significant effect on scattering. If the disperse phase particles are too small (e.g., less than about 1/30 the wavelength of light in the medium of interest) and if there are many particles per cubic wavelength, the optical body may behave as a medium with an effective index of refraction somewhat between the indices of the two phases along any given axis. In such a case, very little light is scattered. If the particles are very large, the number of particles that can be accommodated per unit volume of the blended layer becomes low, and light may be specularly reflected from the surface of the particle, with very little diffusion or scattering into other directions. If such very large particles become disk-shaped or flattened along the x- and y-directions, iridescence effects (which may or may not be desirable) may occur. Practical limits may also be reached when particles become large in that the thickness of the optical body becomes greater and desirable mechanical properties are compromised.

The dimensions of the particles of the disperse phase after alignment can be tailored depending on the desired use of the optical material. Thus, for example, the dimensions of the particles may be tailored depending on the wavelength of electromagnetic radiation that is of interest in a particular application, with different dimensions required for reflecting or transmitting visible, ultraviolet, infrared, and microwave radiation. Generally, however, the length of the particles should be such that they are approximately greater than the wavelength of electromagnetic radiation of interest in the medium, divided by 30.

In applications where the optical body is to be used as a low loss reflective polarizer, the particles may have a length that is greater than about 2 times the wavelength of the electromagnetic radiation over the wavelength range of interest, and preferably over 4 times the wavelength. The average diameter of the particles may be equal to or less than the wavelength of the electromagnetic radiation over the wavelength range of interest, and preferably less than 0.5 of the desired wavelength. While the dimensions of the disperse phase are a secondary consideration in most applications, they become of greater importance in thin film applications, where there is comparatively little diffuse reflection.

While in many cases the refractive index mismatch may be the predominant factor relied upon to promote scattering (e.g., a diffuse mirror or polarizer film may have a substantial mismatch in the indices of refraction of the continuous and disperse phases along at least one in-plane axis), changes to the geometry of the particles of the disperse phase may also have an effect (e.g. a secondary effect) on scattering. Thus, the depolarization factors of the particles for the electric field in the index of refraction match and mismatch directions can reduce or enhance the amount of scattering in a given direction. For example, when the disperse phase is elliptical in a cross-section taken along a plane perpendicular to the axis of orientation (see e.g. disperse phase 324 in FIG. 3B), the elliptical cross-sectional shape of the disperse phase can contribute to asymmetric diffusion in both back-scattered light and forward-scattered light. The effect can either add to or detract from the amount of scattering caused by the refractive index mismatch, but typically has a relatively small influence on scattering.

The shape of the disperse phase particles can also influence the degree of diffusion of light scattered from the particles. This shape effect is typically small but increases as the aspect ratio of the geometrical cross-section of the particle in the plane perpendicular to the direction of incidence of the light increases and as the particles get relatively larger. It is often desirable for the disperse phase particles to be sized less than several wavelengths of light in one or two mutually orthogonal dimensions if diffuse, rather than specular, reflection is desired.

For a low loss reflective polarizer, the film may consist of a disperse phase disposed within the continuous phase as a series of rod-like structures which, as a consequence of orientation, have a high aspect ratio which can enhance reflection for polarizations parallel to the orientation direction by increasing the scattering strength and dispersion for that polarization relative to polarizations perpendicular to the orientation direction. However, the particles or structures of the disperse phase may be provided with many different geometries. Thus, the disperse phase may be disk-shaped or elongated disk-shaped, or rod-shaped, or spherical. The disperse phase particle may be a disk as a result of the film being significantly oriented or stretched in both the x- and y-directions, but the disk may be elongated along the y-direction due to a greater degree of orientation in that direction. Alternatively, the disk may be substantially symmetrical due to approximately equal degrees of orientation in the x- and y-directions. Alternatively, the disk may be elongated along the x-direction due to a greater degree of orientation in that direction. Other embodiments are contemplated wherein the disperse phase has cross sections which are approximately elliptical (including circular), polygonal, irregular, or a combination of one or more of these shapes. The cross-sectional shape and size of the particles of the disperse phase may also vary from one particle to another, or from one region of the film to another (i.e., as a function of depth from the surface to the core).

Besides a continuous/disperse phase combination, the different polymers that make up the blended layer of the diffusely reflective film may alternatively be arranged in a co-continuous phase relationship. Further details of co-continuous phase constructions can be found e.g. in U.S. Pat. No. 7,057,816 (Allen et al.). A co-continuous phase construction may be provided in which the two phases are fibrillar and form an interpenetrating polymer network (IPN). The fibers may be randomly oriented, or oriented along a given axis. Other co-continuous systems may comprise an open-celled matrix of a first material (first phase), with a second material disposed in a co-continuous manner (second phase) within the cells of the matrix.

The different materials used in the different phases of the diffusely reflective optical films have different refractive indices along a particular direction or axis, whether in a heat-treated zone thereof or in a zone that has not been heat treated, so that some light polarized along such direction or axis is reflected at interfaces between the adjacent phases, and collectively scattered. We may refer to the refractive indices of a first material in the blended layer (e.g., in FIG. 3B, the first light-transmissive polymer in the form of continuous phase 322) for light polarized along principal x-, y-, and z-axes as n1x, n1y, and n1z, respectively. The x-, y-, and z-axes may, for example, correspond to the principal directions of the dielectric tensor of the material. Typically, and for discussion purposes, the principal directions of the different materials in the blended layer are coincident, but this need not be the case in general. We refer to the refractive indices of a second material (adjacent the first material) in the blended layer (e.g., in FIG. 3B, the second light-transmissive polymer or other material which is in the form of a discontinuous or disperse phase 324) along the same axes as n2$x$, n2$y$, n2$z$, respectively. We refer then to differences in refractive index between these materials or phases as $\Delta$n$x$ (=n1$x$−n2$x$) along the x-direction, $\Delta$n$y$ (=n1$y$−n2$y$) along the y-direction, and $\Delta$n$z$ (=n1$z$−n2$z$) along the z-direction. The nature of these refractive index differences, in combination with the thickness, composition (e.g. volume fraction of the first and second materials in the blended layer), and blend morphology (e.g., the size, shape, and distribution of structures of the first polymer and structures of the second polymer in the blended layer) of the blended layer, controls the reflective and transmissive characteristics of the such layer, in a given zone. For example, if adjacent phases have a large refractive index mismatch along one in-plane direction ($\Delta$n$x$ large) and a small refractive index mismatch along the orthogonal in-plane direction ($\Delta$n$y$$z$≈0), the film or blended layer may behave as a diffusely reflective polarizer for normally incident light. In this regard, a diffusely reflective polarizer may be considered for purposes of this application to be an optical body that strongly diffusely reflects normally incident light that is polarized along one in-plane axis (referred to as the "block axis"), and strongly transmits such light that is polarized along an orthogonal in-plane axis (referred to as the "pass axis"). "Strongly reflects" and "strongly transmits" may have different meanings depending on the intended application or field of use, but in many cases a diffusely reflective polarizer will have at least 70, 85, 90, or 95% reflectivity for the block axis, and at least 70, 80, or 85% transmission for the pass axis. These reflectivity and transmission values are assumed to include the effects of Fresnel reflection at the outer surfaces (air/polymer interfaces) of the film.

In another example, adjacent phases may have a large refractive index mismatch along both in-plane axes ($\Delta$n$x$ large and $\Delta$n$y$ large), in which case the film or blended layer may behave as an on-axis diffuse mirror. In this regard, a diffuse mirror or mirror-like film may be considered for purposes of this application to be an optical body that strongly diffusely reflects normally incident light of any polarization. Again, "strongly diffusely reflecting" may have different meanings depending on the intended application or field of use, but in many cases a diffuse mirror will have at least 70, 80, or 90% reflectivity for normally incident light of any polarization at the wavelength of interest.

In variations of the foregoing embodiments, the adjacent phases may exhibit a refractive index match or mismatch along the z-axis ($\Delta$n$z$≈0 or $\Delta$n$z$ large), and the mismatch may be of the same or opposite polarity or sign as the in-plane refractive index mismatch(es). Such tailoring of $\Delta$n$z$ plays a key role in whether the reflectivity of the p-polarized component of obliquely incident light increases, decreases, or remains the same with increasing incidence angle. In yet another example, adjacent phases may have a substantial refractive index match along both in-plane axes ($\Delta$n$x$$z$≈$\Delta$n$y$$z$≈0) but a refractive index mismatch along the z-axis ($\Delta$n$z$ large), in which case the film or layer may behave as a so-called "p-polarizer", strongly transmitting normally incident light of any polarization, but increasingly reflecting p-polarized light of increasing incidence angle.

There are a large number of permutations of possible refractive index differences between adjacent phases along the different axes, possible thicknesses of the blended layer, possible compositions of the blended layer, and possible blend morphologies of the blended layer. Hence, the variety of possible diffusely reflective films and blended layers thereof is vast. Exemplary diffusely reflective optical films that comprise at least one blended layer are disclosed in U.S. Pat. No. 5,825,543 (Ouderkirk et al.), U.S. Pat. No. 6,179,948 (Merrill et al.), and U.S. Pat. No. 7,057,816 (Allen et al.).

At least one of the materials that form one of the phases in the blended layer of the optical film is birefringent in at least one zone of the film (e.g., zones 212, 214, 216 of FIG. 2). Thus, a first phase in the blended layer may be birefringent (i.e., n1$x$≠n1$y$, or n1$x$≠n1$z$, or n1$y$≠n1$z$), or a second phase in the blended layer may be birefringent (i.e., n2$x$≠n2$y$, or n2$x$≠n2$z$, or n2$y$≠n2$z$), or both the first and second phases may be birefringent. Moreover, the birefringence of one or more such phases is diminished in at least one zone relative to a neighboring zone. In some cases, the birefringence of these phase(s) may be diminished to zero, such that it or they are optically isotropic (i.e., n1$x$=n1$y$=n1$z$, or n2$x$=n2$y$=n2$z$) in one of the zones but birefringent in a neighboring zone. In cases where both phases are initially birefringent, depending on materials selection and processing conditions, they can be processed in such a way that the birefringence of only one of the phases is substantially diminished, or the birefringence of both phases may be diminished.

Exemplary diffusely reflective optical films are composed of thermoplastic polymer materials and may be fabricated by co-extrusion, film casting, and orienting processes. Reference is made to U.S. Pat. No. 6,179,949 (Merrill et al.) "Optical Film and Process for Manufacture Thereof". The optical film may be formed by co-extrusion of the polymers as described in any of the aforementioned references. For example, the polymers may be dried prior to processing to reduce degradation, fed simultaneously, in measured proportions, into an extruder (of either single screw or twin screw configuration with or without applied vacuum) through a melt train with appropriate filters as desired, spread in a die manifold and exited through a die orifice onto a quench wheel or into a quenching nip roll system. The polymers of the various layers may be chosen to have rheological properties, e.g., melt viscosities, so that the scale of the phases is adequately through the action of the flow. For example, increasing the ratio of a continuous phase viscosity to a dispersed phase viscosity can increase the elongation and break-up of the dispersed phase into smaller droplets. An additional compatibilizer or stabilizing component may be added to reduce the interfacial tensions between the respect phases, thereby reducing the surface tension driven tendency of the droplets to snap back into more spherical shapes or to re-aggregate or flocculate back into larger particles. Extrusion conditions, including temperature, screw speeds, gear pump rates, etc., are chosen to adequately feed, melt, mix, and pump the polymers in a continuous and stable manner. Temperatures used to form and maintain the melt stream may be chosen to be within a range that avoids freezing, crystallization, or unduly high pressure drops at the low end of the temperature range, and that avoids material degradation at the high end of the range. High shear rates may be found particularly advantageous in processing in order to create fine-scale phase structures. In many cases, an increasing gradient in the scale of the phase structure may be found through the thickness of the blend layer due to the decreasing shear field from the melt stream, e.g. die, walls to the flow stream center. Extensional flows can influence the phase sizes and shapes (blend morphology).

In many instances, a co-extrusion of multiple layers is desirable. For example, optically transparent, interior facilitation layers (e.g. a core layer, or set of layers) or outer skin layers, may be used, e.g. as described in U.S. Pat. No. 6,179,948 (Merrill et al.). Blend layers may also comprise layers of a multilayer construction, e.g. formed using processing methods described in U.S. Pat. No. 6,830,713 (Hebrink et al.). In some instances, the various alternating layers may comprise similar blend materials. In other instances, facilitation and blend layers may alternate.

The film may then be formed, e.g. casting from a drop die onto a quenching wheel, e.g with electro-static pinning or between quenched nip rolls, etc. to form the film, or the film can be formed onto a belt with a slot die and quenched. As described in U.S. Patent Application Publication US 2008/0020186 (Hebrink et al.), the film may be partially oriented, e.g. by calendering, in the process of film forming. In some cases, a rolling bank configuration may be used with a calendering process to further affect the phase sizes and shapes. In general, the rate of quenching and the nature of the heat transfer from the outer film surfaces can impact the resulting blend morphology of the formed film.

After cooling, the web can be drawn or stretched to produce the near finished optical film, details of which can be found in the references cited above. The drawing or stretching accomplishes two goals: it further orients and elongates the phases of the blend, and it orients and imparts birefringence to at least one phase in at least one blended layer. Typically, at least one continuous phase acquires birefringence in this manner, although birefringence can also be imparted, in some cases, during the film forming step as previously described. The orientation or stretching can be accomplished along the crossweb direction (e.g. via a tenter), along the down-web direction (e.g. via a length orienter), or any combination thereof, whether simultaneously or sequentially. If stretched along only one direction, the stretch can be "unconstrained" (wherein the film is allowed to dimensionally relax in the in-plane direction perpendicular to the stretch direction) or "constrained" (wherein the film is constrained and thus not allowed to dimensionally relax in the in-plane direction perpendicular to the stretch direction). If stretched along both in-plane directions, the stretch can be symmetric, i.e., equal along the orthogonal in-plane directions, or asymmetric. The various stretching steps may also affect the phases differently, e.g. as further described in U.S. Pat. No. 6,179,948 (Merrill et al.). Alternatively, the film may be stretched in a batch process. In any case, subsequent or concurrent draw reduction, stress or strain equilibration, heat setting, and other processing operations can also be applied to the film.

The multilayer optical films, diffusely reflective films, and other disclosed films and film bodies can also include additional layers and coatings selected for their optical, mechanical, and/or chemical properties. For example, a UV absorbing layer can be added at one or both major outer surfaces of the film to protect the film from long-term degradation caused by UV light. Additional layers and coatings can also include scratch resistant layers, tear resistant layers, and stiffening agents. See, e.g., U.S. Pat. No. 6,368,699 (Gilbert et al.).

In some cases, the natural or inherent absorptivity of one, some, or all of the constituent polymer materials that make up the STOF film may be utilized for the absorptive heating procedure. For example, many polymers that are low loss over the visible region have substantially higher absorptivity at certain ultraviolet wavelengths.

Exposing portions of the film to light of such wavelengths may be used to selectively heat such portions of the film.

In other cases, absorbing dyes, pigments, or other agents can be incorporated into some or all of the individual layers or materials of the STOF film to promote absorptive heating as mentioned above. In some cases, such absorbing agents are spectrally selective, whereby they absorb in one wavelength region but not in another. For example, some of the disclosed films may be intended for use in the visible region, such as with anti-counterfeiting security labels or as a component of a liquid crystal display (LCD) device or other display device, in which case an absorbing agent that absorbs at infrared or ultraviolet wavelengths but not substantially at visible wavelengths may be used. Further, an absorbing agent may be incorporated into one or more selected layers or materials of a film. For example, the film may comprise two distinct microlayer packets separated by an optically thick layer such as a protective boundary layer (PBL), a laminating adhesive layer, one or more skin layers, or the like, and an absorbing agent may be incorporated into one of the packets and not the other, or may be incorporated into both packets but at a higher concentration in one relative to the other.

A variety of absorbing agents can be used. For optical films operating in the visible spectrum, dyes, pigments, or other additives that absorb in the ultraviolet and infrared (including near infrared) regions may be used. In some cases it may be advantageous to select an agent that absorbs in a spectral range for which the polymer materials of the film have a substantially lower absorption. By incorporating such an absorbing agent into selected layers of a multilayer optical film, directed radiation can preferentially deliver heat to the selected layers rather than throughout the entire thickness of the film. Exemplary absorbing agents may be melt extrudable so that they can be embedded into a selected layer set of interest. To this end, the absorbers are preferably reasonably stable at the processing temperatures and residence times required for extrusion. For further information on suitable absorbing agents, reference is made to U.S. Pat. No. 6,207,260 (Wheatley et al.) "Multicomponent Optical Body".

FIG. 2 is a perspective view of a roll of reflective STOF film 210 that has been internally patterned or spatially tailored using spatially selective birefringence reduction of at least some of the internal layers or materials (not shown in FIG. 2) to provide different reflective characteristics in different portions or zones of the film so as to form indicia. The internal patterning defines distinct zones 212, 214, 216 that are shaped so as to form the indicia "3M" as shown. The film 210 is shown as a long flexible material wound into a roll because the methodology described herein is advantageously compatible with high volume roll-to-roll processes. However, the methodology is not limited to flexible roll goods and can be practiced on small piece parts or samples as well as non-flexible films and articles.

Figure 4:
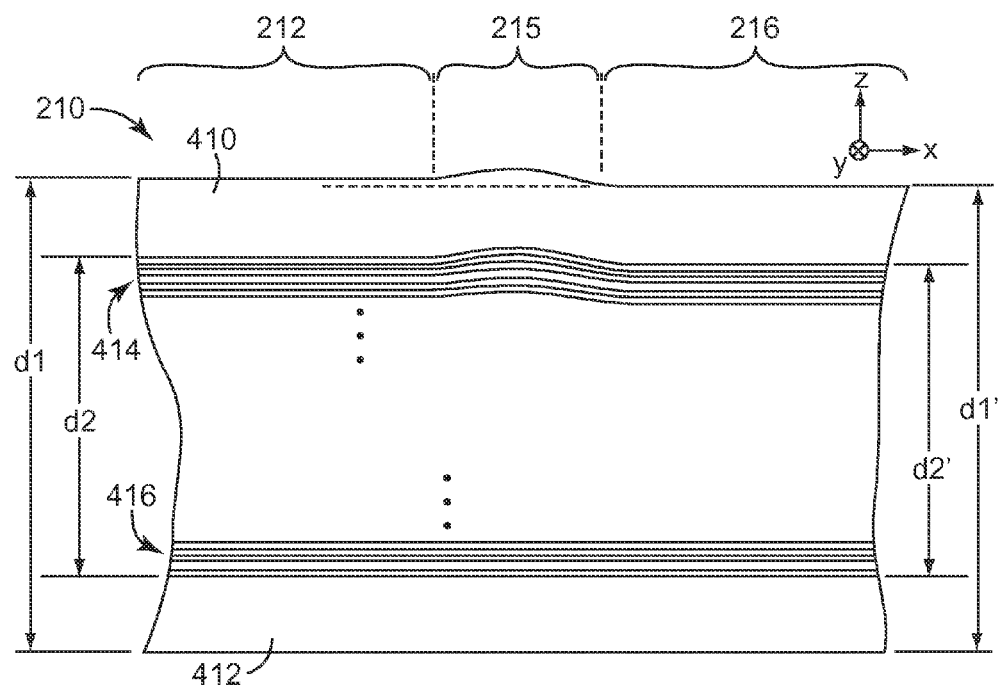
FIG. 4 is a schematic sectional view of a portion of the reflective STOF film of FIG. 1.

We turn now to FIG. 4, which shows a schematic sectional view of a portion of the STOF film 210 of FIG. 2 in the vicinity of area 218 at a boundary of zone 212 and zone 216. In this expanded view of the film 210, a narrow transition zone 215 can be seen separating the zone 212 from the neighboring zone 216. Such a transition zone may or may not be present depending on processing details, and if it is not present then zone 216 may be immediately adjacent to zone 212 with no significant intervening features. Construction details of film 210 can also be seen: the film includes optically thick skin layers 410, 412 on opposite sides thereof, with a plurality of microlayers 414 and another plurality of microlayers 416 disposed between the skin layers 410, 412. All of the microlayers 414, 416 are interior to the film 210 by virtue of the outer skin layers. The space between microlayers 414 and 416 is left open in the drawing, to allow for the case where the microlayers 414, 416 are portions of a single microlayer packet that begins at one skin layer 410 and ends at the opposite skin layer 412, and also the case where the microlayers 414, 416 are portions of two or more distinct microlayer packets that are separated from each other by one or more optically thick protective boundary layers (PBLs) or other optically thick interior layer(s). In either case, the microlayers 414, 416 preferably each comprise two alternating polymer materials arranged into optical repeat units, each of the microlayers 414, 416 extending continuously in a lateral or transverse fashion from the zone 212 to the neighboring zone 216 as shown. The microlayers 414, 416 provide a first reflective characteristic in the zone 212 by constructive or destructive interference, and at least some of the microlayers 414, 416 are birefringent. The zones 215, 216 may have previously had the same characteristics as zone 212, but have been processed by the selective application of heat thereto in an amount sufficient to reduce or eliminate the birefringence of some of the microlayers 414, 416 in the zone 216 while maintaining the birefringence of the microlayers in zone 212, the heat also being low enough to maintain the structural integrity of the microlayers 414, 416 in the treated zone 216. The reduced birefringence of the microlayers 414, 416 in the zone 216 is primarily responsible for a second reflective characteristic for the zone 216 that is different from the first reflective characteristic for the zone 212.

The film 210 has characteristic thicknesses d1, d2 in zone 212, and characteristic thicknesses d1 ', d2' in zone 216, as shown in the figure. The thicknesses d1, d1' are physical thicknesses measured from a front outer surface of the film to a rear outer surface of the film in the respective zones. The thicknesses d2, d2' are physical thicknesses measured from the microlayer (at one end of a microlayer packet) that is disposed nearest the front surface of the film to the microlayer (at an end of the same or a different microlayer packet) that is disposed nearest the rear surface of the film. Thus, if one wishes to compare the thickness of the film 210 in zone 212 with the thickness of the film in zone 216, one may choose to compare d1 to d1', or d2 to d2', depending on which measurement is more convenient. In most cases the comparison between d1 and d1' may well yield substantially the same result (proportionally) as the comparison between d2 and d2'. (Of course, in cases where the film contains no outer skin layers, and where microlayer packets terminate at both outer surfaces of the film, d1 and d2 become the same.) However, where a significant discrepancy exists, such as where a skin layer experiences a significant thickness change from one place to another but no corresponding thickness change exists in the underlying microlayers, or vice versa, then it may be desirable to use the d2 and d2' parameters as being more representative of the overall film thickness in the different zones, in view of the fact that the skin layers typically have a minor effect on the reflective characteristics of the film compared to the microlayer packet(s).

Of course, for STOF films containing two or more distinct microlayer packets separated from each other by optically thick layers, the thickness of any given microlayer packet can also be measured and characterized as the distance along the z-axis from the first to the last microlayer in the packet. This information may become significant in a more in-depth analysis that compares the physical characteristics of the film 210 in the different zones 212, 216.

As mentioned, the zone 216 has been treated with the selective application of heat to cause at least some of the microlayers 414, 416 to lose some or all of their birefringence relative to their birefringence in neighboring zone 212, such that zone 216 exhibits a reflective characteristic, resulting from constructive or destructive interference of light from the microlayers, that differs from a reflective characteristic of zone 212. The selective heating process may involve no selective application of pressure to zone 216, and it may result in substantially no thickness change (whether using the parameters d1/d1' or the parameters d2/d2') to the film. For example, the film 210 may exhibit an average thickness in zone 216 that deviates from an average thickness in zone 212 by no more than the normal variability in thickness that one observes in the zone 212, or in the untreated film. Thus, the film 210 may exhibit in zone 212, or over an area of the film encompassing a portion of zone 212 and zone 216 before the heat treatment of zone 216, a variability in thickness (whether d1 or d2) of Δd, and the zone 216 may have spatially averaged thicknesses d1', d2' which differ from spatially averaged thicknesses d1, d2 (respectively) in zone 212 by no more than Δd. The parameter Δd may represent, for example, one, two, or three standard deviations in the spatial distribution of the thickness d1 or d2.

In some cases, the heat treatment of zone 216 may give rise to certain changes to the thickness of the film in zone 216. These thickness changes may result from, for example, local shrinkage and/or expansion of the different materials that constitute the STOF film, or may result from some other thermally-induced phenomenon. However, such thickness changes, if they occur, play only a secondary role in their effect on the reflective characteristic of the treated zone 216 compared to the primary role played by the reduction or elimination of birefringence in the treated zone. Note also that in many cases it may be desirable to hold the film by its edges under tension during the selective heat treatment that accomplishes the internal patterning, in order to avoid wrinkling of the film, or for other reasons. The amount of tension applied and details of the heat treatment may also result in some amount of thickness change in the treated zones.

In some cases it is possible to distinguish the effect of a thickness change from a change in birefringence by analyzing the reflective properties of the film. For example, if the microlayers in an untreated zone (e.g. zone 212) provide a reflection band characterized by a left band edge (LBE), right band edge (RBE), center wavelength $\lambda_c$, and peak reflectivity $R_1$, a given thickness change for those microlayers (with no change in the refractive indices of the microlayers) will produce a reflection band for the treated zone having a peak reflectivity $R_2$ about the same as $R_2$, but having an LBE, RBE, and center wavelength that are proportionally shifted in wavelength relative to those features of the reflection band of the untreated zone, and this shift can be measured. On the other hand, a change in birefringence will typically produce only a very minor shift in wavelength of the LBE, RBE, and center wavelengths, as a result of the (usually very small) change in optical thickness caused by the change in birefringence. (Recall that optical thickness equals physical thickness multiplied by refractive index.) The change in birefringence can, however, have a large or at least a significant effect on the peak reflectivity of the reflection band, depending on the design of the microlayer stack. Thus, in some cases, the change in birefringence may provide a peak reflectivity $R_2$ for the reflection band in the modified zone that differs substantially from $R_1$, where of course $R_1$ and $R_2$ are compared under the same illumination and observation conditions. If $R_1$ and $R_2$ are expressed in percentages, $R_2$ may differ from $R_1$ by at least 10%, or by at least 20%, or by at least 30%. As a clarifying example, $R_1$ may be 70%, and $R_2$ may be 60%, 50%, 40%, or less. Alternatively, $R_1$ may be 10%, and $R_2$ may be 20%, 30%, 40%, or more. $R_1$ and $R_2$ may also be compared by taking their ratio. For example, $R_2/R_1$ or its reciprocal may be at least 2, or at least 3.

A significant change in peak reflectivity, to the extent it is indicative of a change in the interfacial reflectivity (sometimes referred to as optical power) resulting from a change in refractive index difference between adjacent layers due to a change in birefringence, is also typically accompanied by at least some change in the bandwidth of the reflection band, where the bandwidth refers to the separation between the LBE and RBE.

As we have discussed, in some cases the thickness of the film 210 in the treated zone 216, i.e., d1' or d2', may differ somewhat from the thickness of the film in the untreated zone 212, even if no selective pressure was in fact applied to the zone 216 during heat treatment. For this reason, FIG. 4 depicts d1' as being slightly different from d1, and d2' as being slightly different from d2. A transition zone 215 is also shown for generality, to show that a "bump" or other detectable artifact may exist on the outer surface of the film as a consequence of the selective heat treatment. In some cases, however, the treatment may result in no detectable artifact between the neighboring treated and untreated zones. For example, in some cases an observer who slides his or her finger across the boundary between the zones may detect no bump, ridge, or other physical artifact between the zones.

Under some circumstances it is possible for thickness differences between treated and untreated zones to be non-proportional through the thickness of the film. For example, in some cases it is possible for an outer skin layer to have a relatively small thickness difference, expressed as a percentage change, between the treated and untreated zones, while one or more internal microlayer packets may have a larger thickness difference, also expressed as a percentage change, between the same zones.

Although FIG. 4 shows the film 210 as comprising one or two microlayer packets, in an alternative embodiment, these packets may be replaced with one or two blended layers that provide diffusely reflective characteristics. Each blended layer may include at least two polymer materials that form two distinct phases, such as a continuous phase and a dispersed phase, or two co-continuous phases. At least one of the polymer materials in a given blended layer may be birefringent in the untreated zone 212 and is less birefringent (including e.g. isotropic) in the treated zone 216.

Figure 5:
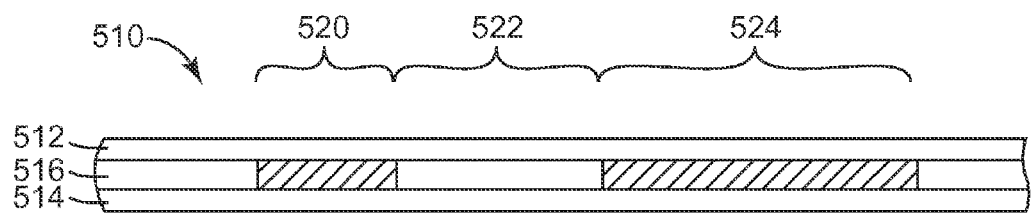
FIG. 5 is a schematic sectional view of a portion of a reflective STOF film with internal patterning.

FIG. 5 shows a schematic sectional view of a portion of another STOF film 510 that incorporates internal patterning. Film 510 comprises outer optically thick skin layers 512, 514, and a packet of microlayers that reside in a stratum or layer 516 sandwiched between the skin layers. All of the microlayers are internal to the film 510. (In alternative embodiments, one or both skin layers may be omitted, in which case one or both PBLs or outermost microlayers in the packet may become external layers.) The microlayers include at least some microlayers that are birefringent in at least some zones or areas of the film and that extend in a lateral or transverse fashion at least between neighboring zones of the film. The microlayers provide a first reflective characteristic associated with constructive or destructive interference of light at least in a first untreated zone 522 of the film. The film 510 has been selectively heated in the neighboring zones 520, 524, without applying any pressure selectively to these zones, so as to provide a second reflective characteristic also associated with constructive or destructive interference of light, but that differs from the first reflective characteristic. These differences in reflective characteristics may be manifested to an observer as differences in color between the treated and untreated zones in reflected or transmitted light. The respective colors and the differences therebetween also typically change or shift with angle of incidence. The film 510 may have substantially the same film thickness in the zones 520, 522, 524, or the film thickness may vary somewhat between these zones, but any difference in film thickness between the zones is not primarily responsible for the differences between the first and second reflective characteristics. The zones 520, 522, 524 form a pattern that is internal or interior to the film, as indicated by the crosshatching in the stratum or layer 516. The crosshatching indicates that at least some of the microlayers in the crosshatched region have a reduced birefringence (including zero birefringence) compared to their birefringence in the zone 522 or in other untreated zones.

In an alternative embodiment, the packet of microlayers in layer 516 may be replaced with a blended layer that includes at least two polymer materials that form two distinct phases, such as a continuous phase and a dispersed phase, or two co-continuous phases. At least one of the polymer materials in the blended layer may be birefringent in the untreated zone 522 and is less birefringent (including e.g. isotropic) in the treated zones 520, 524, so that a first diffusely reflective characteristic is provided in the untreated zone, and a different second diffusely reflective characteristic is provided in the treated zones.

In still other embodiments, internal patterning can be accomplished independently in two or more layers or levels within the STOF film. At least one blocking layer may also be provided between any two adjacent patternable layers. The blocking layer may block a sufficient amount of light at a write wavelength such that a first radiant beam comprising the write wavelength can be directed at a first zone of the STOF film to change a first reflective characteristic of one layer (e.g. a packet of microlayers or a blended layer with suitable absorptive characteristics) to a different second reflective characteristic, while not changing a third reflective characteristic of a second layer (e.g. another packet of microlayers or another blended layer with suitable absorptive characteristics) in the first zone. The blocking layer may also block a sufficient amount of light at the write wavelength such that a second radiant beam comprising the write wavelength can be directed at a second zone of the film to change the third reflective characteristic of the second layer to a fourth reflective characteristic, while not changing the first reflective characteristic of the first layer to the second reflective characteristic in the second zone. The blocking layer may achieve this functionality primarily by absorbing light at the write wavelength, by reflecting light at the write wavelength, or by a combination of absorbing and reflecting. Depending upon the design of the blocking layer and threshold characteristics of the respective first and second patternable layers, the first and second radiant beams may be incident on the same side or major surface of the STOF film, or they may be incident on opposite sides. In some designs, the first and second radiant beams may also have different angles of incidence with respect to the film. For example, the first beam may be delivered at substantially normal incidence, and the second beam may be delivered at a large oblique angle relative to the film. Further information regarding bi-level STOF films can be found in PCT Publication WO 2010/075373 (Merrill et al.), "Multilayer Optical Films Suitable for Bi-Level Internal Patterning", and U.S. Application Ser. No. 61/360,127, "Retarder Film Combinations With Spatially Selective Birefringence Reduction", filed Jun. 30, 2010.

FIGS. 5A-D help to explain the process of patterning a multilayer optical film that is a STOF film. They also help explain some of the different possible combinations of first and second reflective characteristics in the untreated and treated zones, respectively, for any given writeable packet of microlayers. For descriptive purposes, the reflective characteristic of a reflective film, whether in a treated or untreated zone, may be categorized into one of the following three types: mirror-like reflective characteristics, window-like reflective characteristics, and polarizer-like reflective characteristics. A mirror-like reflective characteristic exhibits high reflectivity (e.g., in some cases greater than 50%, 60%, 70%, 80%, 90%, 95%, or 99%) for all polarization states of normally incident light, a window-like reflective characteristic exhibits low reflectivity (e.g., in some cases less than 20%, 10%, 5%, 3%, or 1%) for all polarization states of normally incident light, and a polarizer-like reflective characteristic exhibits high reflectivity (e.g., in some cases greater than 50%, 60%, 70%, 80%, 90%, 95%, or 99%) for normally incident light of one polarization state and low reflectivity (e.g., in some cases less than 30%, 20%, 10%, 5%, 3%, or 1%) for normally incident light of a different polarization state. (The reflective polarizer-like characteristic may alternatively be expressed in terms of the difference in reflectivity of one polarization state relative to the other polarization state.) The reflectivity values discussed herein that are associated with multilayer optical films or stacks may or may not include the Fresnel reflections at the outer air/polymer interfaces. For example, in some cases of high reflectivity these values may include the surface contributions, but in some cases of low reflectivity, these may exclude the surface reflections. Reflectivity that includes the outer air/polymer surface contributions can be measured in a conventional manner using the bare film immersed in air, while reflectivity that does not include the air/polymer surface contributions can be measured by use of an index matching fluid with cover layers of known reflectivity, and subtracting the known reflectivity from the measurement.

The boundaries or limits of these different characteristics—e.g., what is considered to be "high" reflectivity and what is considered to be "low" reflectivity—and the distinctions therebetween may depend on the end-use application and/or on system requirements. For example, a multilayer optical film, or a microlayer packet thereof, that exhibits moderate levels of reflectivity for all polarization states may be considered to be a mirror for purposes of some applications and a window for purposes of other applications.

Similarly, a multilayer optical film, or a microlayer packet thereof, that provides moderately different levels of reflectivity for different polarization states of normally incident light may be considered to be a polarizer for some applications, a mirror for other applications, and a window for still other applications, depending on the exact reflectivity values and on the sensitivity of a given end-use application to differences in reflectivity for different polarization states. Unless otherwise indicated, the mirror, window, and polarizer categories are specified for normally incident light. The reader will understand that oblique-angle characteristics may in some cases be the same as or similar to, and in other cases may be drastically different from, the characteristics of an optical film at normal incidence.

In each of the graphs of FIGS. 5A-D, relative refractive index "n" is plotted on the vertical axis. On the horizontal axis, a position or mark is provided for each of the six refractive indices that characterize a two-layer optical repeat unit of a patternable multilayer optical film: "$1x$", "$1y$", and "$1z$" represent the refractive indices of the first layer along the x-, y-, and z-axes, which were referred to above as $n1x$, $n1y$, and $n1z$. Likewise, "$2x$", "$2y$", and "$2z$" represent the refractive indices of the second layer along the x-, y-, and z-axes, which were referred to above as $n2x$, $n2y$, and $n2z$. Diamond-shaped symbols (♦) in the figures represent refractive indices of the materials in a first processing stage. This first stage may correspond to polymer layers that have been extruded and quenched or cast onto a casting wheel, for example, but that have not yet been stretched or otherwise oriented. Open (unfilled) circle-shaped symbols (○) in the figures represent refractive indices of materials in a second stage of processing, later than the first stage. The second stage may correspond to polymer layers that have been stretched or otherwise oriented into a multilayer optical film that reflects light by constructive or destructive interference from interfaces between microlayers within the film. Small filled circle-shaped symbols or dots (•) in the figures represent refractive indices of the materials in a third stage of processing, later than the first and second stages. The third stage may correspond to polymer layers that, after being extruded and oriented, have been selectively heat treated, as discussed elsewhere herein. Such heat treatment is typically limited to one or more particular portions or zones of a film, referred to as treated zones.

By comparing the vertical coordinates of the various symbols in a given figure, the reader can readily ascertain a great deal of information about the multilayer optical film, its method of manufacture, and the optical properties of its treated and untreated portions. For example, the reader can ascertain: if one or both material layers are or were birefringent before or after the selective heat treatment, and whether the birefringence is uniaxial or biaxial, and whether the birefringence is large or small. The reader can also ascertain from FIGS. 5A-D relative magnitudes of each of the refractive index differences Δnx, Δny, Δnz between the two layers, for each of the three processing stages (cast state, stretched state, and treated state).

As discussed above, a precursor article to a finished, internally patterned multilayer optical film can be a cast web of polymer material. The cast web may have the same number of layers as the finished film, and the layers may be composed of the same polymer materials as those used in the finished film, but the cast web is thicker and its layers are usually all isotropic. In some cases, however, not depicted in the figures, the casting process may itself impart a level of orientation and birefringence in one or more of the materials. The diamond-shaped symbols in FIGS. 5A-D represent the refractive indices of the two polymer layers in the cast web that, after a subsequent stretching procedure, become the microlayers in the optical repeat units of the multilayer optical film. After stretching, at least some of the layers become oriented and birefringent, and an oriented (but still unpatterned) multilayer optical film is formed. This is exemplified in FIGS. 5A-D by open circles that may be vertically displaced from their respective original values represented by the diamond-shaped symbols. For example, in FIG. 5A, the stretching procedure raises the refractive index of the second layer along the x-axis, but lowers its refractive index along the y- and z-axis. Such a refractive index shift may be obtained by suitably uniaxially stretching a positively birefringent polymer layer along the x-axis while allowing the film to dimensionally relax along the y- and z-axes. In FIG. 5B, the stretching procedure raises the refractive index of the first layer along the x- and y-axes, but lowers its refractive index along the z-axis. Such a refractive index shift may be obtained by suitably biaxially stretching a positively birefringent polymer layer along the x- and y-axes. In FIG. 5C, the stretching procedure raises the refractive index of both the first and second layers along the x-axis, lowers their respective refractive index along the z-axis, and maintains about the same refractive index along the y-axis. In some cases, this refractive index shift may be obtained by biaxially stretching a positively birefringent polymer layer asymmetrically along the x- and y-axes, using a higher degree of stretch along the x-axis compared to the y-axis. In other cases, this may be approximately obtained by uniaxially stretching along an x-axis while constraining the film in the y-axis (constrained uniaxial stretching). Note that in FIGS. 5A and 5B, one of the layers in the oriented but untreated state (open circles) is birefringent because at least two of the open circles (for n2x, n2y, and n2z in FIG. 5A, and for n1x, n1y, and n1z in FIG. 5B) have different values of refractive index n. In these depicted embodiments, the other polymer layer remains isotropic after stretching as indicated by the same refractive index values (n1x=n1y=n1z in FIG. 5A, and n2x=n2y=n2z in FIG. 5B) for the cast state and for the oriented but untreated state.

After formation of the at least partially birefringent multilayer optical film having the microlayers arranged into optical repeat units to provide the first reflective characteristic, the film is ready for the selective heating discussed above. The heating is carried out selectively in a second zone which neighbors a first zone of the multilayer optical film, and is tailored to selectively melt and disorient in part or in whole at least one birefringent material in the microlayer packet in order to reduce or eliminate the birefringence in at least some of the microlayers while leaving their birefringence unchanged in the first (untreated) zone. The selective heating is also carried out to maintain the structural integrity of the layers in the second zone. If the birefringent material in the treated second zone is disoriented in whole, i.e., completely, then the birefringent microlayers return to the isotropic state (e.g. of the cast web), while remaining optically thin. This can be seen in FIGS. 5A and 5B, where heat treatment causes the refractive indices of the first layer (FIG. 5B) or second layer (FIG. 5A) (see the small dark dots) to revert to their values in the cast web state (see the diamond-shaped symbols). Recall that the diamond-shaped symbols represent the refractive indices of layers in the isotropic state (e.g., the cast web), the small dark dots represent the refractive indices of microlayers in the treated or selectively heated zones in the finished, internally patterned film, and the open circles represent the refractive indices of microlayers in untreated zones of the finished, internally patterned film.

If the birefringent material in the treated second zone is disoriented only in part, i.e., incompletely, then the birefringent microlayers relax to a state of birefringence that is less than the birefringent state before heating but is not isotropic. In this case, the refractive indices of the birefringent material in the treated second zone acquire values somewhere between the diamond-shaped symbols and the open circles shown in FIGS. 5A-D. Some examples of such incomplete birefringent relaxation are explained in more detail in commonly assigned PCT Publication WO 2010/075363 (Merrill et al.), "Internally Patterned Multilayer Optical Films With Multiple Birefringent Layers", incorporated herein by reference.

Figure 5A:
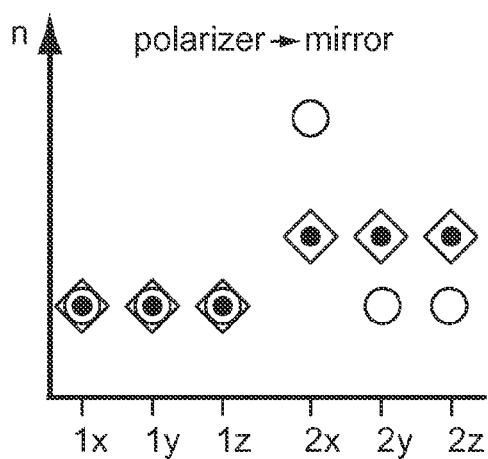
FIGS. 5A-D are idealized plots showing each refractive index (nx, ny, nz) of two alternating microlayers of a microlayer packet, or of two distinct polymer materials of a blended layer, for different stages of manufacture of various reflective STOF films.
Figure 5B:
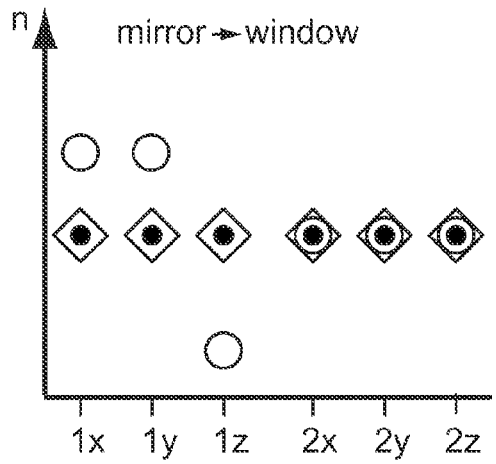
Figure 5C:
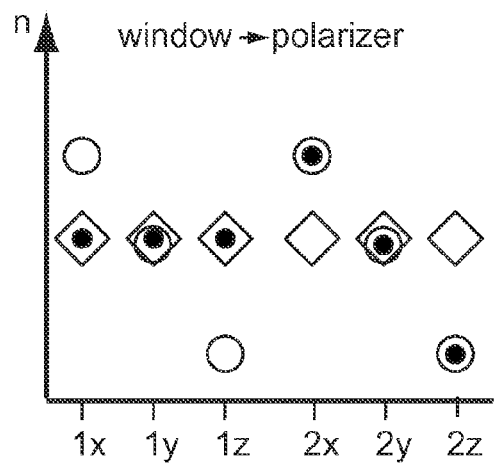

In FIG. 5A, a first polymer material is selected that has a relatively low refractive index, and a second polymer material is selected that has a higher refractive index and that has a positive stress-optic coefficient. The materials are coextruded in an alternating layer arrangement with a suitable number of layers to form a multilayer cast web, having indices shown by the diamond-shaped symbols. The cast web is then uniaxially stretched along the x-axis under suitable conditions to induce birefringence in the second polymer material while the first polymer material remains isotropic. The refractive index value n2x increases further to form a large index difference Δnx with n1x. The refractive index values n2y and n2z decrease to form small index differences Δny and Δnz with n1y and n1z respectively. The values Δny and Δnz may be zero, for example. This set of refractive indices, when implemented in a microlayer packet with an adequate number of layers, can provide a reflective polarizer with the x-axis being a block axis and the y-axis being a pass axis. The reflective polarizer may be broad band or narrow band, depending on the layer thickness distribution of the microlayers.

This reflective polarizing film can then be internally patterned in a second zone as described above, while leaving the reflective polarizing film intact in a first zone. Selective heating by selective delivery of radiant energy to the second zone causes the birefringent layers to relax to their original isotropic states, or to an intermediate birefringent state if the disorientation is incomplete. If relaxation is complete, the second zone can become a mirror-like film (if the microlayer packet has an adequate number of layers) with Δnx≈Δnyz≈Δnz. The finished film thus combines in a unitary film a reflective polarizer in one zone and a mirror-like film in a neighboring zone, with microlayers that extend continuously from one zone to the next. Such films are described more fully in PCT Publication WO 2010/075340 (Merrill et al.), "Multilayer Optical Films Having Side-by-Side Mirror/Polarizer Zones". For FIG. 5A, the selective heat treatment process is able to change a multilayer reflective polarizer film to a multilayer reflective mirror film, i.e.: polarizer→mirror.

In FIG. 5B, first and second polymer materials are selected that have substantially the same refractive index, but where the first polymer material has a positive stress-optic coefficient. The materials are coextruded in an alternating layer arrangement with a suitable number of layers to form a multilayer cast web, having indices shown by the diamond-shaped symbols. The cast web is then biaxially stretched along the x- and y-axes under suitable conditions to induce birefringence in the first polymer material while the second polymer material remains isotropic. The refractive index values n1x, n1y increase to form substantial refractive index differences Δnx, Δny with n2x, n2y respectively. The refractive index value n1z decreases to form a substantial refractive index difference Δnz with n2z that is opposite in polarity or sign to Δnx and Δny. This set of refractive indices, when implemented in a microlayer packet with an adequate number of layers, can provide a mirror-like film. The reflection provided by the film may be broad band or narrow band, depending on the layer thickness distribution of the microlayers.

This mirror-like film can then be internally patterned in a second zone as described above, while leaving the mirror-like film intact in a first zone. Selective heating by selective delivery of radiant energy to the second zone causes the birefringent layers to relax to their original isotropic states, or to an intermediate birefringent state if the disorientation is incomplete. If relaxation is complete, the second zone becomes a window-like film with $\Delta nxz \approx \Delta nyz \approx \Delta nz \approx 0$. The finished film thus combines in a unitary film a mirror-like reflector in one zone and a substantial window in a neighboring zone, with microlayers that extend continuously from one zone to the next. For this FIG. 5B, the selective heat treatment process is able to change a multilayer reflective mirror film to a multilayer window film (mirror→window).

In both FIGS. 5A and 5B, one of the optical materials remains isotropic after stretching (and after the selective heat treatment). This, however, need not be the case in general, and many interesting and useful multilayer optical film designs, as well as diffusely reflective film designs, that can be converted into internally patterned optical films using the selective heat treatment techniques disclosed herein comprise two different optical materials for the constituent layers of the optical repeat unit, and both (rather than only one) of these constituent material layers become birefringent when the cast web is stretched or otherwise oriented. Such multilayer optical films and diffusely reflective optical films are referred to herein as "doubly birefringent" optical films, since, in the case of multilayer optical films, optical repeat units in such a film each include at least two constituent microlayers that are birefringent after stretching, and in the case of diffusely reflective films, a blended layer in such a film includes at least two different materials that form two distinct phases, and both of the phases are birefringent after stretching.

When a doubly birefringent multilayer optical film is exposed to the selective heat treatment, a number of different responses are possible in the treated zone depending on the material properties and the heating conditions: both material layers may completely relax to become isotropic, or one material layer may relax completely or partially while the other material layer maintains its birefringence, or both material layers may relax by different amounts (e.g., one material layer may relax completely to become isotropic, while the other material relaxes partially so as to maintain only a portion of its birefringence), for example. In any case, the change in birefringence of one or both material layers results in a reflective characteristic in the second (treated) zone of the optical film that differs substantially from a reflective characteristic in the first (untreated) zone of the film. Further details of doubly birefringent multilayer optical films, and selective heating techniques used to internally pattern them, are provided in the following commonly assigned PCT publications, which are incorporated herein by reference: WO 2010/075363 (Merrill et al.), "Internally Patterned Multilayer Optical Films With Multiple Birefringent Layers"; and WO 2010/075383 (Merrill et al.), "Multilayer Optical Films Having Side-by-Side Polarizer/Polarizer Zones". Some examples of doubly birefringent STOF films suitable for internal patterning by selective heat treatment are shown in the present application in FIGS. 5C and 5D.

In FIG. 5C, first and second polymer materials are selected that have the same or similar isotropic refractive indices, and that have the same or similar stress-optic coefficients (shown as positive in FIG. 5C although negative coefficients may also be used), and that have different melting or softening temperatures. The materials are coextruded in an alternating layer arrangement with a suitable number of layers to form a multilayer cast web, having indices shown by the diamond-shaped symbols. Rather than being biaxially drawn, the cast web of FIG. 5C is then uniaxially stretched along the x-axis under suitable conditions to induce birefringence in both the first and second polymer materials. The stretching causes the refractive index values n1x and n2x to increase by similar amounts, while causing n1z and n2z to decrease by similar amounts, and while causing n1y and n2y to remain relatively constant. This results in refractive indices of the two material layers that are substantially matched along all three principal directions ($\Delta nx \approx 0$, $\Delta ny \approx 0$, and $\Delta nz \approx 0$), even though each material layer is strongly biaxially birefringent. This set of refractive indices, when implemented in a microlayer packet with an adequate number of layers, can provide a multilayer window-like film that has little or no reflectivity for normally incident and obliquely incident light.

This multilayer window film can then be internally patterned in a second zone as described above, while leaving the window film intact in a first zone. Selective heating by selective delivery of radiant energy to the second zone causes at least some of the birefringent layers to relax, becoming less birefringent. In the case of FIG. 5C, the heating is again carefully controlled to a temperature that is above the melting or softening point of the first material layers, but below the melting or softening point of the second material layers. In this way, the selective heating causes the first birefringent layers in the second zone to relax to their original isotropic states, or to an intermediate birefringent state if the disorientation is incomplete, while causing the second birefringent layers in the second zone to substantially maintain their birefringence. If relaxation of the first material is complete, the second zone is characterized by a relatively large refractive index difference ($\Delta nx$) in one in-plane direction, a zero or near-zero refractive index difference ($\Delta ny$) in the other in-plane direction, and a relatively large out-of-plane refractive index difference ($\Delta nz$) of opposite polarity or sign compared to $\Delta nx$. These refractive index relationships, when implemented in a microlayer packet with an adequate number of layers, can provide a reflective polarizer film in the second zone. This polarizer film has a pass axis parallel to the y-direction and a block axis parallel to the x-direction. The reflection provided by this film for block-state polarized light may be broad band or narrow band, depending on the layer thickness distribution of the microlayers. In either case, the reflectivity of the polarizer film for block-state polarized light (for both the s-polarized component and the p-polarized component) increases with increasing incidence angle due to the opposite polarity of $\Delta nz$. The finished film thus combines in a unitary film a multilayer window film in one zone and a reflective polarizer film in a neighboring zone, with microlayers that extend continuously from one zone to the next. For this FIG. 5C, the selective heat treatment process is able to change a multilayer window film to a multilayer reflective polarizer film (window→polarizer).

Figure 5D:
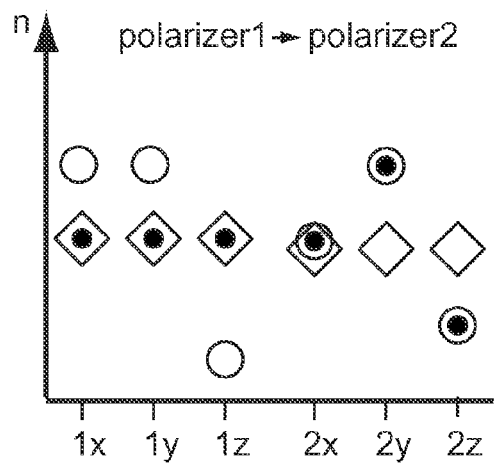

The embodiment of FIG. 5D makes use of a two-step drawing process that is described in U.S. Pat. No. 6,179,948 (Merrill et al.). In this process, the stretching or orientation of the cast film is carried out using a two-step drawing process that is carefully controlled so that one set of layers (e.g., the first material layer of each optical repeat unit) substantially orients during both drawing steps, while the other set of layers (e.g., the second material layer of each optical repeat unit) only substantially orients during one drawing step. The result is a multilayer optical film having one set of material layers that are substantially biaxially oriented after drawing, and having another set of material layers that are substantially uniaxially oriented after drawing. The differentiation is accomplished by leveraging the different visco-elastic and crystallization characteristics of the two materials by using one or more suitably different process conditions such as temperature, strain rate, and strain extent for the two process drawing steps. Thus, for example, a first drawing step may substantially orient the first material along a first direction while at most only slightly orienting the second material along this direction. After the first drawing step, one or more process conditions are suitable changed such that in a second drawing step, both the first and the second materials are substantially oriented along a second direction. Through this method, the first material layers can assume an essentially biaxially-oriented character (for example, the refractive indices may satisfy the relationship $n1x \approx n1y \neq n1z$, sometimes referred to as a uniaxially birefringent material), while the second material layers in the very same multilayer film can assume an essentially uniaxially-oriented character (for example, the refractive indices may satisfy the relationship $n2x \neq n2y \neq n2z \neq n2x$, sometimes referred to as a biaxially birefringent material).

With this background, FIG. 5D depicts an embodiment in which the first and second polymer materials are selected to have the same or similar isotropic refractive indices, and to both become birefringent after drawing, and to have the same polarity of stress-optic coefficient (in the drawing they are both depicted as positive, but they can instead both be negative). The first and second materials have different melting or softening temperatures, and have different visco-elastic and/or crystallization characteristics such that the two-step drawing process discussed above can be implemented. The materials are coextruded in an alternating layer arrangement with a suitable number of layers to form a multilayer cast web, having indices shown by the diamond-shaped symbols. The cast web is then biaxially stretched along the x- and y-axes using the above-described two-step drawing process, such that the first material is oriented comparably along both the x- and y-axes, whereas the second material is oriented preferentially along the y-axis, with lesser orientation (including in some cases no orientation) along the x-axis. The net result is a multilayer optical film whose first and second microlayers are both birefringent, but the first material layers have a substantially biaxially-oriented character, whereas the second material layers have an asymmetric biaxially-oriented character, or even a substantially uniaxially-oriented character. As shown, the materials and process conditions are selected so that the stretching causes the refractive index values $n1x$ and $n1y$ to increase by similar amounts, while causing $n1z$ to decrease by a larger amount. The stretching also causes the refractive index value $n2y$ to increase to a value equal to or close to that of $n1x$ and $n1y$, and causes the refractive index $n2z$ to decrease, and causes the refractive index $n2x$ to remain about the same (if the second material orients to a small degree during the x-axis orientation step, then $n2x$ may increase slightly as shown in the figure). This results in refractive indices of the two material layers that have one large in-plane refractive index mismatch ($\Delta nx$), one significantly smaller in-plane refractive index mismatch ($\Delta ny \neq 0$), and an intermediate out-of-plane refractive index mismatch ($\Delta nz$) of opposite polarity from $\Delta nx$. When the second material orients more biaxially, index matching in the x-direction after treatment may be achieved by pairing with a first material whose isotropic index is higher than the second. This set of refractive indices, when implemented in a microlayer packet with an adequate number of layers, can provide a first reflective polarizing film with a block axis along the x-direction and a pass axis along the y-direction. The reflection provided by the film (for light polarized parallel to the block axis) may be broad band or narrow band, depending on the layer thickness distribution of the microlayers.

This first multilayer reflective polarizer film can then be internally patterned in a second zone as described above, while leaving the polarizer film intact in a first zone. Selective heating by selective delivery of radiant energy to the second zone causes at least some of the birefringent layers to relax, becoming less birefringent. In the present case, the heating is carefully controlled to a temperature that is above the melting or softening point of the first material layers, but below the melting or softening point of the second material layers. In this way, the selective heating causes the first birefringent layers in the second zone to relax to their original isotropic states, or to an intermediate birefringent state if the disorientation is incomplete, while causing the second birefringent layers in the second zone to substantially maintain their birefringence. If relaxation of the first material is complete, the second zone is characterized by a relatively large refractive index difference ($\Delta ny$) in one in-plane direction, a zero or near-zero refractive index difference ($\Delta nx$) in the other in-plane direction, and a relatively large out-of-plane refractive index difference ($\Delta nz$) of opposite polarity or sign compared to $\Delta ny$. These refractive index relationships, when implemented in a microlayer packet with an adequate number of layers, can provide a second reflective polarizer film in the second zone. Notably, this second polarizer has a pass axis parallel to the x-direction and a block axis parallel to the y-direction, i.e., it is perpendicularly oriented relative to the first reflective polarizer. The reflection provided by this second polarizer film for block-state polarized light will be broad band or narrow band, depending on the layer thickness distribution of the microlayers, to the same extent that the first reflective polarizer is broad band or narrow band for the orthogonal polarization state. In any case, the reflectivity of the second polarizer film for block-state polarized light (for both the s-polarized component and the p-polarized component) increases with increasing incidence angle due to the opposite polarity of $\Delta nz$ in the second zone. The finished film thus combines in a unitary film a first reflective polarizer film in one zone and a second reflective polarizer film in a neighboring zone, the second reflective polarizer film being oriented perpendicular to the first reflective polarizer film, with microlayers that extend continuously from one zone to the next. For this FIG. 5D, the selective heat treatment process is able to change a first multilayer reflective polarizer film to a second multilayer reflective polarizer film (polarizer1→polarizer2).

The scenarios discussed above involve only some of a multitude of possible combinations of reflector types for the first zone, reflector types for the second zone, material characteristics, and processing parameters that can be used to produce other internally patterned multilayer optical films, and should not be considered to be limiting. Note that not just positively birefringent but also negatively birefringent materials, and combinations thereof, can be used. Note also that in cases where the combination of a birefringent and isotropic polymer is used, the birefringent polymer may have a pre-stretch isotropic index that is less than, greater than, or equal to the refractive index of the isotropic polymer. Discussion of other possible combinations of reflector types for the first and second zones of internally patterned multilayer optical films, which various combinations can be utilized in bi-level writeable multilayer optical films as disclosed herein, can be found in one or more of the following commonly assigned PCT publications: WO 2010/075357 (Merrill et al.), "Internally Patterned Multilayer Optical Films Using Spatially Selective Birefringence Reduction"; WO 2010/075340 (Merrill et al.), "Multilayer Optical Films Having Side-by-Side Mirror/Polarizer Zones"; WO 2010/075363 (Merrill et al.), "Internally Patterned Multilayer Optical Films With Multiple Birefringent Layers"; and WO 2010/075383 (Merrill et al.), "Multilayer Optical Films Having Side-by-Side Polarizer/Polarizer Zones".

Figure 6:
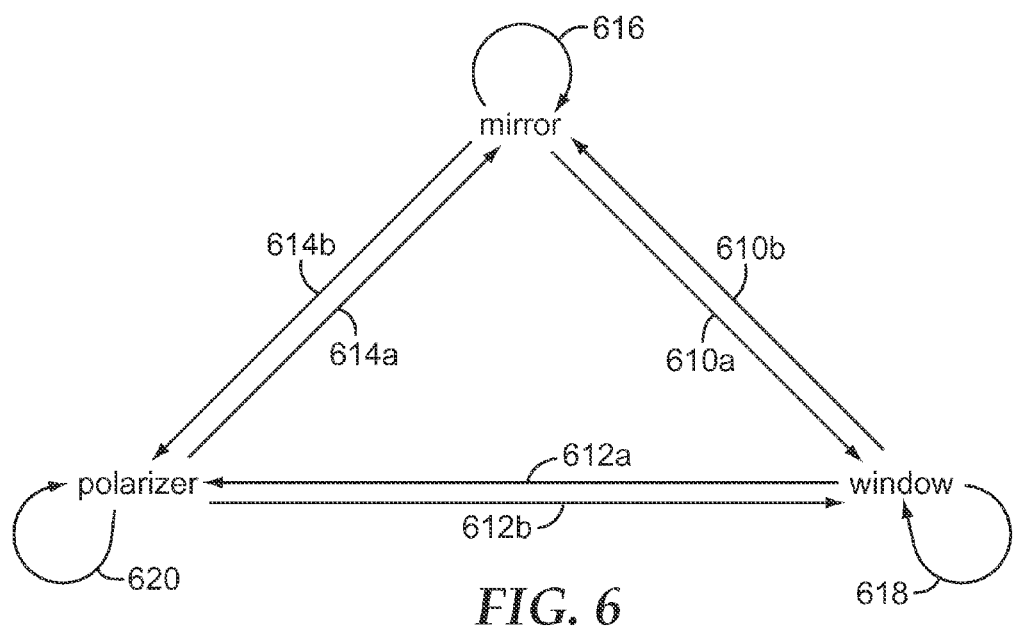
FIG. 6 is a schematic diagram that summarizes various transformations that can be achieved using the techniques discussed herein for reflective STOF films.

FIG. 6 is a schematic diagram that summarizes various transformations that can be achieved using the birefringent-relaxation techniques discussed herein for multilayer optical films. As such, the diagram also summarizes a variety of combinations of reflector types for the first (untreated) zone and the second (heat treated) zone of an internally patterned multilayer optical film, which in turn may form part of a bi-level writeable composite film, which may also comprise one or more patternable retarder films. The arrows in the figure represent transformations from a first reflective characteristic to a second reflective characteristic that differs substantially from the first reflective characteristic. Note that the diagram of FIG. 6 is provided for illustrative purposes and should not be construed as limiting.

Arrow 610a represents a transformation from a multilayer mirror film to a multilayer window film, e.g., as described in connection with FIG. 5B. Such a transformation can be used to provide an internally patterned multilayer optical film with one or more first (untreated) zones characterized by a mirror film and one or more second (treated) zones characterized by a window film. Arrow 610b represents an opposite transformation, from a multilayer window film to a multilayer mirror film. Such a transformation can be used to provide an internally patterned multilayer optical film with one or more first (untreated) zones characterized by a window film and one or more second (treated) zones characterized by a mirror film.

Arrow 612a represents a transformation from a multilayer window film to a multilayer polarizer film, e.g., as described in connection with FIG. 5C. Such a transformation can be used to provide an internally patterned multilayer optical film with one or more first (untreated) zones characterized by a window film and one or more second (treated) zones characterized by a polarizer film. Arrow 612b represents an opposite transformation, from a multilayer polarizer film to a multilayer window film. Such a transformation can be used to provide an internally patterned multilayer optical film with one or more first (untreated) zones characterized by a polarizer film and one or more second (treated) zones characterized by a window film.

Arrow 614a represents a transformation from a multilayer polarizer film to a multilayer mirror film, e.g., as described in connection with FIG. 5A. Such a transformation can be used to provide an internally patterned multilayer optical film with one or more first (untreated) zones characterized by a polarizer film and one or more second (treated) zones characterized by a mirror film. Arrow 614b represents an opposite transformation, from a multilayer mirror film to a multilayer polarizer film. Such a transformation can be used to provide an internally patterned multilayer optical film with one or more first (untreated) zones characterized by a polarizer film and one or more second (treated) zones characterized by a window film.

Arrows 616, 618, and 620 represent transformations from one type of mirror to another type of mirror, from one type of window to another type of window, and from one type of polarizer to another type of polarizer (see e.g. FIG. 5D). The reader is again reminded that the diagram of FIG. 6 is provided for illustrative purposes and should not be construed in a limiting fashion.

FIGS. 5A-D and 6 and their associated descriptions are primarily directed to reflective films whose reflective characteristics are determined in large part by constructive and destructive interference of light reflected from interfaces between microlayers disposed within the film, i.e., multilayer optical films. Counterparts to those figures and descriptions can also be provided for reflective films whose reflective characteristics are diffuse in nature because they are determined in large part by first and second materials that are separated into distinct first and second phases in one or more blended layer. Reference in this regard is made to commonly assigned U.S. Application Ser. No. 61/360,124, "Diffuse Reflective Optical Films With Spatially Selective Birefringence Reduction", filed Jun. 30, 2010. For each of FIGS. 5A-D, the "first" material may be considered to be a continuous phase and the "second" material may be considered to be a dispersed phase (or another continuous phase), while in an alternative embodiment, the "second" material may be considered to be a continuous phase and the "first" material may be considered to be a dispersed phase (or another continuous phase).

The fact that the change in the reflective characteristic of the STOF film is associated primarily with heat-induced relaxation in birefringence of a material or layer of the STOF film means that the selective treatment process used to pattern the STOF film may be primarily one-way or irreversible. For example, a given area or zone of the STOF film that has been processed (selectively heat treated by absorption of radiant energy) so that its initial first reflection characteristic has been changed to a second reflection characteristic may thereafter not be able to be processed with another radiant beam to re-acquire its original first reflection characteristic. In fact, if the initial heat treatment substantially eliminated birefringence in the zone, then further radiant treatment with the same or similar radiant beam may have little or no additional effect on the reflective characteristic of the zone. This one-way or irreversible aspect of STOF film patterning may be particularly advantageous e.g. in security applications where, for example, tamper-resistance is important, or in display or opto-electronic applications where for example stability to optical or electronic fields, used to switch other component elements, is desired. In other applications, this one-way or irreversible aspect of STOF film patterning in a continuous phase may be combined with switchable elements in another phase, e.g. in opto-electronic devices where for example a stable, patterned continuous phase with birefringence in a first zone and little or no birefringence in a second zone is desired.

Figure 7:
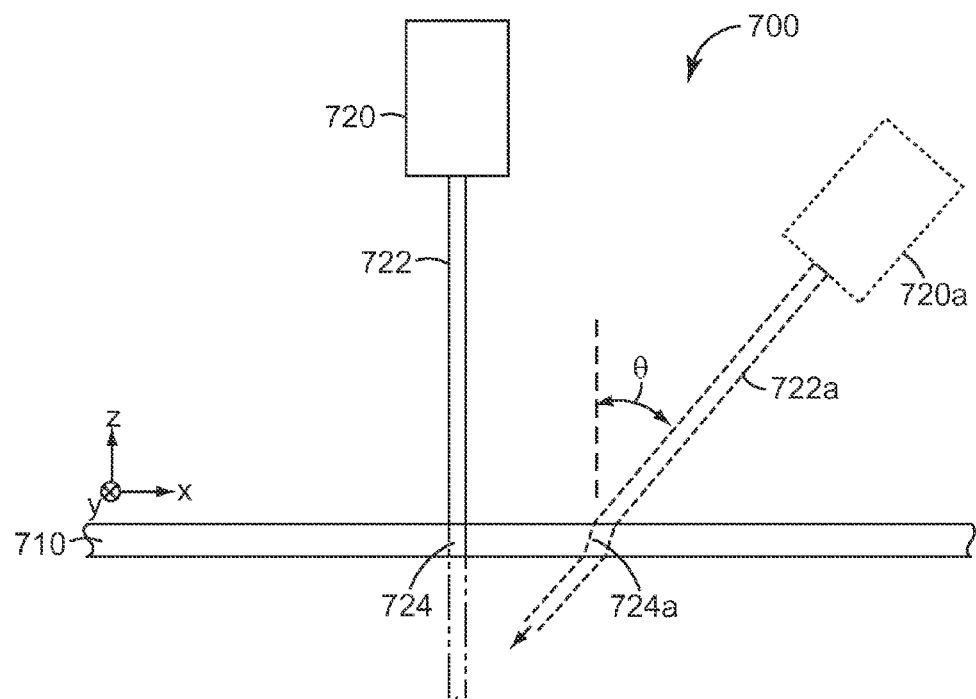
FIG. 7 is a schematic side view of an arrangement for selectively heating a reflective STOF film to accomplish internal patterning.

In FIG. 7, we show one arrangement 700 that can be used to selectively heat the second zone of a STOF film to provide the disclosed patterned (e.g. internally patterned) films. Briefly, a STOF film 710 is provided that comprises at least one patternable reflective film that extends throughout the film, e.g. from a first to a second zone. The reflective film may be internal to the STOF film, and provides a first reflective characteristic. A high radiance light source 720 provides a directed beam 722 of suitable wavelength, intensity, and beam size to selectively heat an illuminated portion 724 of the film by converting some of the incident light to heat by absorption. Preferably, the absorption of the film is great enough to provide sufficient heating with a reasonably-powered light source, but not so high that an excessive amount of light is absorbed at the initial surface of the film, which may cause surface damage. This is discussed further below. In some cases it may be desirable to orient the light source at an oblique angle θ, as shown by the obliquely positioned light source 720a, directed beam 722a, and illuminated portion 724a. Such oblique illumination may be desirable where the STOF film 710 contains a microlayer packet having a reflection band at normal incidence that substantially reflects the directed beam 722 in a way that prevents the desired amount of absorption and concomitant heating. Thus, taking advantage of the shift of the reflection band to shorter wavelengths with increasing incidence angle, the directed beam 722a can be delivered at an oblique angle θ that avoids the (now shifted) reflection band to allow the desired absorption and heating.

Oblique illumination may also be desirable where the STOF film 710 includes a diffuse reflector, and were the diffuse reflectivity changes with incidence angle and/or polarization state. For asymmetric diffuse reflectors, like reflective polarizers, it may also be desirable to orient the light source at a controlled azimuthal angle 4. At one incident direction (defined e.g. by a given (θ,φ) coordinate pair) and polarization state, for example, the film may scatter the directed beam 722/722a to a great extent in a way that prevents the desired amount of absorption and concomitant heating of the blended layer in the second zone. At a different incident direction (θ,φ) and/or polarization state, the scattering may be substantially reduced so as to allow the desired amount of absorption and concomitant heating of the blended layer in the second zone to produce the birefringence relaxation and reflectivity transformations discussed above. Thus, the incident direction (θ,φ) and the polarization state of the directed beam 722/722a can be selected to avoid excessive scattering through the blended layer, e.g., they can be selected to coincide with a minimum scattering of the blended layer or optical film, or stated differently to coincide with a maximum of specular transmission through the blended layer. If the diffusely reflective film is a reflective polarizer, the polarization state may desirably be a pass state of the polarizer.

In some cases, the directed beam 722 or 722a may be shaped in such a way that the illuminated portion 724 or 724a has the desired shape of the finished second zone. A mask may be used for that purpose. In other cases, the directed beam may have a shape that is smaller in size than the desired second zone. In the latter situation, beam steering equipment can be used to scan the directed beam over the surface of the multilayer optical film so as to trace out the desired shape of the zone to be treated. Spatial and temporal modulation of the directed beam can also be utilized with devices such as beam splitters, lens arrays, pockels cells, acousto-optic modulators, and other techniques and devices known to those of ordinary skill in the art.

Figure 8A:
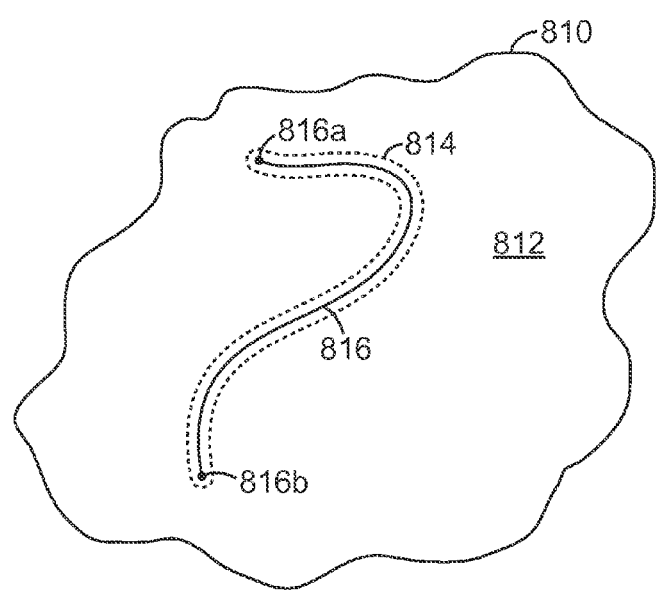
FIGS. 8A-C are schematic top views of different second zones of an internally patterned optical film, and superimposed thereon possible paths of a light beam relative to the film capable of forming the depicted zones.
Figure 8B:
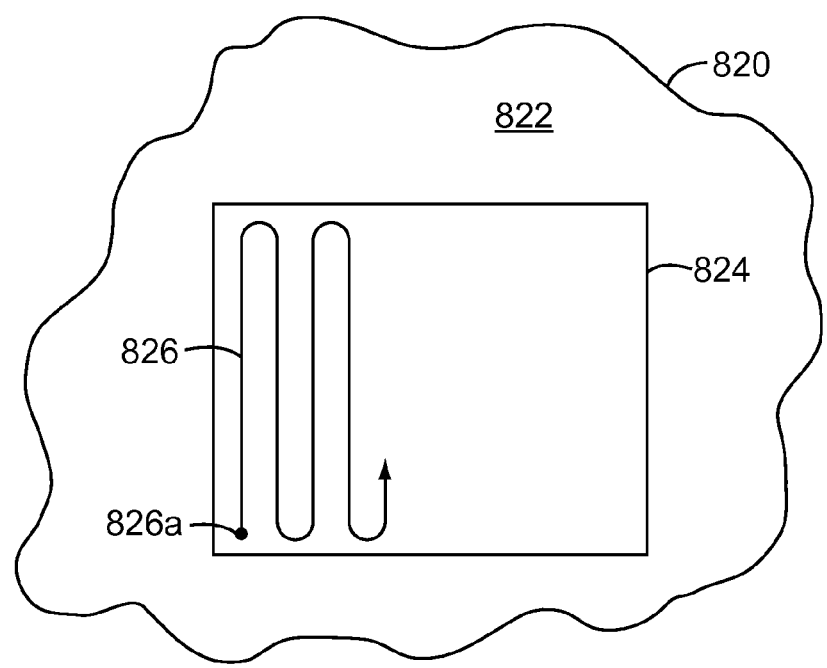
Figure 8C:
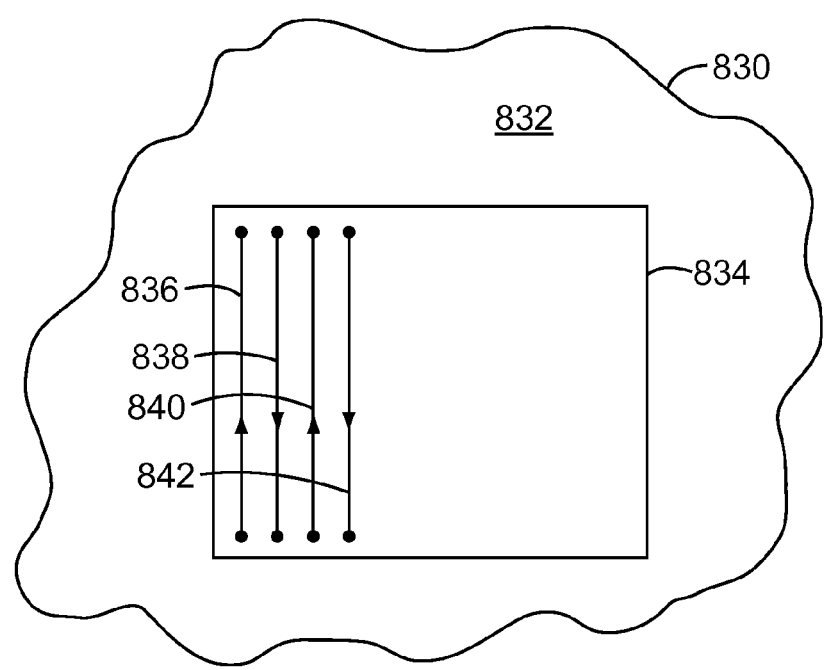

FIGS. 8A-C provide schematic top views of different second zones of a patterned STOF film, and superimposed thereon possible paths of a directed light beam relative to the film capable of forming the depicted zones. In FIG. 8A, a light beam is directed at a STOF film 810 and scanned at a controlled speed from a starting point 816a to an ending point 816b along a path 816 to selectively heat the film in an arbitrarily-shaped zone 814 to distinguish it from a first zone 812. FIGS. 8B and 8C are similar. In FIG. 8B, a light beam is directed at a STOF film 820 and scanned at a controlled speed from a starting point 826a along a path 826 to selectively heat the film in a rectangular-shaped zone 824 to distinguish it from a neighboring first zone 822. In FIG. 8C, a light beam is directed at a STOF film 830 and scanned at controlled speeds along the discontinuous paths 836-842, and so on, to selectively heat the film in a rectangular-shaped zone 834 to distinguish it from a neighboring first zone 832. In each of FIGS. 8A-C, the heating is sufficient to reduce or eliminate birefringence of at least some interior layers or materials in the second zone while maintaining the birefringence of those layers or materials in the first zone, and is accomplished while maintaining the structural integrity of the layers or films in the second zone and without any selective application of pressure to the second zone.

The directed light beam may also be modulated to create paths that are dashed, dotted, or otherwise broken or discontinuous. The modulation may be complete, wherein the light beam intensity changes from 100% or "full on" to 0% or "full off". Alternatively, the modulation may be partial. Further, the modulation may include abrupt (e.g. stepwise) changes in beam intensity, and/or it may include more gradual changes in beam intensity.

Figure 9A:
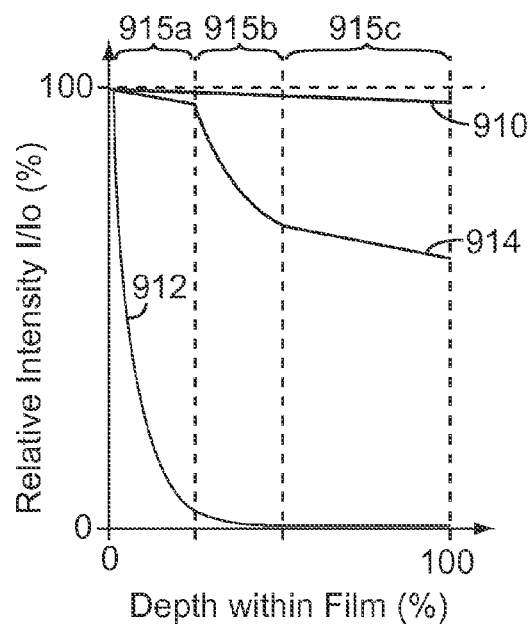
FIG. 9A is an idealized plot showing the relative intensity of a beam of light as a function of the depth as the light beam propagates into the film, with three curves provided for three different optical films.
Figure 9B:
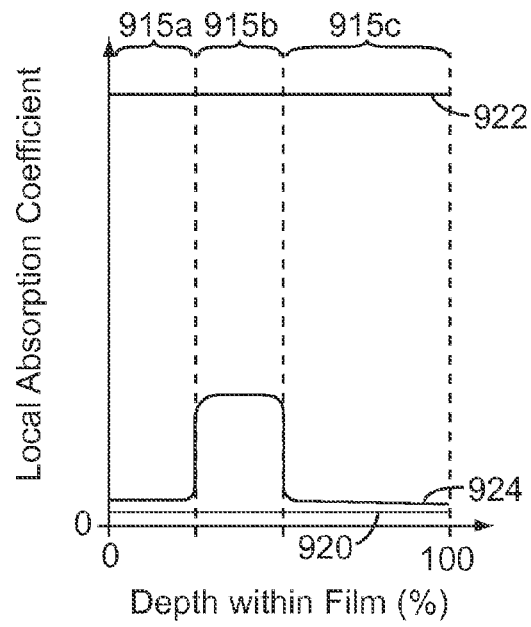
FIG. 9B is an idealized plot showing a local absorption coefficient as a function of the depth or axial position within the film, with three curves corresponding to the three curves of FIG. 9A.

FIGS. 9A and 9B address the topic of how the absorption of the patternable film can or should be tailored to provide optimal localized heating. The graphs of FIGS. 9A and 9B are plotted on the same horizontal scale, which represents the depth or position of the radiant light beam as it propagates through the film. A depth of 0% corresponds to the front surface of the film, and a depth of 100% corresponds to the rear surface of the film. FIG. 9A plots along the vertical axis the relative intensity $I/I_0$ of the radiant beam. FIG. 9B plots the local absorption coefficient (at the selected wavelength or wavelength band of the radiant beam) at each depth within the film.

Three curves are plotted in each figure, for three patternable STOF film embodiments. In a first embodiment, the film has a substantially uniform and low absorption throughout its thickness at the wavelength of the directed light beam. This embodiment is plotted as curve 910 in FIG. 9A and curve 920 in FIG. 9B. In a second embodiment, the film has a substantially uniform and high absorption throughout its thickness. This embodiment is plotted as curve 912 in FIG. 9A and curve 922 in FIG. 9B. In a third embodiment, the film has a relatively low absorption throughout regions 915a and 915c of its thickness, but has a higher, intermediate absorption in region 915b of its thickness.

The first embodiment has an absorption coefficient that is too low for many situations. Although the directed light beam is absorbed uniformly as a function of depth as indicated by the constant slope of the curve 910, which may be desirable in some cases, very little of the light is actually absorbed as shown by the high value of the curve 910 at a depth of 100%, meaning that a high percentage of the directed light beam is wasted. Nevertheless, in some cases this first embodiment may still be quite useful in the treatment of some films. The second embodiment has an absorption coefficient that is too high for many situations. Although substantially all of the directed light beam is absorbed, and none is wasted, the high absorption causes an excessive amount of light to be absorbed at the front surface of the film, which may cause surface damage to the film. If the absorption is too high, an adequate amount of heat cannot be delivered to interior layers or materials of interest without damaging layers at or near the front surface of the film. The third embodiment utilizes a non-uniform absorption profile that may be achieved, for example, by incorporating an absorbing agent into selected interior layers of the film. The level of absorptivity (controlled by the local absorption coefficient) is desirably set to an intermediate level so that an adequate portion of the directed light beam is absorbed in the tailored absorbing region 915b of the film, but the absorptivity is not so high that an excessive amount of heat is delivered to the incident end of the region 915b relative to the opposite end. In many instances, the absorptivity in absorbing region 915b is still reasonably weak, e.g. the relative intensity profile 914 over that region may appear more as a straight line with merely a steeper slope than the other regions, e.g. 915a and 915c. The adequacy of the absorption may be determined by balancing that absorptivity against the power and duration of the incoming directed light beam to achieve the desired effect.

In an elementary example of the third embodiment, the patternable STOF film may have a construction of two thick skin layers with one or more packets of microlayers therebetween (separated by protective boundary layers if two or more microlayer packets are included), and the film may be composed of only two polymer materials A and B. An absorbing agent is incorporated into polymer material A to increase its absorptivity to a moderate level but no absorbing agent is incorporated into polymer B. Both materials A and B are provided in alternating layers of the microlayer packet(s), but the skin layers and the protective boundary layers, if present, are composed only of polymer B. Such a construction will have a low absorptivity at the outer surfaces, i.e. the skin layers, of the film, due to the use of the weakly absorbing material B, and will also have a low absorptivity at the optically thick PBLs if they are present. The construction will have a higher absorptivity in the microlayer packet(s) due to the use of the more strongly absorbing material A in alternating microlayers (along with alternating microlayers of the more weakly absorbing material B). Such an arrangement can be used to preferentially deliver heat to interior layers of the film, e.g. to one or more interior microlayer packet(s), rather than to outer surface layers. Note that with an appropriately designed feedblock the multilayer optical film can comprise three or more different types of polymer materials (A, B, C, . . . ), and an absorptive agent may be incorporated into one, some, or all of the materials in order to provide a wide variety of different absorption profiles so as to deliver heat to selected interior layers, packets, or regions of the film. In other cases, it may be useful to include an absorbing agent in the PBL(s) or even in the skin layer, if present. In either case, the loading or concentration may be same or different, either higher or lower, than in the microlayers.

Similar absorption profiles as those of the foregoing embodiments may be obtained using the inherent absorption characteristics of the various native materials used in the multilayer optical film. Thus, a given composite film construction may comprise different materials having different absorption characteristics among the various constituent layers or films of the composite film, and those various layers or films may have been formed together during film formation (e.g. by coextrusion), or may have been formed as separate precursor films which were later combined e.g. by lamination.

Distinctive articles with unique capabilities can be obtained by combining one or more STOF films with one or more masks in a composite article. The STOF film(s) may be any of the wide variety of STOF films disclosed herein. The mask(s) may be of any conventional design, but may also include structured surface features that may be adapted to preferentially redirect light from a radiant beam onto selected portions of the STOF film(s) as discussed further below. The STOF film(s) may be combined with the mask(s) by attachment, e.g., attachment by direct lamination, or using a transparent adhesive layer and/or other attachment layers. Attachment is in a generally layered arrangement such that at least some light that passes through the mask impinges upon the reflective STOF film.

A variety of structures on the surface of a mask, or embedded within a mask, may be used to manipulate the local flux density of the applied radiant energy of treatment over the layers or packets of interest in the STOF film. The structures may be regular or variable in shape and periodic or aperiodic (quasi-random or chaotic) in arrangement. The structures may have one dimensional or two dimensional qualities across the plane of the film, i.e., a given structure may have a cross-sectional shape that is uniform and unchanging along one in-plane axis of the film (e.g. in the case of a linearly extending prism), or a given structure may be bounded in two perpendicular in-plane directions with two cross-sectional shapes (e.g. in the case of a hemispherical protrusion or pyramidal structure). The structures may fully or only partially cover the surface, e.g. flat regions may intervene between isolated structures, clusters of structures, or interweave across the surface. The structures may alter the relative intensities or fluxes of an applied radiant beam as a function of in-plane coordinates. In some cases, the structures may also affect the relative intensities or fluxes through the thickness of the STOF film. Various mechanisms include but are not limited to compression (or conversely, rarefication) of the flux from an initially incident planar projection onto the structures to an effective planar projection onto the STOF film itself, overlapping areas of the initial incident regions onto the STOF film, and filtering of the transmission into the structures as a result of the dependence of the reflection coefficient on incidence angle and polarization, as well as the material considerations of the region above the structures and the structures themselves, most notably the indices of refraction and their bulk and surface haze. The manipulations may also depend upon the level of collimation of the incident light. For example, the incident light may be normally incident and collimated, or may be partially collimated e.g. using a collimating film or films (such as Vikuiti™ Brightness Enhancement Films (BEF) available from 3M Company, St. Paul, Minn., whether used alone, or with two such films crossed with each other, or combined with other materials), or may be uncollimated as in the case of a Lambertian source. A polarizer may also be used to pre-polarize the incident light from the light source. In this manner, the various portions of the STOF film may experience different amounts of flux, and different levels of treatment. For example, areas of higher intensity or flux may become treated (i.e., when exposed to a radiant beam, heated to an extent sufficient to reduce the birefringence of one or more materials in the STOF film) and represent portions of a second (treated) zone of a patterned STOF film, while areas of lower intensity or flux may remain untreated or less treated (i.e., when exposed to a radiant beam, heated to an extent that is not sufficient to substantially reduce the birefringence of one or more materials in the STOF film) and represent portions of a first (untreated) zone of the patterned STOF film.

The structures on the surface of the mask may have characteristic dimensions that manipulate light chiefly by the phenomenon of refraction, or they may have smaller dimensions so as to manipulate light chiefly by the phenomenon of diffraction, or they may be sized to manipulate light by a combination of refraction and diffraction.

Figure 10:
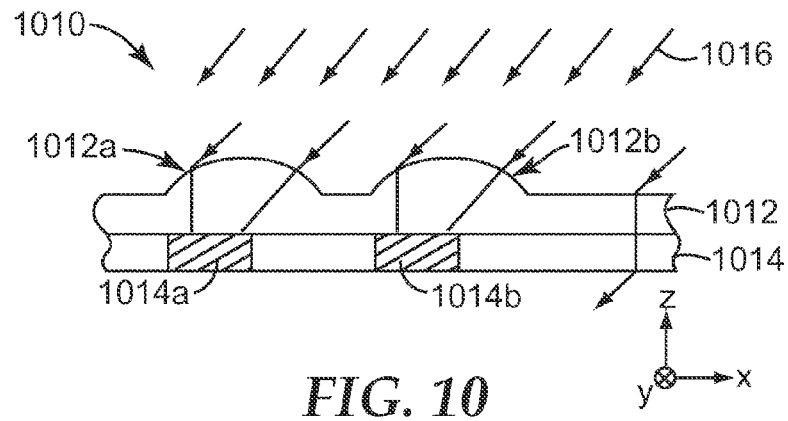
FIGS. 10-12 are a schematic side or sectional views of various articles that each include a STOF reflective film attached to a mask having a structured surface.
Figure 11:
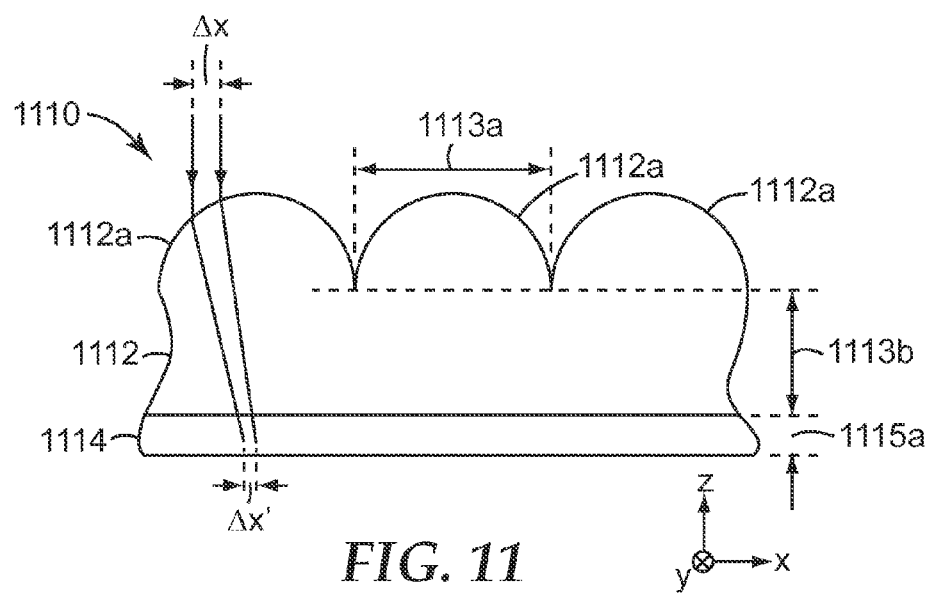
Figure 12:
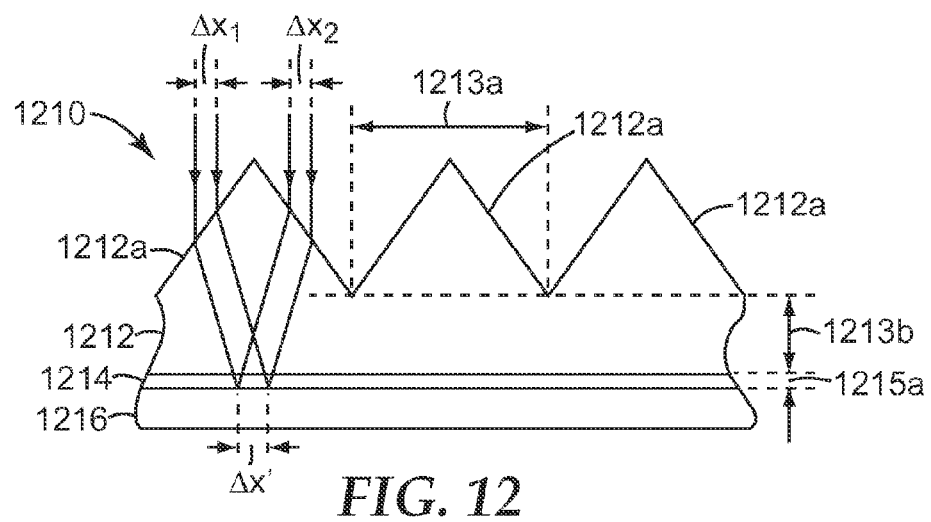

Further with regard to composite articles that include one or more STOF films with one or more masks, FIGS. 10-12 provide schematic side or sectional views of various articles that each include a STOF reflective film attached to a mask having a structured surface. In each of these figures, the shape of the structures is shown in only one plane, i.e., the plane of the drawings, which is referred to as an x-z plane.

In the orthogonal direction (i.e., along the y-axis), the structures may extend uniformly, as in the case of linearly extending prisms, or they may have a bounded profile, for example, the same as or similar to their respective profiles in the x-z plane. Structures that are one-dimensional in character, e.g., maintain a consistent cross-sectional profile along the y-direction, may represent linear cylindrical structures, such as curved lenticular or flat-faceted triangular prismatic structures. Structures that are two-dimensional in character, i.e., have a bounded profile in both the x-z and y-z planes, or that have a bounded profile in one plane and the bounded profile is non-uniform along an orthogonal direction, may function as lens-like protuberances.

Briefly, FIG. 10 depicts a composite article 1010 that includes a mask 1012 attached to a STOF film 1014. The mask 1012 may be light transmissive (transparent) over its entire useable area. The mask 1012 has a structured surface by virtue of the curved structures 1012a, 1012b on an otherwise flat upper surface. The structures 1012a, 1012b are shown to increase the flux of a radiant beam 1016 in corresponding areas or zones 1014a, 1014b respectively, which zones may then be treated (reflection characteristic modified by the mechanism of birefringence reduction) by the radiant beam 1016 while other zones of the STOF film 1014 are not. FIG. 11 depicts a composite article 1110 that includes a transparent mask 1112 attached to a STOF film 1114. The mask 1112 has a structured surface characterized by curved (e.g. semicircular or hemispherical) structures 1112a, which have a transverse dimension 1113a. The mask 1112 may have a "land" portion of dimension (thickness) 1113b. The STOF film may have a thickness of 1115a. FIG. 12 depicts a composite article 1210 that includes a transparent mask 1212 attached to a STOF film 1214 and to another optical film or substrate 1216. The mask 1212 has a structured surface characterized by triangular prismatic structures 1212a, which have a transverse dimension 1213a. The mask 1212 may have a "land" portion of dimension (thickness) 1213b. The STOF film may have a thickness of 1215a. The mask 1012 of FIG. 10 is also shown as having a finite land portion, which is not specifically labeled.

Composite articles such as those of FIGS. 10-12 may function as light directing films, e.g., where treated portions of the STOF film are less reflective and more transmissive than untreated areas. Such a composite article, if used in a sign, backlight, luminaire, or similar internally lit device, may be oriented so that the STOF film is disposed towards the internal light source and the structured surface mask is disposed away from such light source. Treated areas of the STOF film may then transmit light, which may then be collimated or partially collimated, or otherwise directed along a desired output axis, by virtue of the spatial registration of the structured surface features with the treated areas of the STOF film.

The surface structure or profile of the depicted masks may be characterized by a surface function f(x,y) above a land of thickness H. In FIG. 11, H is labeled 1113b, and in FIG. 12, H is labeled 1213b. In some cases, the land may be omitted (H=0), such that the structures attach directly to the STOF film. In some cases, the land may be an outer skin layer of the STOF film, and the structures may be formed directly on the skin layer, e.g. via any number of surface structuring methods including extrusion replication, embossing, and surface machining (e.g. diamond turning). When the structure has one-dimensional character, the surface structure may be defined by a surface function of only one in-plane direction, e.g. f(x). The structures need not be aligned with the any of the principal directions of the dielectric tensor of the STOF film at an optical band of interest, although they may be in some cases.

In some cases, an additional upper layer (made of a transparent material denser than air) may be provided that completely covers the structured surface of the mask and encapsulates the individual structures. Such an upper layer may be composed of a transparent "upper" medium, having a refractive index tensor $n_U$. The upper medium may be isotropic. The masks 1012, 1112, 1212, including their respective structures and optional land, may comprise a "lower" medium or material with refractive index tensor $n_L$. The lower medium may be isotropic or may be birefringent, e.g. as described in Patent Application Publications US 2007/0065636 (Merrill et al.) and US 2006/0204720 (Biernath et al.). Any given structure may have a basal width B (labeled 1113a in FIGS. 11 and 1213a in FIG. 12) along a given direction and a local surface normal vector at each planar projection position in the (x,y) coordinate plane. In FIG. 11, light that is normally incident (parallel to the z-axis) over a differential cross-section width $\Delta x$ ($\Delta x \ll B$), impinges on the surface of one of the individual structures. Some portion of this incident light is reflected in accord with the reflection coefficients given the local surface normal, the refractive indices $n_U$ and $n_L$, and the polarization state of the incident radiation. The transmitted flux over the width $\Delta x$ is then transmitted to the surface of the STOF film over a new cross sectional width $\Delta x'$. In FIG. 11, the new cross section $\Delta x'$ is smaller, thus the intensity is increased in this illustrative example. In FIG. 12, two initially incident planar projections onto the structures at $\Delta x_1$ and $\Delta x_2$ are directed to overlap onto the STOF film at a single effective planar projection $\Delta x'$. Compression and overlap can be combined to further increase the intensity over selected portions of the STOF film.

The relative sizes and/or heights of the surface function f(x,y), base B(x,y), H, and the thickness of the STOF film can be selected to achieve desirable effects. For example, it may be advantageous for the structures to be large relative to the thickness of the optical layer to be treated in the STOF film, in order to achieve a uniform controlled pattern of modified reflection characteristics. It may also be advantageous to adjust H to achieve a certain level of focus, or to position a focal plane, e.g. above, below, or within the STOF film. It may be advantageous to use fine structures, e.g. where B and/or H are of the order of the thickness of the STOF film so that the structured mask effectively controls the areal conversion or treatment, e.g. via a half-tone approach, of the STOF film, e.g. to achieve a controlled level of change in the reflective characteristics such as control of light in a security, decorative, display, sign, or lighting system.

In one example, a structured mask is formed to coincide with a patterned array in an optical device. For example, the mask may be patterned to align with light sources, e.g. bulbs in an LED direct-backlit display. After treatment, a pattern of desired consonance with the array of light sources in the optical device can be formed. The patterned STOF film may be thus patterned and registered with the components of the optical device in a second step. Alternatively, the patterned mask may itself be a patterned optical feature of the optical device. Treatment through the patterned mask in the assembled or sub-assembled optical part may then create a self-registered patterning of the STOF film and this other optical feature.

Thus, for example, a STOF film may be patterned to have first zones (whether untreated or treated) of low reflectivity and high transmission, and second zones (whether treated or untreated) of high reflectivity and low transmission, where the pattern is tailored to match a pattern of LED or other light sources of a backlight useful in a display, or in a luminaire. The highly reflective second zones may be positioned above or in front of the light sources, respectively, to prevent light from the light sources from directly reaching the observer's eye or from otherwise producing "hot spots", i.e., locally bright areas. Light reflected by the patterned STOF film may be reflected by a back reflector and may pass through the highly transmissive first zones of the STOF film, towards a front of the backlight. In this regard, the backlight may be or comprise a recycling backlight.

The STOF films and articles may thus be used in a wide variety of displays and other extended area optoelectronic devices, such as backlights, signs, luminaires, channel letters, light guiding or light piping systems, and the like. Such devices may emit polarized or unpolarized light. Such devices may emit white light, i.e., light perceived by an ordinary observer as nominally white, or light of a particular color other than white. Such devices may comprise arrays of liquid crystals, organic light emitting devices (OLEDs), and/or light emitting diodes (LEDs), for example. Such devices may be or comprise a 3-dimensional display, e.g., a stereoscopic display. Such devices may be or comprise transmissive displays, reflective displays, and/or transflective displays. Such devices may include edge-lit displays and/or direct-lit displays.

The films, methods, and business processes disclosed herein may be generally useful in any application in which a spatially controlled level of orientation is desired. Fields of interest may include, for example, display, decorative, and security applications. Some applications may overlap multiple fields. For example, some articles may incorporate the internally patterned films disclosed herein in combination with a film, substrate, or other layer that includes conventional patterning in the form of indicia, for example. The resulting article may be useful in security applications, but versions of it may also be considered decorative. Selectively heat treating such an article may produce zones in the internally patterned film that selectively obstruct (by increasing reflectivity) or reveal (by decreasing reflectivity) portions of the conventional patterning of the other film, depending on the design of the internally patterned film. Color shifting characteristics of the disclosed internally patterned films may also be exploited in combination with colored or black-and-white background indicia as disclosed for example in U.S. Pat. No. 6,045,894 (Jonza et al.) "Clear to Colored Security Film", and U.S. Pat. No. 6,531,230 (Weber et al.) "Color Shifting Film".

Further in regard to security applications, the disclosed films may be used in a variety of security constructions including identification cards, driver's licenses, passports, access control passes, financial transaction cards (credit, debit, pre-pay, or other), brand protection or identification labels, and the like. The film may be laminated or otherwise adhered as interior or exterior layers to other layers or portions of the security construction. When the film is included as a patch, it may cover only a portion of the major surface of the card, page, or label. In some cases, it may be possible to use the film as the base substrate or the only element of the security construction. The film may be included as one of many features in the security construction such as holograms, printed images (intaglio, offset, barcode, etc.), retroreflective features, UV or IR activated images and the like. In some instances, the disclosed films may be layered in combination with these other security features.

The film may be used to provide a personalizable feature to the security construction, for example, a signature, an image, an individual coded number, etc. The personalizable feature may be in reference to the individual document holder or a specific product entity, such as in the case of a manufacturer tag, a lot verification tag, a tamper-proof coding, or the like. The personalizable feature can be made with a variety of scanning patterns including lines and dot patterns. Patterns can be the same or different among writable packets, depending on the film construction.

Consider, for example, the case of a first writable packet of microlayers that initially exhibits a perceptible color but then becomes clear upon treatment or patterning. One or more such color packets can be used. Consider the addition of a second multilayer optical film packet to form the film construction to be included in the security construction. Patterning or writing the first packet will create a design or image in the color of the second packet in a background representing the color characteristics of the two packets combined. When the spectral bands are sufficiently narrow, both the foreground (patterned area) and background can color shift with viewing angle. The variation of the perceived color with background, e.g. white or black backgrounds, to favor transmitted or reflected light viewing can be used as a security feature. For example, a page or leaf of the film in a document, such as a passport, can be flipped to view the film against different backgrounds or portions of the document.

The STOF films may provide both overt (e.g. clearly visible to an ordinary observer) and covert security features to the security construction. For example, a writable (color) reflective polarizer layer can provide a covert feature viewable with a polarizing analyzer, e.g. a feature that changes color or disappears depending on the polarization state of the analyzer. An infrared reflecting packet can be patterned to make an IR detectable, e.g. machine readable, personalized coding feature.

A particularly interesting STOF film construction for security applications is a very far red or near IR reflector, e.g., with a lower (left) reflection band edge between 650 and 800 nm (depending on film construction) as described in U.S. Pat. No. 6,045,894 (Jonza et al.), which can provide a clear-to-colored appearance as the observation angle changes from normal incidence to glancing incidence. Other interesting constructions, including optical polarizing films with designed color shifts, are described in U.S. Pat. No. 7,064,897 (Hebrink et al.). Using the patterning methods of the present application, films such as those described in the '894 Jonza reference and those described in the '897 Hebrink reference can be made that are writable, for example, with a laser. For example, personalized information can be written into such a film by the alteration of reflection packets in the visible, UV, or IR portion of the spectrum, where the altered portions (treated zones) of the film may have a lower reflectivity than untreated portions of the film, or vice versa.

Additional useful articles that can be made using the disclosed STOF films include a wide variety of identification documents (ID documents). The term "ID documents" is broadly defined and is intended to include, but not be limited to, passports, driver's licenses, national ID cards, social security cards, voter registration and/or identification cards, birth certificates, police ID cards, border crossing cards, security clearance badges, security cards, visas, immigration documentation and cards, gun permits, membership cards, phone cards, stored value cards, employee badges, debit cards, credit cards, and gift certificates and cards. ID documents are also sometimes referred to as "security documents". The articles of this disclosure may be the ID document or may be part of the ID document. Other useful articles that may be made using the disclosed patternable films include articles containing color images and items of value, such as, for example, currency, bank notes, checks, and stock certificates, where authenticity of the item is important to protect against counterfeiting or fraud, as well as articles that can be used to produce informative, decorative, or recognizable marks or indicia on product tags, product packaging, labels, charts, maps, and the like.

Still more useful articles that can utilize the disclosed STOF films include passports, ID badges, event passes, affinity cards, product identification formats and advertising promotions for verification and authenticity, brand enhancement images, identification presentation images in graphics applications such as emblems for police, fire, or other emergency vehicles; information presentation images in graphics applications such as kiosks, night signs, and automotive dashboard displays; and novelty enhancement through the use of composite images on products such as business cards, hang-tags, art, shoes, and bottled products.

Finally, it should be noted that many of the features described here for security applications are likewise useful for decorative applications. For example, a personalized logo can be thus embedded in a consumer article.

The teachings of this application can be used in combination with the teachings of any or all of the following commonly assigned applications, which are incorporated herein by reference: PCT Publication WO 2010/075357 (Merrill et al.), "Internally Patterned Multilayer Optical Films Using Spatially Selective Birefringence Reduction"; PCT Publication WO 2010/075340 (Merrill et al.), "Multilayer Optical Films Having Side-by-Side Mirror/Polarizer Zones"; PCT Publication WO 2010/075373 (Merrill et al.), "Multilayer Optical Films Suitable for Bi-Level Internal Patterning"; PCT Publication WO 2010/075363 (Merrill et al.), "Internally Patterned Multilayer Optical Films With Multiple Birefringent Layers"; and PCT Publication WO 2010/075383 (Merrill et al.), "Multilayer Optical Films Having Side-by-Side Polarizer/Polarizer Zones"; and the following applications filed on Jun. 30, 2010: U.S. Application Ser. No. 61/360,124, "Diffuse Reflective Optical Films With Spatially Selective Birefringence Reduction"; U.S. Application Ser. No. 61/360,127, "Retarder Film Combinations With Spatially Selective Birefringence Reduction"; U.S. Application Ser. No. 61/360,022, "Multi-Layer Articles Capable of Forming Color Images and Methods of Forming Color Images"; and U.S. Application Ser. No. 61/360,032, "Multi-Layer Articles Capable of Forming Color Images and Methods of Forming Color Images".

In many cases, a material layer or phase will exhibit birefringence as a result of the molecular makeup of the material. In some cases, however, a medium (sometimes referred to as an effective medium) may exhibit birefringence as a result of microscopic structures that have a dimension that is small compared to the wavelength of light but large compared to molecular distances. An elementary example of such a medium is a stack of ultrathin layers of different light-transmissive materials. See e.g. U.S. Pat. No. 6,590,707 (Weber). An effective medium of birefringent material may thus be or comprise a stack of ultrathin layers e.g. of alternating polymer materials, for example, where the optical thickness of each of the layers is less than ¼, and preferably less than ⅛, of a wave thick (e.g., less than 150, or 100, or 50 nm thick). Such media may in general be used in the disclosed embodiments.

EXAMPLES

Example 1

A spatially tailorable optical film that reflected red light, referred to here as Film 1, was formed by: co-extruding about 300 alternating layers of two polymeric materials, one of which contained an infra-red absorbing dye of suitable concentration; casting the extrudate into a quenched web; and stretching this cast web biaxially to form an optically reflecting multilayer optical film that was spatially tailorable.

More specifically with regard to Film 1, the two polymeric materials included a high refractive index material and a low refractive index material. The high index material was a copolymer of polyethylene naphthalate (PEN), and comprised 90 mol % naphthalene dicarboxylate and 10 mol % terephthalate as carboxylates as described in Example 1 of U.S. Pat. No. 6,352,761 (Hebrink et al.), this copolymer containing both PEN and polyethylene terephthalate (PET) sub-units, and referred to herein as 90/10 coPEN. The lower index material was another copolymer of PEN (i.e., another coPEN) as described in Example 10 of U.S. Pat. No. 6,352,761 (Hebrink et al.), this lower index material referred to herein as 55/45 HD coPEN. A masterbatch comprising one wt. % infra-red (IR) absorbing dye (obtained under the trade designation "EPOLITE 4121" from Epolin, Newark, N.J.), was formed by extrusion compounding the dye powder into the 55/45 HD coPEN polymer. The masterbatch was furthermore introduced into the 55/45 HD coPEN resin feed stream for the co-extrusion process in the weight proportion of 1:17 to the pure copolymer. A feedblock separated the low index 55/45 HD coPEN into about 150 layers, which were co-extruded in alternating fashion with about 150 layers of the high index 90/10 coPEN material. The weight proportion of the material in the low index layers to the material in the high index layers was about 9:10. The outer layers of the coextruded film were protective boundary layers (PBLs) comprising the high index 90/10 coPEN material. The 300 alternating high and low index layers formed the so-called optical packet in the finished Film 1. A final co-extruded pair of skin layers, comprising polyester material (obtained under the trade designation "Eastman Copolyester SA-115B" from Eastman Chemical Company, Kingsport, Tenn.), was co-extruded in a total weight proportion of about 1:4 to the optical packet. The extruded web was quenched and then furthermore heated above the glass transition temperature of the high index 90/10 coPEN material and stretched over rollers, in a length orienter, to a draw ratio of about 3.7, and then furthermore heated to about 130° C. and stretched transversely to a draw ratio of about 4, in a tenter. The film was furthermore heatset after stretching to about 215° C. The resulting Film 1 was about 35 micrometers thick with a reflection band spanning from about 580 nm to about 680 nm, i.e., reflecting red light. The transmission through a central portion of this reflection band was about 2%.

A lenticular film (obtained under the trade designation "Dura-GO" from Tekra Corporation, New Berlin, Wis.) characterized by a thickness of about 0.46 millimeters (0.018 inches) and a cylindrical feature spacing of about 3 lines per millimeter (75 lines per inch), was applied to the red-reflecting Film 1 using an optically clear adhesive (obtained under the trade designation "3M™ Optically Clear Adhesives", type 8141, from 3M Company, St. Paul, Minn.). The lenticular film was used as a mask to direct radiant energy to pattern the Film 1. The radiant energy was provided by a laser diode that emitted laser light at 808 nanometers. The beam emitted by the laser diode was scanned across the lenticular side of the optical construction in a scanning pattern perpendicular to the cylindrical features of the lenticular film. If the average power of the beam was set too low, or if the scan speed was set too high, no significant change in the reflection characteristics of Film 1 was observed, demonstrating a threshold condition for processing. Several combinations of beam power and scan speed were found to successfully process the Film 1, i.e., several combinations of these parameters produced a significant change in the reflection characteristics of the Film 1. In a first case, the average power of the beam was adjusted to about 831 milliwatts, and the scan speed was about 60 millimeters/sec. The scan pattern comprised uni-directional line scans with a line separation of about 30 micrometers, these line scans covering a 119 mm×119 mm processed region of the optical construction. In a second case, the average power of the beam was adjusted to about 362 milliwatts and the scan speed was about 15 millimeters/sec. The scan pattern in this second case was again a series of uni-directional line scans, but in this case a smaller processed region, about 25 mm×25 mm in size, was treated.

The processed optical construction was viewed under an optical microscope. Viewing from the lenticular side under transmission, unprocessed regions of the optical construction appeared approximately cyan in color, which is characteristic of a red reflector, while the two processed regions described above appeared more white in color. Viewing from the lenticular side of the optical construction under reflection, the unprocessed regions appeared red in color, while the two processed regions were dark in appearance. The dark appearance is consistent with a reduction or elimination of reflectivity of the Film 1 in the processed regions. Viewing from the Film 1 side of the optical construction under reflection, in the two processed regions, alternating red stripes and dark (non-reflecting or reduced reflectivity) stripes were observed, each of these groups of stripes having nominally the same spacing as the cylindrical features of the lenticular film. The dark stripes corresponded to focal areas under the cylindrical features of the lenticular film, and the red stripes corresponded to areas between these focal areas. The focusing properties of the lenticular film was thus observed to operate as a mask to divide each of the processed regions into first striped portions, whose reflectivity was about the same as the original reflectivity of the unprocessed Film 1, and second striped portions of substantially reduced reflectivity, the first and second striped portions being self-registered with respect to the light-focusing cylindrical features of the lenticular film.

The foregoing Example 1 could be repeated, except that the lenticular film could be removed from the optical construction after laser processing to isolate the patterned Film 1 from the lenticular film. A removeable adhesive between the Film 1 and the lenticular film could be used for this purpose. Alternatively, a structured surface mask such as the lenticular film could be temporarily held in place over a STOF film such as the Film 1 without adhesive, e.g. by a tensioning system with rollers, during laser processing, and then after laser processing the structured surface mask could be removed.

Example 2

Two STOF films, Film 2 and Film 3, were made as described below. Film 2 substantially reflected normally incident light at about 800 nanometers, and was used as a STOF mask for Film 3. Film 3 substantially reflected normally incident yellow and red light, in a reflection band from about 550 nm to 700 nm. Film 2 was formed by co-extruding substantially the same high index and low index materials described in Example 1, i.e., 90/10 coPEN and 55/45 HD coPEN. A masterbatch comprising one wt. % infra-red (IR) absorbing dye (obtained under the trade designation "Amaplast IR-1050" from ColorChem, Atlanta, Ga.) was formed by extrusion compounding the dye powder into the 55/45 HD coPEN polymer. The masterbatch was furthermore introduced into the 55/45 HD coPEN resin feed stream for the co-extrusion process in the weight proportion of 1:17 to the pure copolymer. A feedblock was used to separate the low index 55/45 HD coPEN into about 150 layers, which were co-extruded in alternating fashion with about 150 layers of the high index 90/10 coPEN material. The weight proportion of the material in the low index layers to the material in the high index layers was about 9:10. The outer layers of the coextruded film were protective boundary layers (PBLs) comprising the high index 90/10 coPEN material. The 300 alternating high and low index layers formed the so-called optical packet in the finished Film 2. A final co-extruded pair of skin layers, comprising polyester material (obtained under the trade designation "Eastman Copolyester SA-115B" from Eastman Chemical Company, Kingsport Tenn.), was co-extruded in a total weight proportion of about 1:4 to the optical packet. The extruded web was quenched and then furthermore heated above the glass transition temperature of the high index 90/10 coPEN material and stretched over rollers, in a length orienter, to a draw ratio of about 3.7, and then furthermore heated to about 130° C. and stretched transversely to a draw ratio of about 4, in a tenter. The film was furthermore heatset after stretching to about 215° C. The resulting Film 2 was about 45 micrometers thick with a reflection band spanning from about 750 nm to about 850 nm. The transmission through a central portion of this reflection band was about 2%.

Film 3 was formed by co-extruding the high index 90/10 coPEN material used in Films 1 and 2 and a different low index polymer material. The low index polymer of this Film 3 was a copolymer of polyethylene terephthalate (i.e., a coPET) with 5 mol % carboxylate sub-unit moiety substitution resulting from the use of sulfoisophthalic acid or its esters, and 27% diol sub-unit moiety substitution resulting from the use of neopentyl glycol, described as polyester K in U.S. Pat. App. Pub. No. US 2007/0298271 (Liu et al.). About 0.55 wt. % of infra-red (IR) absorbing dye (obtained under the trade designation "Epolite 4121" from Epolin, Newark, N.J.) was added to the high index 90/10 coPEN material, and this was co-extruded using a feedblock with the low index polymer into about 550 alternating material layers. The outer layers of the coextruded film were protective boundary layers (PBLs) comprising the high index 90/10 coPEN material. The 550 alternating high and low index layers formed the so-called optical packet in the finished Film 3. A final co-extruded pair of skin layers, comprising the 90/10 coPEN material without the absorbing dye, were also coextruded. The weight ratios of the feedstreams for the high index material in the skin layers, the high index material in the optical packet, and the low index material in the optical packet were about 6:11:16. The co-extruded layer stack was cast through a die, and formed into a cast web by electrostatically pinning and quenching onto a chill roll. The cast web was about 700 micrometers thick. The cast web was quenched and then further heated above the glass transition temperature of the high index 90/10 coPEN material and stretched over rollers, in a length orienter, to a draw ratio of about 3.7. Next, the film was heated to about 130° C. and stretched transversely to a draw ratio of about 3.5 in a tenter. The film was furthermore heatset after stretching to about 235° C. The resulting Film 3 was about 55 micrometers thick and had a reflection band spanning from about 750 nm to about 850 nm. The transmission through a central portion of the band was less than 1%. When viewed under conditions favoring transmitted light from a white background, the Film 3 exhibited a vibrant blue color. When viewed under conditions favoring reflected light, the Film 3 exhibited a vibrant gold color.

STOF Films 2 and 3 were then combined into a laminated construction that included the Film 2, the Film 3, and a diffuse white polycarbonate security film. The white polycarbonate film was about 150 micrometers thick, and was obtained under the trade designation "3M™ PC Security Films" from 3M Company, St. Paul, Minn. These three films were adhered in the laminate with intervening layers of optically clear adhesive (obtained under the trade designation "3M™ Optically Clear Adhesives", type 8141, from 3M Company, St. Paul, Minn.). When viewed under conditions favoring transmitted light from the white backing film, the laminate exhibited a substantially blue color. When viewed under conditions favoring reflected light, the laminate exhibited a substantially gold color.

The laminate was first treated using a first laser tuned to a wavelength of 1064 nm. The first laser was a pulsed laser, and was set to a 375 kHz pulse frequency, 12 nanosecond pulse duration, delivered power of 3 watts, and a beam width at the laminate of about 50 micrometers. A 2 mm×2 mm region of the laminate was scanned with this laser beam with a line separation of about 50 micrometers, and a variety of linear scan rates including 250, 300, 350, 400 and 450 mm/sec. Using the scan rate of 250 mm/sec., the reflectivity of Film 2 throughout the treated region was observed to decrease significantly. The treatment with the first laser thus patterned the STOF Film 2 so that its reflectivity at about 800 nm outside of the treated region was about the same as that of the untreated Film 2, and its reflectivity at about 800 nm inside the treated region was substantially reduced.

This patterned Film 2 was then used as a mask in the treatment of the STOF Film 3 in the laminate, using a second laser. The second laser was a diode laser tuned to 808 nm. The beam provided by the diode laser was continuous rather than pulsed, and it had a delivered power of about 3 watts and a beam width at the laminate of about 50 micrometers. The beam provided by this second laser was directed at the laminate and scanned over a second region that was wider than the first region treated by the first laser (at the 250 mm/sec. scan rate). The second region covered not only the first region of the laminate but also other regions of the laminate that were untreated by the first laser. The beam of the second laser was scanned over the second region at a linear rate of 64 mm/sec. with a line separation of 100 micrometers. After treating the laminate with the second laser in the second region, the reflective properties of Film 3 were seen to change in the area of overlap between the first and second regions. When viewed under conditions favoring transmitted light from the white backing film, the laminate exhibited a substantially white color in the area of overlap between the first and second treated regions, indicative of the white polycarbonate backing film, which was now visible through the mask portion (the first region) of Film 2 and through the treated portion of Film 3 (in the area of overlap between the first and second treated regions). In other regions of the laminate, such as the portion of the second treated region that did not overlap with the first treated region, the laminate maintained its initial colored appearance, resulting from the unchanged reflective characteristics of Film 3. Thus, in these other regions, the laminate exhibited a substantially blue color when viewed under conditions favoring transmitted light from the white backing film, and the laminate exhibited a substantially gold color when viewed under conditions favoring reflected light. The treatment of the laminate with the second laser thus accomplished the patterning of the STOF Film 3 using as a mask a STOF film (Film 2) that had been first spatially patterned by the first laser.

The foregoing Example 2 could be repeated, except that the patterned Film 2 could be removed from the laminate construction to isolate the patterned Film 3 from the mask provided by patterned Film 2. A removable adhesive between the mask and the rest of the laminate could be used for this purpose. Alternatively, a STOF mask such as the patterned Film 2 could be temporarily held in place over a second STOF film such as Film 3 without adhesive, e.g. by a tensioning system with rollers, during processing with the second laser, and then after such processing the STOF mask could be removed.

Unless otherwise indicated, all numbers expressing quantities, measurement of properties, and so forth used in the specification and claims are to be understood as being modified by the term "about". Accordingly, unless indicated to the contrary, the numerical parameters set forth in the specification and claims are approximations that can vary depending on the desired properties sought to be obtained by those skilled in the art utilizing the teachings of the present application. Not as an attempt to limit the application of the doctrine of equivalents to the scope of the claims, each numerical parameter should at least be construed in light of the number of reported significant digits and by applying ordinary rounding techniques. Notwithstanding that the numerical ranges and parameters setting forth the broad scope of the invention are approximations, to the extent any numerical values are set forth in specific examples described herein, they are reported as precisely as reasonably possible. Any numerical value, however, may well contain errors associated with testing or measurement limitations.

Various modifications and alterations of this invention will be apparent to those skilled in the art without departing from the spirit and scope of this invention, and it should be understood that this invention is not limited to the illustrative embodiments set forth herein. For example, the reader should assume that features of one disclosed embodiment can also be applied to all other disclosed embodiments unless otherwise indicated. It should also be understood that all U.S. patents, patent application publications, and other patent and non-patent documents referred to herein are incorporated by reference, to the extent they do not contradict the foregoing disclosure.

The invention claimed is:

1. A composite article comprising:
    a film mask including a first group of layers arranged to extend continuously from a first zone to a second zone and selectively reflect light by constructive or destructive interference to provide a first reflective characteristic in the first zone and a second reflective characteristic in the second zone, the film mask having a first absorbing characteristic suitable to, upon exposure to a first radiant beam, absorptively heat a portion of the film mask by an amount of sufficient to change the first reflective characteristic to the second reflective characteristic, wherein the change from the first reflective characteristic to the second reflective characteristic is substantially attributable to a change in birefringence of at least some of the first group of layers of the film mask; and a patternable film beneath the film mask and connected to the film mask in a layered arrangement, the patternable film having a first detectable characteristic at a selected portion that changes to a different second detectable characteristic upon exposure to a second radiant beam through the film mask, wherein the film mask is capable of patterning the second radiant beam therethrough to change the first detectable characteristic to the second detectable characteristic at the selected portion of the patternable film.

2. The composite article of claim 1, wherein the patternable film comprises a material that is excited at the second radiant beam.

3. The composite article of claim 2, wherein the material of the patternable film comprises a fluorescent dye that emits at visible wavelengths upon exposing to the second radiant beam.

4. The composite article of claim 1, wherein the first reflective characteristic reflects the second radiant beam more than the second reflective characteristic.

5. The composite article of claim 1, wherein the selected portion of the patternable film corresponds to the second zone of the film mask.

6. The composite article of claim 1, wherein the first reflective characteristic reflects the second radiant beam less than the second reflective characteristic.

7. The composite article of claim 1, wherein the selected portion of the patternable film corresponds to portions of the film mask other than the second zone.

8. The composite article of claim 1, wherein the first and second radiant beams comprise different first and second optical wavelengths, respectively.

9. The composite article of claim 8, wherein the first optical wavelength is an infrared optical wavelength, and the second optical wavelength is less than 700 nm.

10. The composite article of claim 1, wherein the first or second reflective characteristic has a reflectivity for the second radiant beam of at least 90%.

11. The composite article of claim 1, wherein the article is a security construction including an identification card, a passport, or a driver's license.

12. The composite article of claim 1, wherein the article is a security document, and the film mask comprises a personalizable feature in reference to a document holder.

13. The composite article of claim 1, wherein the film mask and the patternable film are layered to provide combined security features.

14. A method of making a composite article, comprising:
providing a first film having a first reflective characteristic, the first film also having a first absorption characteristic suitable to, upon exposure to a first radiant beam, absorptively heat a portion of the first film by an amount sufficient to change the first reflective characteristic to a second reflective characteristic by a change in birefringence, and the first film comprising a first group of layers arranged to selectively reflect light by constructive or destructive interference to provide the first reflective characteristic, wherein the change from the first reflective characteristic to the second reflective characteristic is substantially attributable to a change in birefringence of at least some of the first group of layers of the first film;

providing a patternable film having a first detectable characteristic that changes to a different second detectable characteristic upon exposure to a second radiant beam, wherein the patternable film comprises a material that is excited at the second radiant beam;

directing the first radiant beam preferentially at a second zone rather than a first zone of the first film to change the first reflective characteristic to the second reflective characteristic in the second zone by a change in birefringence so as to convert the first film to a film mask; and arranging the film mask and the patternable film in a layered structure, using the film mask to pattern the second radiant beam, and directing the patterned second radiant beam at the patternable film to change the first detectable characteristic to the second detectable characteristic at a selected portion of the patternable film.

15. The method of claim 14, wherein directing the first radiant beam preferentially at the second zone of the first film comprises scanning the first radiant beam over portions of the first film that define the second zone.

16. The method of claim 14, wherein the selected portion of the patternable film corresponds to the first or second zone of the first film.

17. The method of claim 14, wherein the first and second radiant beams comprise different first and second optical wavelengths, respectively.

18. The method of claim 17, wherein the first optical wavelength is an infrared optical wavelength, and the second optical wavelength is less than 700 nm.

19. The method of claim 14, wherein the material of the patternable film comprises a fluorescent dye that emits at visible wavelengths upon exposing to the second radiant beam, and directing the patterned second radiant beam at the patternable film forms a pattern of visible fluorescent light.

* * * * *